(12) United States Patent
Miyazaki et al.

(10) Patent No.: US 10,734,911 B2
(45) Date of Patent: Aug. 4, 2020

(54) POWER MODULE INCLUDING MULTIPLE SIGNAL WIRING PATTERNS DISPOSED ON AN INSULATING SUBSTRATE

(71) Applicant: ROHM CO., LTD., Kyoto-shi, Kyoto (JP)

(72) Inventors: Tatsuya Miyazaki, Kyoto (JP); Hirotaka Otake, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/591,183

(22) Filed: Oct. 2, 2019

(65) Prior Publication Data

US 2020/0035656 A1    Jan. 30, 2020

Related U.S. Application Data

(63) Continuation of application No. PCT/JP2018/014126, filed on Apr. 2, 2018.

(30) Foreign Application Priority Data

Apr. 5, 2017   (JP) .................................. 2017-075315

(51) Int. Cl.
*H02M 7/00*     (2006.01)
*H01L 23/00*    (2006.01)
(Continued)

(52) U.S. Cl.
CPC ............ *H02M 7/003* (2013.01); *H01L 24/40* (2013.01); *H01L 24/41* (2013.01); *H01L 24/48* (2013.01);
(Continued)

(58) Field of Classification Search
CPC ...... H02M 7/003; H02M 7/5387; H02M 7/48; H02M 1/08; H01L 24/49; H01L 24/48;
(Continued)

(56) References Cited

U.S. PATENT DOCUMENTS 8,049,479 B2 * 11/2011 Shiraishi ................. H01L 24/49
                                                    323/282
9,018,985 B2 *  4/2015 Sawada .................... H02M 1/08
                                                    327/109
(Continued)

FOREIGN PATENT DOCUMENTS

JP    H05-226994    9/1993
JP    2012-239061   12/2012
(Continued)

OTHER PUBLICATIONS

International Search Report and Written Opinion of PCT/JP2018/014126, dated May 29, 2018, 8 pages including English translation of International Search Report.

*Primary Examiner* — Yusef A Ahmed
*Assistant Examiner* — Shahzeb K Ahmad
(74) *Attorney, Agent, or Firm* — Hamre, Schumann, Mueller & Larson, P.C.

(57) ABSTRACT

Power module includes: first transistors Q1, Q4 forming at least one half bridge, and disposed at upper and lower arms thereof; second transistors QM1, QM4 of which drains are respectively connected to gates G1 and G4 sides of the first transistors, and sources are respectively connected to the sources S1, S4 sides thereof; source signal wiring patterns SSP1, SSP4 respectively connected to the sources S1, S4 of the first transistors; first connected conductors MSW1, MSW4 for respectively connecting between the source signal wiring patterns and the sources of the second transistors; second gate signal wiring patterns MGP1, MGP4 respectively connected to gates MG1, MG4 of the second transistors; and second connected conductors MGW1, MGW4 for respectively connecting between the gate signal wiring patterns and the gates of the second transistors. Lengths of the first connection conductors are respectively equal to or shorter than lengths of the second connection conductors.

11 Claims, 35 Drawing Sheets

(51) Int. Cl.
*H02M 1/08* (2006.01)
*H02M 7/5387* (2007.01)
*H02P 27/06* (2006.01)

(52) U.S. Cl.
CPC ............. *H01L 24/49* (2013.01); *H02M 1/08* (2013.01); *H02M 7/5387* (2013.01); *H01L 2224/40225* (2013.01); *H01L 2224/4103* (2013.01); *H01L 2224/41174* (2013.01); *H01L 2224/48225* (2013.01); *H01L 2224/4903* (2013.01); *H01L 2924/1033* (2013.01); *H01L 2924/10253* (2013.01); *H01L 2924/10272* (2013.01); *H01L 2924/13055* (2013.01); *H01L 2924/13091* (2013.01); *H02P 27/06* (2013.01)

(58) Field of Classification Search
CPC .................. H01L 24/41; H01L 24/40; H01L 2924/13091; H01L 2924/13055; H01L 2924/1033; H01L 2924/10272; H01L 2924/10253; H01L 2224/4903; H01L 2224/48225; H01L 2224/41174; H01L 2224/4103; H01L 2224/40225; H01L 2224/49113; H01L 2224/48227; H01L 2224/0603; H01L 25/18; H01L 25/07; H01L 23/48
See application file for complete search history.

(56) References Cited

U.S. PATENT DOCUMENTS

| | | | | |
|---|---|---|---|---|
| 2004/0145407 | A1* | 7/2004 | Shirasawa | H03K 17/162 327/434 |
| 2007/0221972 | A1 | 9/2007 | Bhalla et al. | |
| 2009/0079491 | A1* | 3/2009 | Kawamura | H03K 17/302 327/434 |
| 2012/0229200 | A1* | 9/2012 | Takao | H02M 7/538 327/543 |
| 2014/0091324 | A1 | 4/2014 | Zushi et al. | |
| 2014/0159054 | A1* | 6/2014 | Otake | H01L 23/13 257/77 |
| 2016/0308523 | A1 | 10/2016 | Otake et al. | |

FOREIGN PATENT DOCUMENTS

| | | | |
|---|---|---|---|
| JP | 2015-126342 | 7/2015 | |
| JP | 2016-174033 | 9/2016 | |
| WO | 2012/018073 | 2/2012 | |
| WO | WO-2015099030 A1 * | 7/2015 | ........... H01L 23/495 |

* cited by examiner

FIG. 27A
FIG. 27B
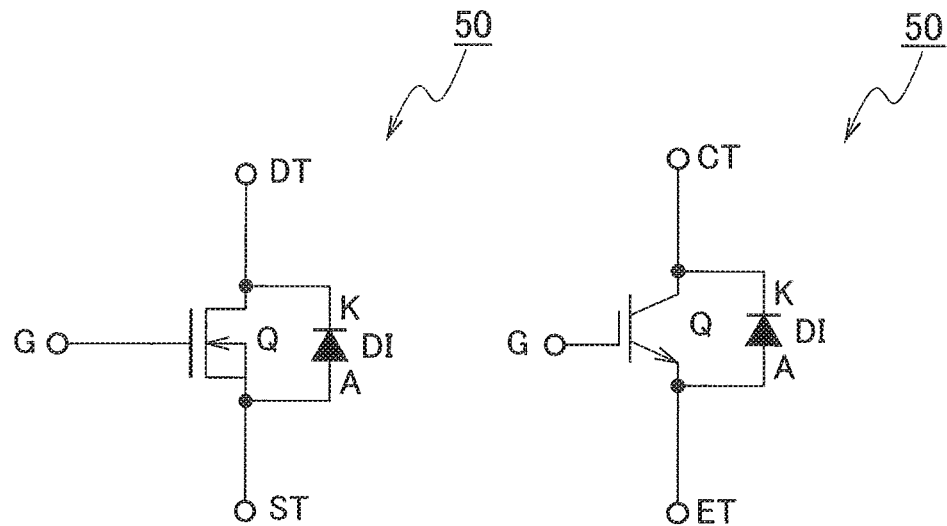
FIG. 28
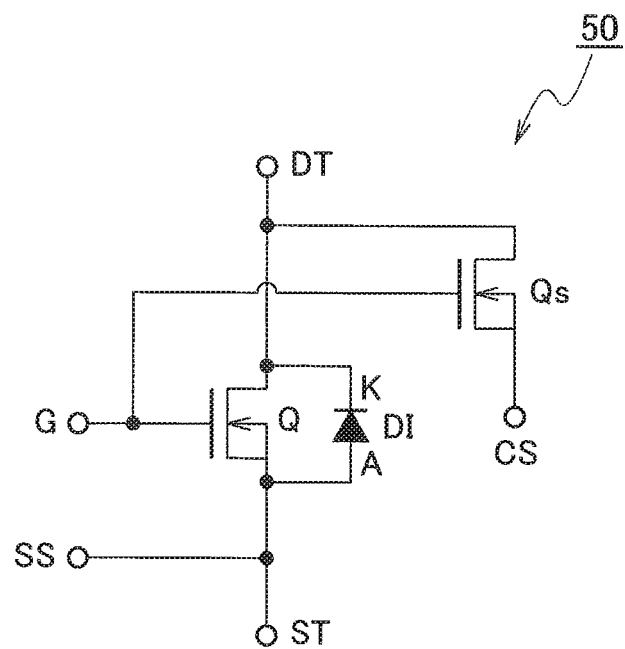

POWER MODULE INCLUDING MULTIPLE SIGNAL WIRING PATTERNS DISPOSED ON AN INSULATING SUBSTRATE

CROSS REFERENCE TO RELATED APPLICATIONS

This is a continuation application (CA) of PCT Application No. PCT/JP2018/14126, filed on Apr. 2, 2018, which claims priority to Japan Patent Application No. P2017-075315 filed on Apr. 5, 2017 and is based upon and claims the benefit of priority from prior Japanese Patent Application No. P2017-075315 filed on Apr. 5, 2017 and PCT Application No. PCT/JP2018/14126, filed on Apr. 2, 2018, the entire contents of each of which are incorporated herein by reference.

FIELD

The embodiments described herein relate a power module.

BACKGROUND

Many research institutions have been currently conducting research to develop Silicon Carbide (SiC) devices. Advantages of SiC power devices over Si power devices include low on resistance, high switching speed, high temperature operation, etc.

Circuits including bridge circuits have been widely used for switching power supplies and motor driving inverters. In bridge circuits composed of transistors, there is a phenomenon where when a transistor of a one-sided arm is turned ON at high speed, a voltage between gate and source is also changed caused by in the voltage change between the drain and the source of a transistor of the other-sided arm, and thereby causing a malfunction (erroneous turning-on). A short-circuit current due to the erroneous turning-on not only can break the transistors, but also can increase in power loss and cause a noise. In particular, in Metal-Oxide Semiconductor Field Effect Transistors (SiC MOSFETs), since a ratio between a parasitic capacitance Cgs between gate and source and a parasitic capacitance Cgd between gate and drain is small, and the voltage between gate and source is largely changed, and an on-resistance is low, the short-circuit current due to the erroneous turning-on is also increased, and breaking easily occurs.

As a means for suppressing the erroneous turning-on, the inventors have proposed a method of reducing an inductance of a short circuit path between gate and source at the time of transistor-off, by disposing an active mirror clamp circuit between the gate and the source of the SiC MOSFET.

There has also been a method of forming an active mirror clamp region in an inside of a chip.

SUMMARY

However even if a new short circuit path is formed between the gate and the source of the SiC MOSFET by means of the active mirror clamp circuit, since a suppression effect of change of the voltage between gate and source is weaker if the parasitic inductance due to a wiring pattern, a wire, or the like of the path is large, a design including a pattern layout is required in order to actually obtain a desired effect. Moreover, since the SiC MOSFET has a relatively high channel resistance, and the on-resistance is high even if a low breakdown voltage MOSFET for the active mirror clamp circuits is built in a chip, it is not suitable as a short circuit path.

In view of the above-mentioned problems, the embodiments provide a power module having a high effect of suppressing malfunctions and capable of realizing high speed switching.

According to one aspect of the embodiments, there is provided a power module comprising: first transistors disposed on an insulating substrate, the first transistors forming at least one set of a half bridge having upper and lower arms, the first transistors respectively disposed at the upper and lower arms; second transistors disposed on the insulating substrate, the second transistors of which drains are respectively connected to gates sides of the first transistors and sources are respectively connected to sources sides of the first transistors; first source signal wiring patterns disposed on the insulating substrate, the first source signal wiring patterns respectively connected to the sources of the first transistors; first connected conductors for respectively connecting between the first source signal wiring patterns and the sources of the second transistors; second gate signal wiring patterns disposed on the insulating substrate, the second gate signal wiring patterns respectively connected to gates of the second transistors; and second connected conductor for respectively connecting between the second gate signal wiring patterns and the gates of the second transistors, wherein lengths of the first connected conductors are respectively equal to or less than lengths of the second connected conductors.

According to another aspect of the embodiments, there is provided a power module comprising: a first wiring pattern, a second wiring pattern, a third wiring pattern, and a fourth wiring pattern disposed on an insulating substrate; a first transistor disposed on the first wiring pattern and configured to execute a switching operation; a second transistor disposed on the third wiring pattern; a first connected conductor for connecting between a first electrode of the first transistor and the second wiring pattern; a second connected conductor for connecting between a first electrode of the second transistor and the second wiring pattern; a third connection conductor for connecting between a second electrode of the second transistor and the fourth wiring pattern; and a fourth connection conductor for connecting between a second electrode of the first transistor and the third wiring pattern, wherein a length of the second connected conductor is equal to or less than a length of the third connected conductor.

According to still another aspect of the embodiments, there is provided a power module comprising: a main substrate; a first electrode pattern disposed on the main substrate, the first electrode pattern connected to a positive-side power terminal; a second electrode pattern disposed on the main substrate, the second electrode pattern connected to a negative-side power terminal; a first transistor of which a drain is disposed on the first electrode pattern; a first gate signal wiring pattern connected to a gate of the first transistor; a second transistor of which a drain is disposed on the first gate signal wiring pattern; a first source signal wiring pattern connected to a source of the first transistor; a first connected conductor for connecting between the first source signal wiring pattern and the source of the second transistor; a second gate signal wiring pattern connected to a gate of the second transistor; and a second connected conductor for connecting between the second gate signal wiring pattern and a gate of the second transistor, wherein a length of the first connected conductor is equal to or less than a length of the second connected conductor.

A conductor for connecting each element always has a parasitic resistance and a parasitic inductance, when containing the active mirror clamp circuit in the power module. However, according to the embodiments, by adopting a layout configuration for preferentially reducing a parasitic component of a portion which extremely affects on malfunctions of the transistor, there can be provided the power module having a high effect of suppressing the malfunctions and capable of high speed switching.

BRIEF DESCRIPTION OF DRAWINGS

FIG. 27A is a schematic circuit representative diagram of an SiC MOSFET of a 1-in-1 module, which is the power module according to the embodiments.

FIG. 27B is a schematic circuit representative diagram of an IGBT of a 1-in-1 module, which is the power module according to the embodiments.

FIG. 28 is a detail circuit representative diagram of the SiC MOSFET of the 1-in-1 module, which is the power module according to the embodiments.

DESCRIPTION OF EMBODIMENTS

Figure 1A:
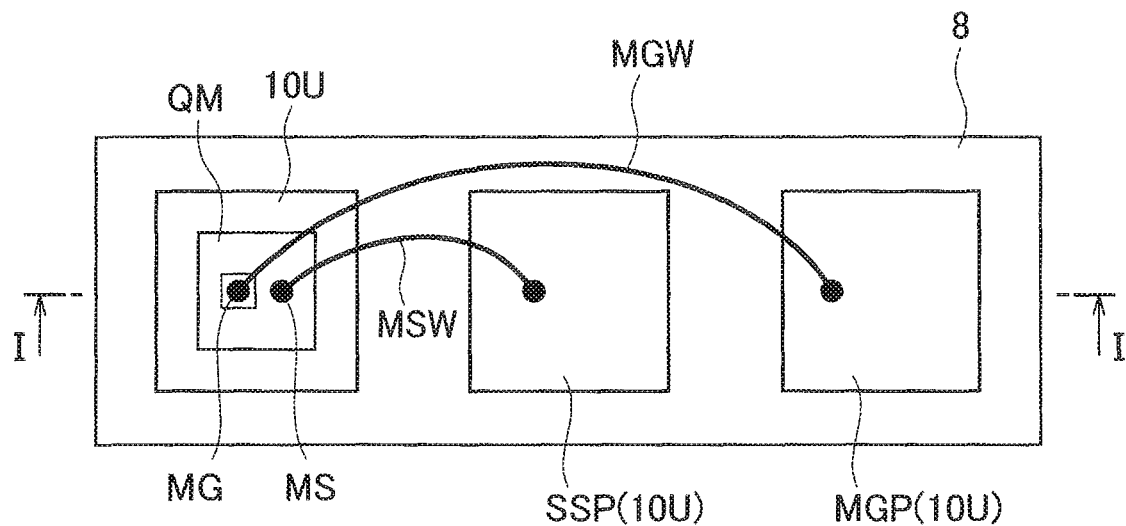
FIG. 1A is a schematic planar pattern configuration diagram showing a fundamental structure of a power module according to a first embodiment.

Next, the embodiments will be described with reference to drawings. In the description of the following drawings, the identical or similar reference numeral is attached to the identical or similar part. However, it should be noted that the drawings are schematic and therefore the relation between thickness and the plane size and the ratio of the thickness differs from an actual thing. Therefore, detailed thickness and size should be determined in consideration of the following explanation. Of course, the part from which the relation and ratio of a mutual size differ also in mutually drawings is included.

Moreover, the embodiments shown hereinafter exemplify the apparatus and method for materializing the technical idea; and the embodiments do not specify the material, shape, structure, placement, etc. of each component part as the following. The embodiments may be changed without departing from the spirit or scope of claims.

[First Embodiment]
(Fundamental Structure)

Figure 1B:
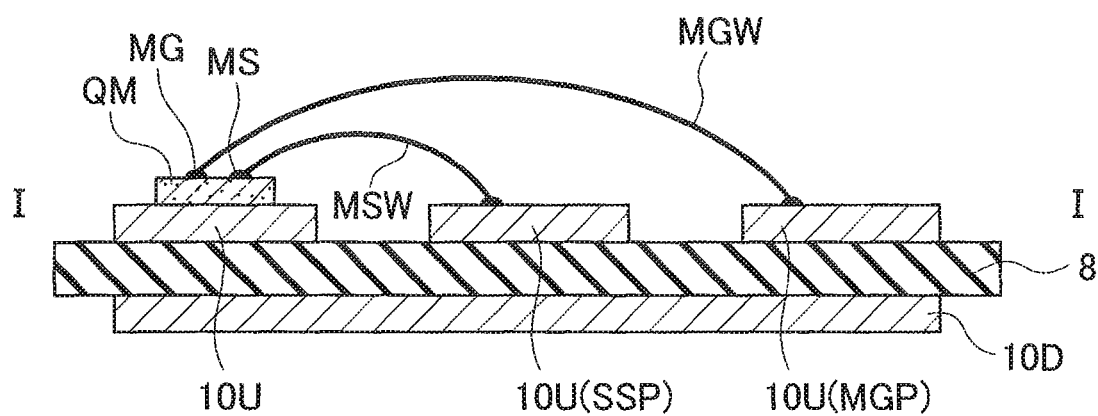
FIG. 1B is a schematic cross-sectional structure diagram taken in the line I-I of FIG. 1A.

FIG. 1A shows a schematic planar pattern configuration of a fundamental structure of a power module according to the first embodiment, and FIG. 1B shows a schematic cross-sectional structure taken in the line I-I of FIG. 1A. The fundamental structure of the power module according to the first embodiment can be applied to a 1-in-1 module, for example.

As shown in FIGS. 1A and 1B, the power module of the fundamental structure according to the first embodiment includes: a ceramic substrate 8; electrode patterns 10U, SSP (10U), MGP (10U) disposed on the ceramic substrate 8; an active mirror clamp transistor QM disposed on the electrode pattern 10U and configured to short-circuit between a gate and a source of a target power transistor (not illustrated); and an electrode pattern 10D disposed on a back side surface of the ceramic substrate 8.

As shown in FIGS. 1A and 1B, the power module according to the first embodiment includes: an active mirror clamp transistor QM of which a drain is connected to a gate side of a target power transistor (not illustrated) and a source is connected to a source side thereof; a source signal wiring pattern SSP connected to the source of the target power transistor (not illustrated); a connected conductor MSW for connecting between the source signal wiring pattern SSP and a mirror clamp source MS of the active mirror clamp transistor QM; a gate signal wiring pattern MGP connected to a mirror clamp gate MG of the active mirror clamp transistor QM; and a connected conductor MGW for connecting between a gate signal wiring pattern MGP and the mirror clamp gate MG of the active mirror clamp transistor QM. In this context, a length of the connected conductor MSW is equal to or less than a length of the connected conductor MGW. In this context, the connected conductor MSW and the connected conductor MGW may respectively be wires.

The disposition of the embodiments takes the parasitic inductance of the signal wiring of the active mirror clamp transistor QM into consideration.

In the power module according to the first embodiment, in order to suppress the malfunction at the time of switching of the target power transistor, the active mirror clamp transistor QM is built in the power module, and the active mirror clamp transistor QM is disposed to form the signal pattern so that the length of the source wiring bonding material of the active mirror clamp transistor QM is equal to or less than the length of the gate wiring bonding material. An intention and an effect of this configuration will be inclusively explained in the below-mentioned power module 2 according to the first embodiment.

Figure 2A:
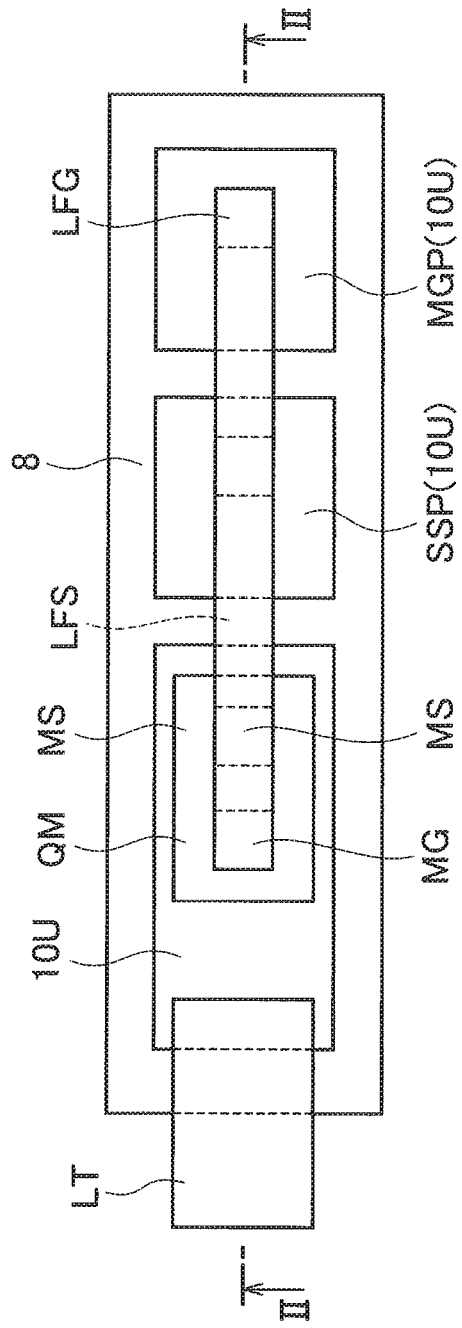
FIG. 2A is a schematic planar pattern configuration diagram showing a fundamental structure of a power module according to a modified example of the first embodiment.
Figure 2B:
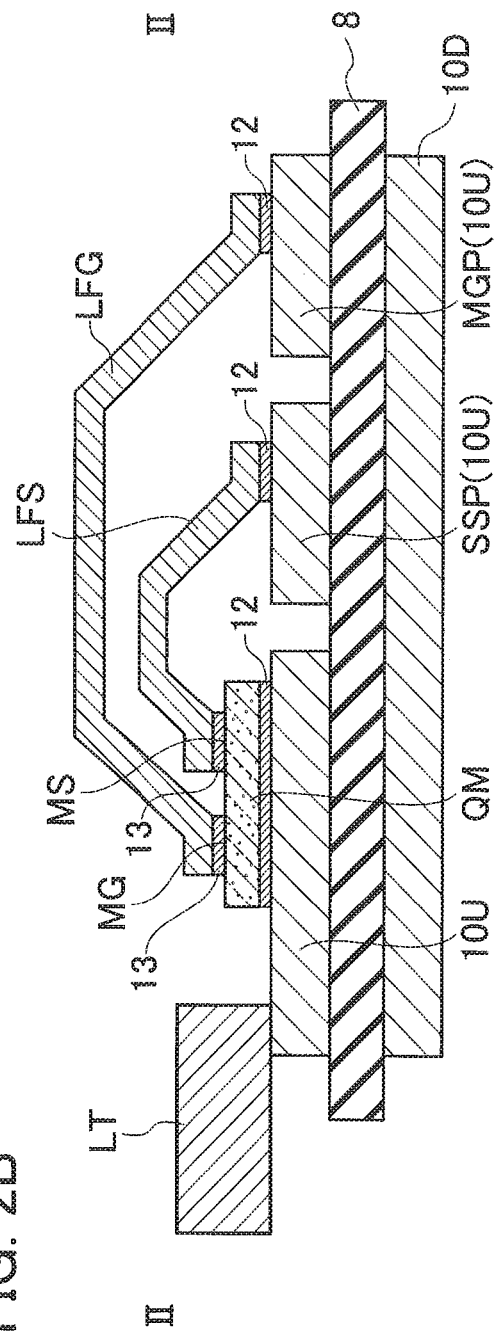
FIG. 2B is a schematic cross-sectional structure diagram taken in the line II-II of FIG. 2A.

Moreover, FIG. 2A shows a schematic planar pattern configuration of a fundamental structure of a power module according to a modified example of the first embodiment, and FIG. 2B shows a schematic cross-sectional structure taken in the line II-II of FIG. 2A. The fundamental structure of the power module according to the modified example of the first embodiment can also be applied to a 1-in-1 module, for example.

As shown in FIGS. 2A and 2B, the fundamental structure of the power module according to the modified example of the first embodiment includes: a ceramic substrate 8; electrode patterns 10U, SSP (10U), MGP (10U) disposed on the ceramic substrate 8; an active mirror clamp transistor QM disposed on the electrode pattern 10U and configured to short-circuit between a gate and a source of a target power transistor (not illustrated); and an electrode pattern 10D disposed on a back side surface of the ceramic substrate 8.

As shown in FIGS. 2A and 2B, the power module according to the modified example of the first embodiment includes: an active mirror clamp transistor QM of which a drain is connected to a gate side of a target power transistor (not illustrated) and a source is connected to a source side thereof; a source signal wiring pattern SSP connected to the source of the target power transistor (not illustrated); a leadframe LFS for connecting between the source signal wiring pattern SSP and a mirror clamp source MS of the active mirror clamp transistor QM; a gate signal wiring pattern MGP connected to a mirror clamp gate MG of the active mirror clamp transistor QM; and a leadframe LFG for connecting between a gate signal wiring pattern MGP and the mirror clamp gate MG of the active mirror clamp transistor QM. In this context, a length of the leadframe LFS is equal to or less than a length of leadframe LFG.

The leadframes LFS, LFG are respectively connected to the mirror clamp source MS and the mirror clamp gate MG of the active mirror clamp transistor QM through a soldering layer 13, and are respectively connected to the source signal wiring pattern SSP and the gate signal wiring pattern MGP through a soldering layer 12. Moreover, a drain of the active mirror clamp transistor QM is also connected to the electrode pattern 10U through the soldering layer 12.

In addition, although the example in which the leadframe LFG is disposed so as to overlap the leadframe LFS is shown in FIG. 2, not only such a configuration, both may be disposed on the same plane, for example. Moreover, a lead terminal LT connected to a drain of the active mirror clamp transistor QM is connected to the electrode pattern 10U. In the case of the configuration of the 1-in-1 module, the lead terminal LT connected to the drain of the active mirror clamp transistor QM is connected to a gate of the target power transistor (not illustrated).

In the power module according to the modified example of the first embodiment, in order to suppress the malfunction at the time of switching of the target power transistor, the active mirror clamp transistor QM is built in the power module, and the active mirror clamp transistor QM is disposed to form the signal pattern so that the length of the leadframe LFS of the active mirror clamp transistor QM is equal to or less than the length of the leadframe LFG.

In the power modules according to the first embodiment and the modified example thereof, the active mirror clamp transistor QM is built in the power module and is disposed in the appropriate position, and thereby the gate inductance of the power transistor can be reduced and the malfunction can be suppressed without increasing the power module size and without increasing the inductance of the power circuit. In this context, the inductance of the power circuit and the gate inductance of the power transistor will be mentioned below with reference to FIGS. 20A and 20B.

(2-in-1 Configuration)

Figure 3A:
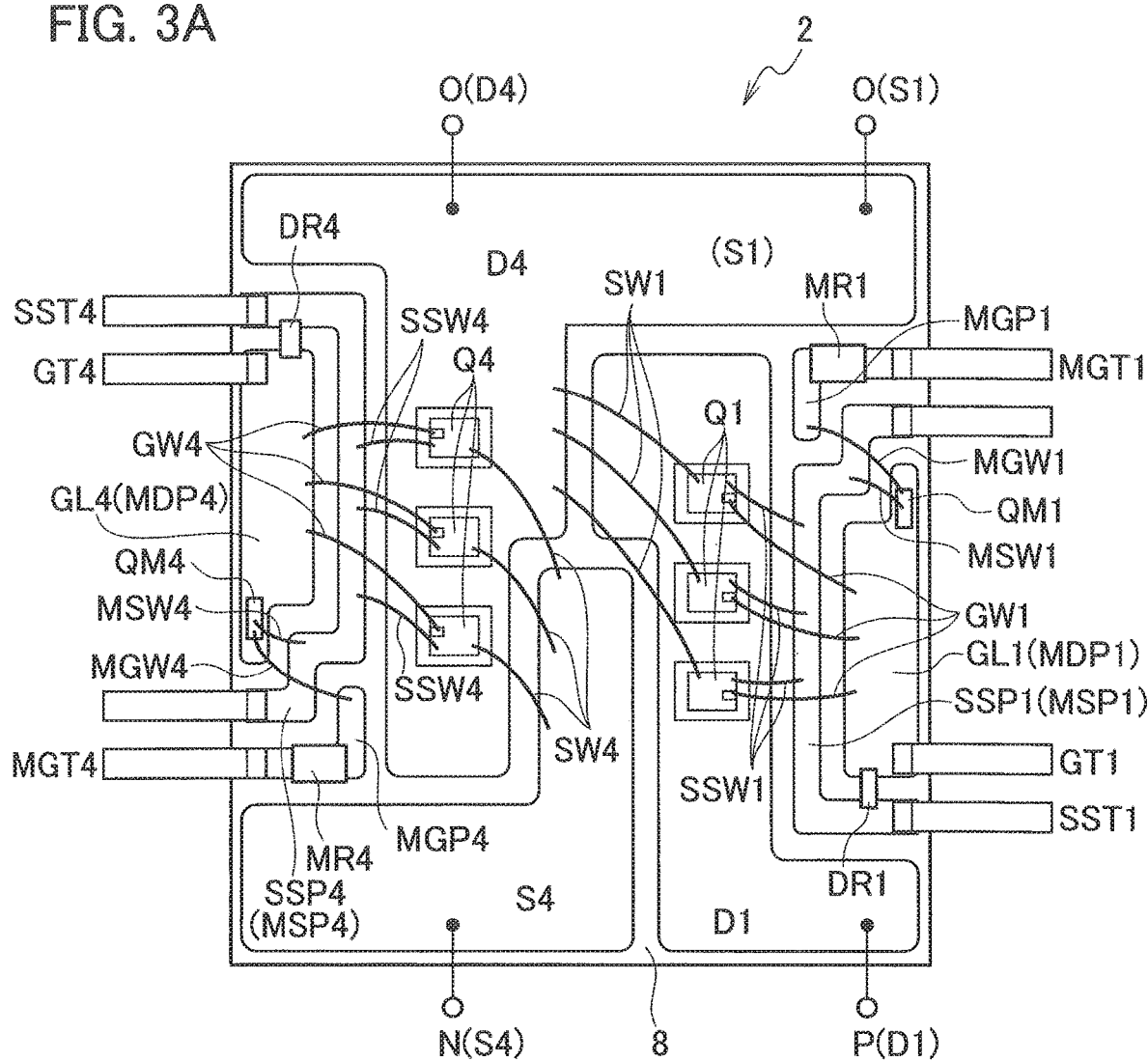
FIG. 3A is a schematic planar pattern configuration diagram showing the power module according to the first embodiment.
Figure 3B:
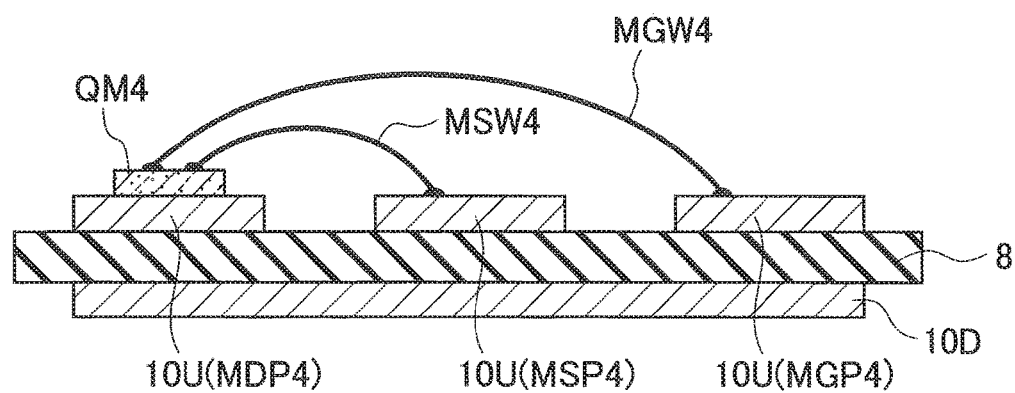
FIG. 3B is a schematic cross-sectional structure diagram showing a portion near an active mirror clamp transistor QM4, in the power module corresponding to FIG. 3A.
Figure 4:
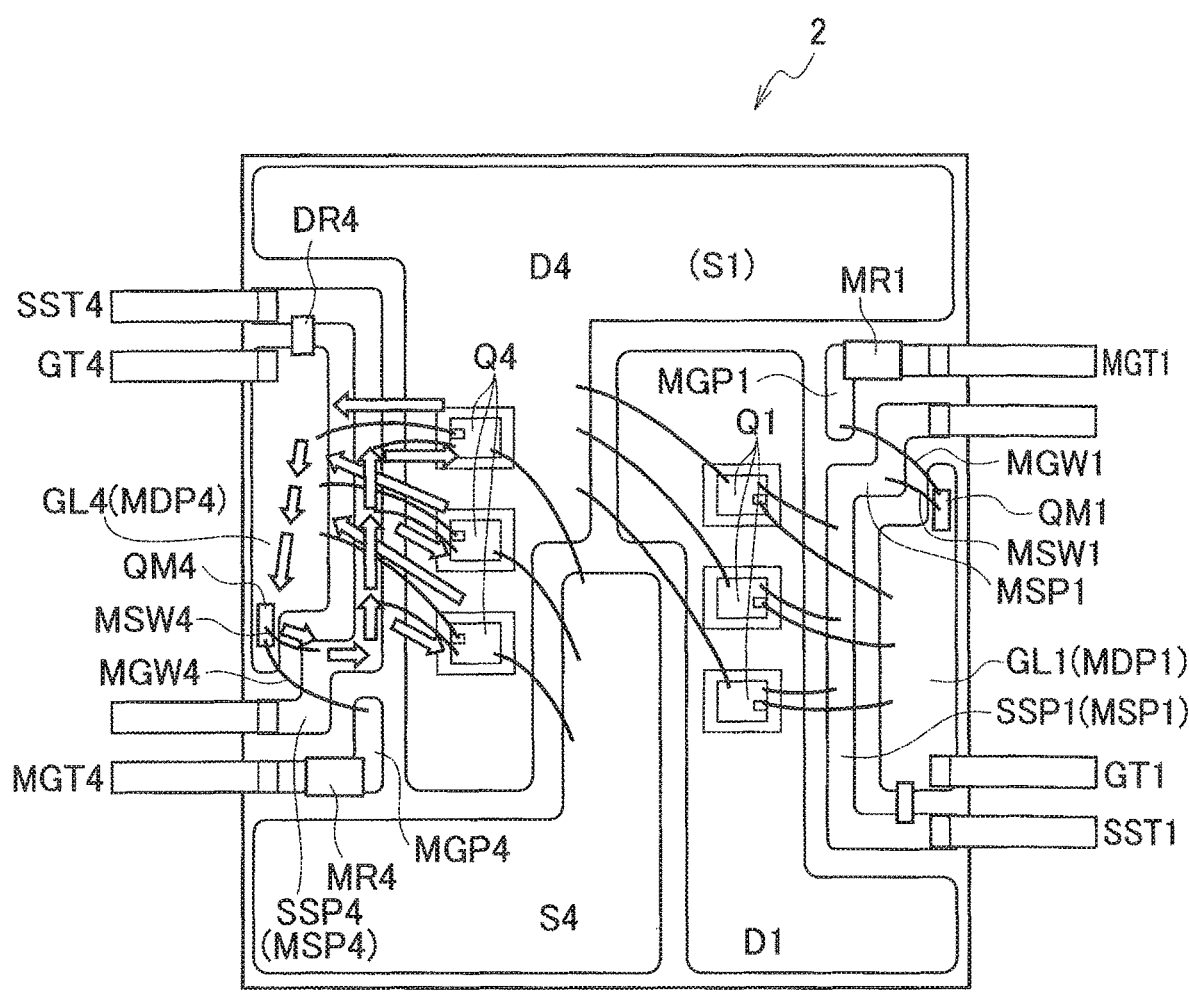
FIG. 4 is an operation explanatory diagram of the power module according to the first embodiment.
Figure 5:
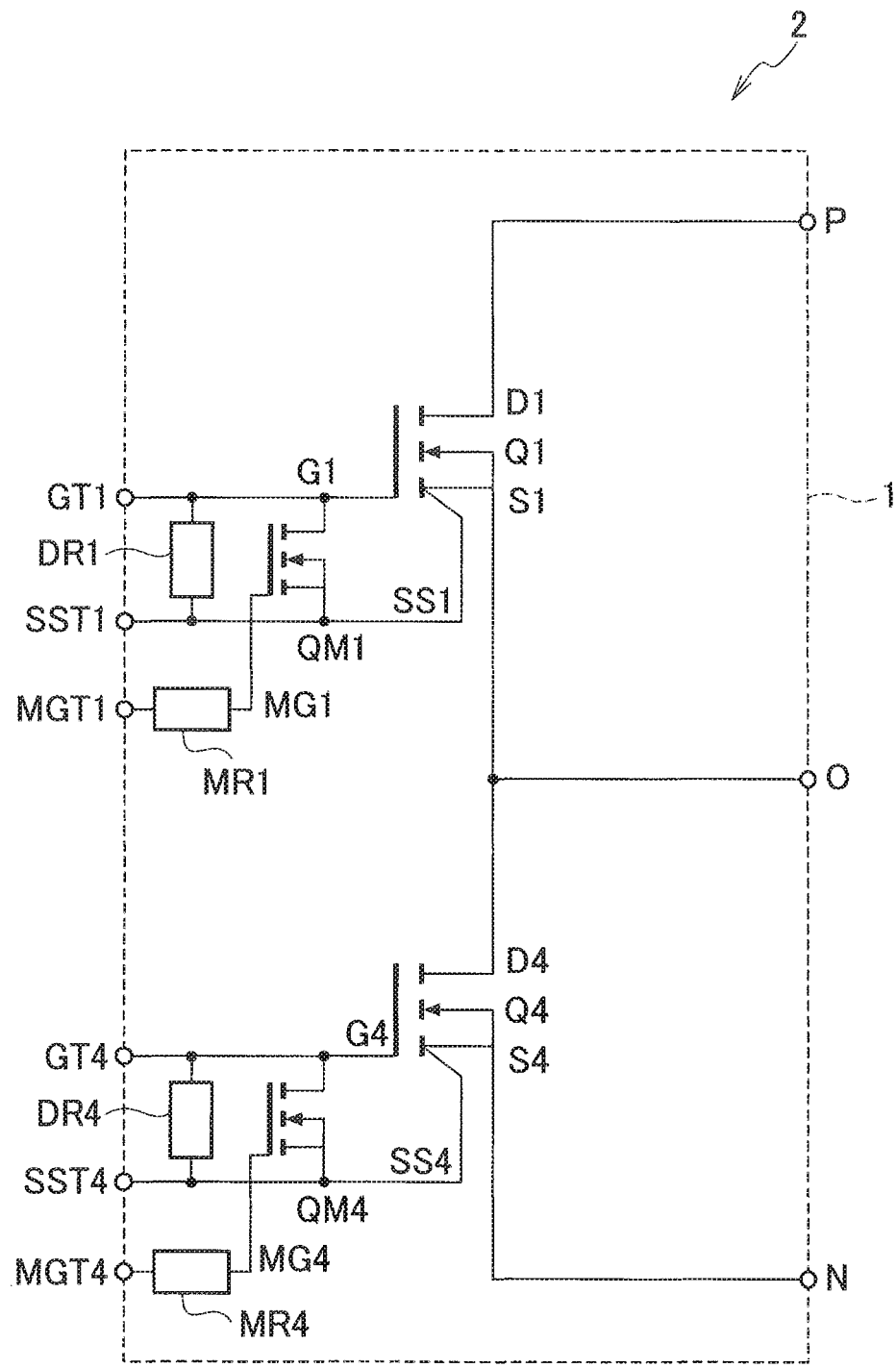
FIG. 5 is a circuit configuration diagram of the power module according to the first embodiment.

FIG. 3A shows a schematic planar pattern configuration of a power module according to the first embodiment, and FIG. 3B shows a schematic cross-sectional structure of a portion near an active mirror clamp transistor QM4, in the power module corresponding to FIG. 3A. FIG. 4 shows an operation explanatory diagram of the power module according to the first embodiment, and FIG. 5 shows a circuit configuration of the power module according to the first embodiment. In this context, the circuit configuration surrounded with the dashed line in FIG. 5 shows a power circuit 1 of the power module 2 according to the first embodiment.

Figure 26A:
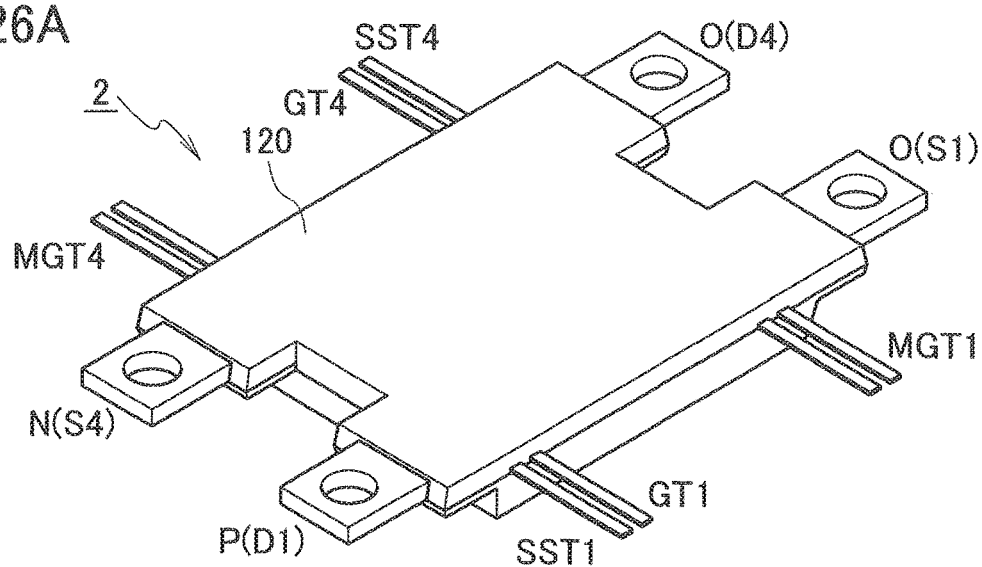
FIG. 26A is a schematic bird's-eye view configuration diagram after forming a resin layer on the power module according to the first embodiment.

FIG. 3 shows a schematic planar pattern configuration before forming a resin layer 120 in a module with the built-in half-bridge, as the power module 2 according to the first embodiment, and FIG. 26A shows a schematic bird's-eye view configuration after forming the resin layer 120. The power module 2 according to the first embodiment includes a configuration of a module with the built-in half-bridge, and two sets of power transistors Q1, Q4 (e.g., SiC MOSFETs) are built in one module. FIG. 3 shows an example in which 3 chips of the power transistors Q1, Q4 are respectively disposed in parallel to one another.

As shown in FIGS. 3 and 26, the power module 2 according to the first embodiment includes: a positive-side power terminal P and a negative-side power terminal N disposed at a first side of the ceramic substrate 8; a gate terminal GT1, a source sense terminal SST1, and a mirror clamp gate terminal MGT1 disposed at a second side adjacent to the first side; output terminals O (D4) and O (S1) disposed at a third side opposite to the first side; and a gate terminal GT4, a source sense terminal SST4, and a mirror clamp gate terminal MGT4 disposed at a fourth side opposite to the second side.

Moreover, the power transistors Q1, Q4 are disposed face up on drain patterns D1 and D4 disposed on the ceramics substrate 8, and the active mirror clamp transistors QM1, QM4 are respectively disposed face up on mirror clamp drain patterns MDP1, MDP4 disposed on the ceramics substrate 8.

In this context, the gate terminal GT1 and the source sense terminal SST1 are respectively connected to a gate signal wiring pattern GL1 (MDP1) and a source signal wiring pattern SSP1 (MSP1) of the power transistor Q1 (MSP1), and the gate terminal GT4 and the source sense terminal SST4 are respectively connected to a gate signal wiring pattern GL4 (MDP4) and a source signal wiring pattern SSP4 (MSP4) in the power transistor Q4 (MSP4).

As shown in FIG. 3, from the power transistors Q1, Q4, source wires SW1, SW4 are respectively connected toward the drain pattern D4 (S1) and the source pattern S4 disposed on the ceramics substrate 8, gate wires GW1, GW4 are respectively connected toward the gate signal wiring patterns GL1, GL4, and source sense wires SSW1, SSW4 are respectively connected toward the source signal wiring patterns SSP1, SSP4.

Similarly, as shown in FIG. 3, from the active mirror clamp transistors QM1, QM4, mirror clamp source wires MSW1, MSW4 are respectively connected toward the source sense signal wiring patterns SSP1, SSP4 disposed on the ceramics substrate 8, and mirror clamp gate wires MGW1, MGW4 are respectively connected toward the gate signal wiring patterns MGP1, MGP4.

Moreover, the gate terminals GT1, GT4 for external extraction are respectively connected to the gate signal wiring patterns GL1, GL4 by soldering or the like, and the source sense terminals SST1 and SST4 for external extraction are respectively connected to the source sense signal wiring patterns SSP1, SSP4 by soldering or the like.

Moreover, the power module 2 according to the first embodiment may respectively include mirror clamp gate resistors MR1, MR4, as shown in FIGS. 3A and 5. The mirror clamp gate terminals MGT1, MGT4 are respectively connected to the gate signal wiring patterns MGP1, MGP4 through the mirror clamp gate resistors MR1, MR4. The mirror clamp gate resistors MR1, MR4 are resistors used for suppressing a gate surge voltage due to a sharp change of the gate current during the mirror clamp operation. The gate resistors MR1, MR4 also have a function of controlling an output current of a gate drive integrated circuit (IC) so as not to exceed the rating.

Moreover, resistors DR1 and DR4 for electric discharge are respectively connected between the gate signal wiring patterns GL1, GL4 and the source signal wiring patterns SSP1, SSP4.

The power module 2 according to the first embodiment may include the resistors DR1 and DR4 for electric discharge, as shown in FIGS. 3A and 5. The resistors DR1 and DR4 for electric discharge are respectively connected between the gate signal wiring patterns GL1, GL4 and the source signal wiring patterns SSP1, SSP4. A push pull circuit composed by including a pnp transistor $Q_p$/a npn transistor $Q_n$ is used at a previous stage, in order to amplify the gate input signal (refer to FIGS. 19 and 23). A voltage for a diffusion potential due to a pn junction (approximately 0.6V in a case of Si) remains between the gate and the source even after turning-off of the pnp transistor $Q_p$. The resistors DR1 and DR4 for electric discharge are resistors used for discharging the remaining voltage in order to reduce the voltage to 0V. The resistors DR1 and DR4 are not always necessary when the active mirror clamp transistors QM1, QM4 are used, but are necessary when the active mirror clamp transistors QM1, QM4 are not used.

The positive-side power terminal P and the negative-side power terminal N, and the gate terminals GT1, GT4 and SST1, SST4 for external extraction can be formed of Cu, for example.

For example, the ceramic substrate 8 may be formed of $Al_2O_3$, AlN, SiN, AlSiC, or graphite, or SiC of which at least the surface is insulation.

The main wiring conductor (electrode pattern) can be formed by including Cu, Al, or the like, for example.

The source wires SW1, SW4, the gate wires GW1, GW4, and the source sense wires SSW1, SSW4 can be formed by including Al, AlCu, or the like, for example. First connected conductors MSW1, MSW4 and second connected conductors MGW1, MGW4 which will be mentioned below can also be formed by including Al, AlCu, or the like, for example, when being formed by bonding wires.

SiC based power devices, e.g. SiC DIMISFET and SiC TMISFET, or GaN based power devices, e.g. GaN based High Electron Mobility Transistor (HEMT), are applicable as the power transistors Q1, Q4. In some instances, power devices, e.g. Si based MOSFETs and IGBT, are also applicable thereto.

Moreover, transfermold resins, thermosetting resins, etc. applicable to the SiC based semiconductor device can be used as the resin layer 120. Moreover, silicone based resins, e.g. silicone gel, may partially be applied thereto, or case type power modules may be adopted to be applied to the whole thereof.

The voltage surge between gate and source ($\Delta V$) leading to a malfunction of transistors is produced by a resistor (R), an inductance (L), and a current variation (dI/dt) in a path between gate and source, and is expressed by $\Delta V = RI + L(dI/dt)$. In this equation, the component of L(dI/dt) can be a large value when performing high speed switching of a large current using a large-capacity SiC MOSFET, for example.

The active mirror clamp transistors are installed in order to short-circuit the path between gate and source to reduce the inductance. However, such an active mirror clamp transistor was installed in the outside of the module, and thereby not obtaining enough effect. In order to switch the power transistors, such as SiC MOSFET, at higher speed, it is necessary to install the active mirror clamp transistor nearer the power transistor. One of the methods is to be built-in the module.

In order to obtain the maximum effect in a layout of a module capable of actually build in the active mirror clamp transistor, a matter to be particularly noted is to "reduce the inductance of the source wiring as small as possible."

The parasitic inductance of the signal wiring of the active mirror clamp transistor corresponds to the inductance of the signal wire. In order to suppress a malfunction, it is effective to shorten the source signal wire.

If the inductance of such a source signal wire is large, the inductance of the path between gate and source is ultimately increased, and therefore a malfunction cannot be suppressed. Since the gate wiring is inevitably disposed on the outside (or an equidistant position) of the source wiring when the source wiring is shortened as much as possible, the expression "the active mirror clamp transistor is disposed so that the length of the source wiring bonding material is equal to or less than the length of the gate wiring bonding material" is used herein.

In addition, since it is also possible to shorten the source wiring and also form the gate wiring the similar length thereto, depending on the layout, there is included a case where the length of the source wiring bonding material is equivalent to the length of the gate wiring bonding material.

As shown in FIG. 3A, the power module 2 according to the first embodiment comprising: power transistors Q1, Q4 forming a half bridge, the power transistors Q1, Q4 respectively disposed at upper and lower arms of the half bridge 1; active mirror clamp transistors QM1, QM4 of which drains are respectively connected to gates G1 and G4 sides of the power transistors Q1, Q4, and sources are respectively connected to the sources S1, S4 sides of the power transistors Q1, Q4; source signal wiring patterns SSP1, SSP4 respectively connected to the sources S1, S4 of the power transistors Q1, Q4; connected conductors MSW1, MSW4 for respectively connecting between the source signal wiring patterns SSP1, SSP4 and the sources of the active mirror clamp transistors QM1, QM4; gate signal wiring patterns MGP1, MGP4 respectively connected to mirror clamp gates MG1, MG4 of the active mirror clamp transistors QM1, QM4; and connected conductors MGW1, MGW4 for respectively connecting between the gate signal wiring patterns MGP1, MGP4 and the mirror clamp gates MG1, MG4 of the active mirror clamp transistors QM1, QM4. In this context, lengths of the connected conductors MSW1, MSW4 are respectively equal to or less than lengths of the connected conductors MGW1, MGW4.

In this context, the path shown by the arrows ($\Rightarrow$) in FIG. 4 shows the gate short circuit path of the power transistor Q4 formed by the active mirror clamp transistor QM4. Although illustration is omitted, the gate short circuit path of the power transistor Q1 formed by the active mirror clamp transistor QM1 can similarly be expressed.

The active mirror clamp transistors QM1, QM4 are used in order to shorten the gate short circuit path of the power transistors Q1, Q4 of the power circuit, and thereby reduce the gate inductance. When the active mirror clamp transistors QM1, QM4 are build in the power module, the short circuit path is further shorter as compared with the case of being installed outside the power module, and therefore the suppression effect of the malfunction becomes higher.

On the other hand, since the space is required when the active mirror clamp transistor is built in the power module, it is subjected to the restriction on the layout. In order to build the active mirror clamp transistor therein without also increasing the inductance of the power circuit and without increasing the power module size, it is preferable to minimize the space of the signal patterns.

As the signal patterns required for the power module in which the active mirror clamp transistor is built, at least three types of signal patterns, the gate pattern, the source sense pattern of the power transistor, and the mirror clamp gate pattern of the active mirror clamp transistor, are listed. Although the gate pattern, the source sense pattern, and the mirror clamp gate pattern are respectively connected to the drain, the source, and the gate of the active mirror clamp transistor, since the space of the signal patterns is restricted, it is difficult to produce a layout for disposing both of the mirror clamp gate pattern and the source sense pattern near the active mirror clamp transistor.

In this case, although it is necessary to lengthen any one of the mirror clamp gate wiring or the mirror clamp source wiring, since the parasitic inductance of the mirror clamp source wiring is added to the gate inductance of the power transistor as it is, the parasitic inductance of the mirror clamp source wiring should be reduced. On the other hand, since the parasitic inductance of the mirror clamp gate wiring does not affect the gate inductance of the power transistor, the parasitic inductance of the mirror clamp gate wiring is acceptable even if it is large. More specifically, the module having higher suppression effect of the malfunction can be provided by producing the layout so that the mirror clamp source wiring is shorter than the mirror clamp gate wiring.

Although the example of using the bonding wires for the connected conductors MSW1, MSW4 and the connected conductors MGW1, MGW4 is shown in the example shown in FIG. 3, leadframes may be used therefor instead of the bonding wires.

That is, bonding wires are generally used for the mirror clamp gate wiring and the mirror clamp source wiring, but it is not limited to such an example. Leadframes, or conductors or signal wiring formed by a thin-film formation process, such as plating, sputtering, CVD, may be applied. For example, the conductors formed by the thin-film formation process correspond to metallic film patterns formed by such a fabricating technology. Three-dimensional wiring structure may be formed by the thin film process. In the case of the plating process, a seed layer is formed by CVD or sputtering, and then plating is formed thereon. As a material of plating, Cu, Ag, W, or Mo may be applied, for example.

In the power module according to the first embodiment, in order to suppress the malfunction at the time of switching of the target power transistor, the active mirror clamp transistor is built in the power module, and the active mirror clamp transistor is disposed to form the signal patterns so that the lengths of connected conductors MSW1, MSW4 of the active mirror clamp transistor QM are respectively equal to or less than the lengths of the conductors MGW1, MGW4.

The active mirror clamp transistor is built in the power module and is disposed in the appropriate position, and thereby the gate inductance of the power transistor can be reduced and the malfunction can be suppressed without increasing the power module size and without increasing the inductance of the power circuit.

In addition, since the intention of this configuration is to reduce the impedance of the short circuit path between the drain and the source of the active mirror clamp transistor QM, it is preferable that the cross-sectional area of the connected conductor MSW is equal to or greater than the cross-sectional area of the connected conductor MGW. Moreover, since the parasitic inductance of the electrode pattern 10U and the electrode pattern 10U (SSP) is also included in the parasitic inductance of the short circuit path between the gate and the source of the power transistor, it is more preferable from the viewpoint of suppression of the malfunction prevention that the parasitic inductance of the electrode pattern 10U and the electrode pattern 10U (SSP) is designed to be preferentially lower than that of the electrode pattern 10U (MGP).

In addition, the electrode pattern 10D may be connected to any one of the power terminals (P, N), in FIGS. 1B, 2B, and 3B. Moreover, the electrode pattern 10D may be an insulated pattern for thermal dissipation. Thus, an effect of stress relaxation of the insulating substrate, etc. can be obtained by forming the electrode pattern also on the back side surface thereof.

[Second Embodiment]
(2-in-1 Configuration)

Figure 6:
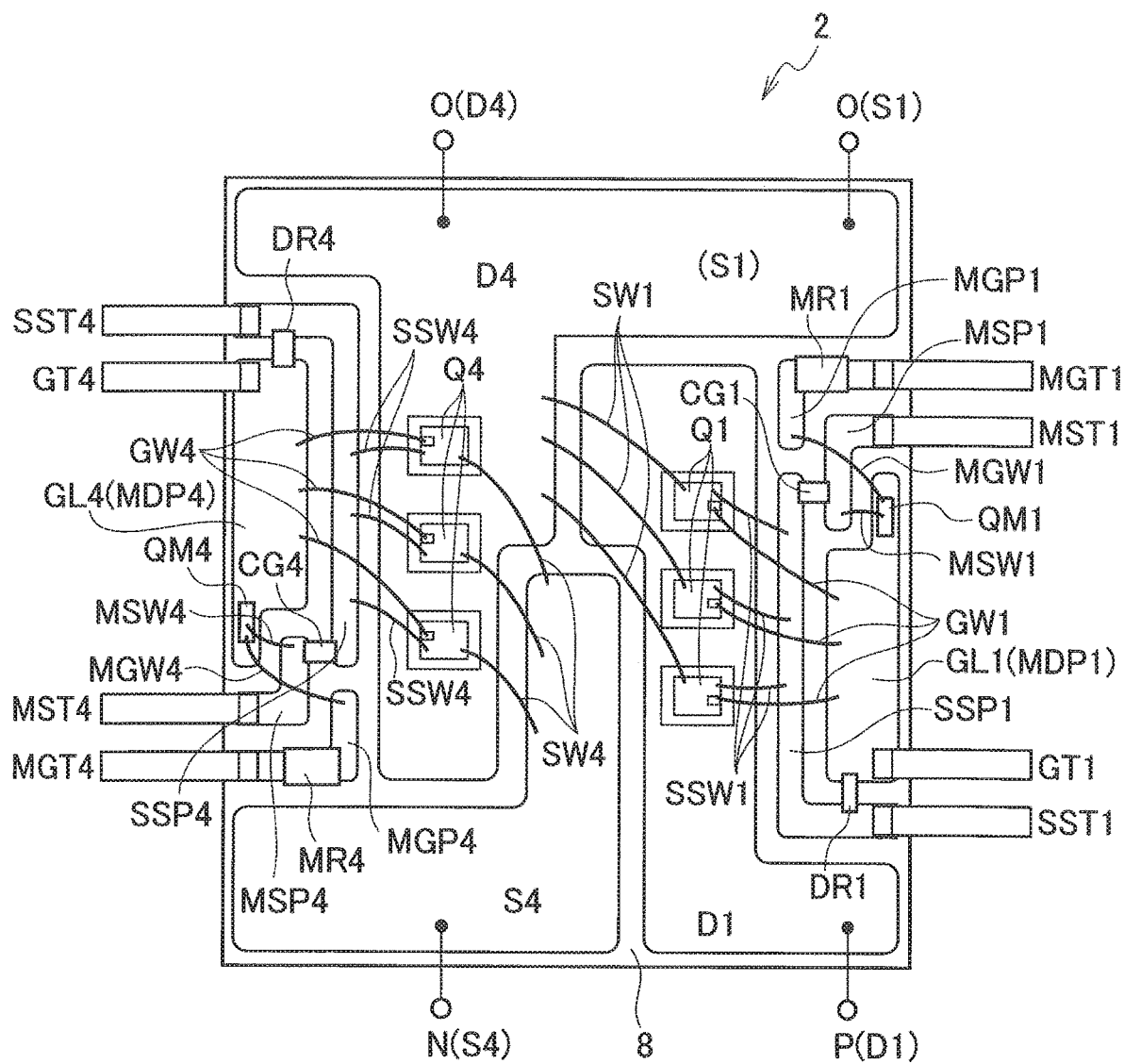
FIG. 6 is a schematic planar pattern configuration diagram showing a power module according to a second embodiment.
Figure 7:
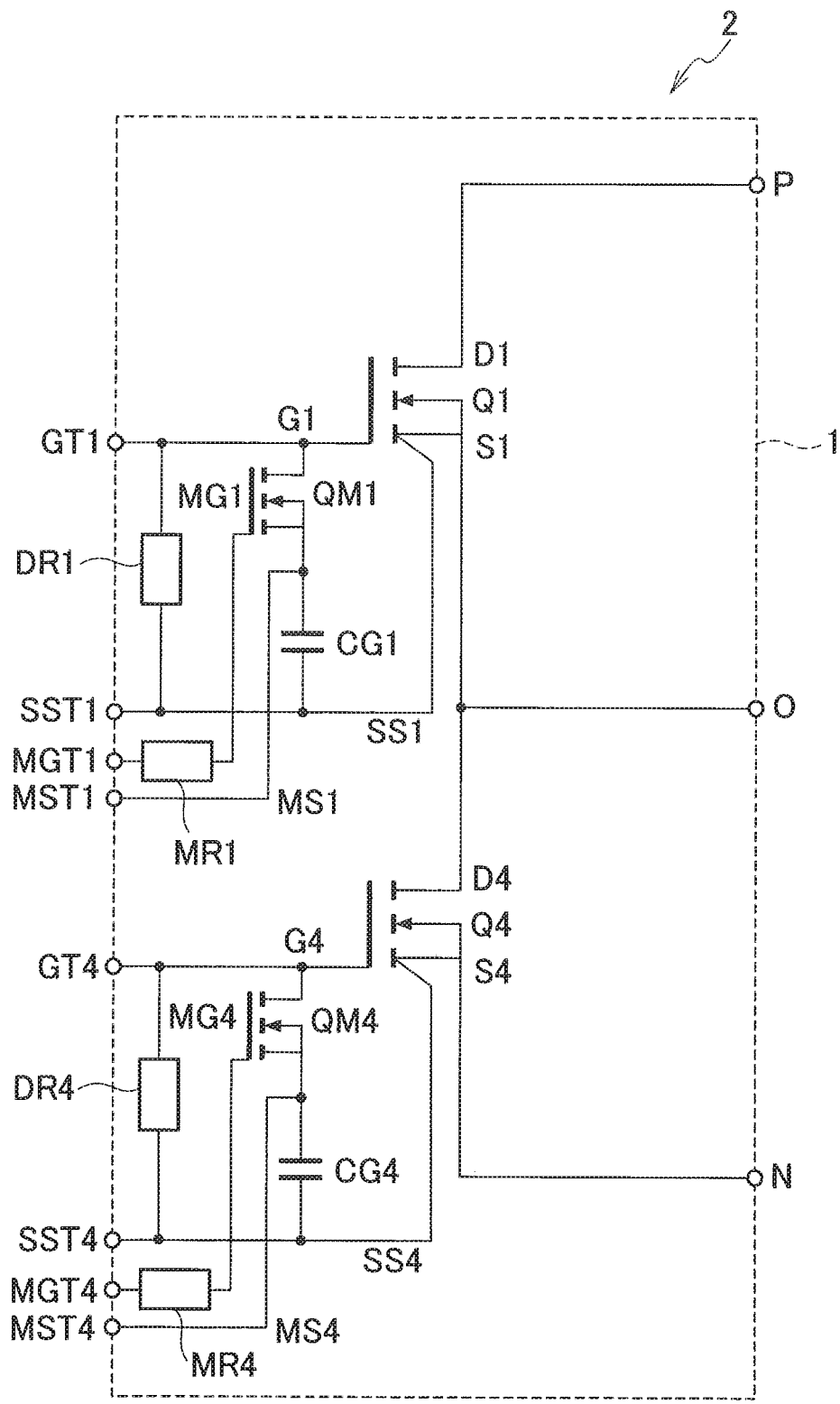
FIG. 7 is a circuit configuration diagram showing the power module according to the second embodiment.

FIG. 6 shows a schematic planar pattern configuration of the power module 2 according to the second embodiment, and FIG. 7 shows a circuit configuration of the power module corresponding to FIG. 6. In this context, the circuit configuration surrounded with the dashed line in FIG. 7 shows a power circuit 1 of the power module 2 according to the second embodiment.

Figure 26B:
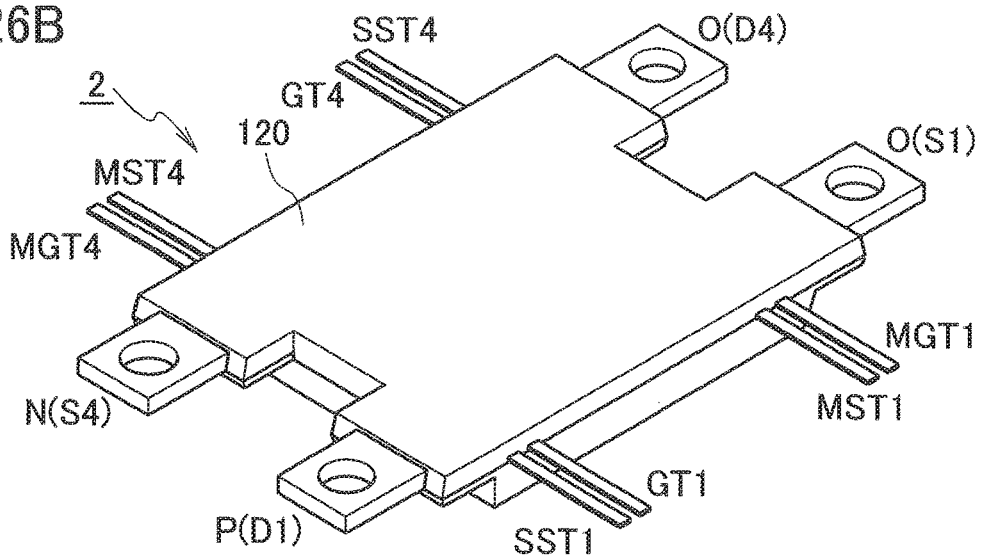
FIG. 26B is a schematic bird's-eye view configuration diagram after forming the resin layer on the power module according to the second embodiment.

FIG. 6 shows a schematic planar pattern configuration before forming a resin layer 120 in a module with the built-in half-bridge, as the power module 2 according to the second embodiment, and FIG. 26B shows a schematic bird's-eye view configuration after forming the resin layer 120. In this context, the circuit configuration surrounded with the dashed line in FIG. 7 shows a power circuit 1 of the power module 2 according to the second embodiment. The same applies hereafter. The power module 2 according to the second embodiment includes a configuration of a module with the built-in half-bridge, and two sets of power transistors Q1, Q4 (e.g., SiC MOSFETs) are built in one module. FIG. 6 shows an example in which 3 chips of the power transistors Q1, Q4 are respectively disposed in parallel to one another.

As shown in FIGS. 6 and 26B, the power module 2 according to the second embodiment includes: a positive-side power terminal P and a negative-side power terminal N disposed at a first side of the ceramic substrate 8; a gate terminal GT1, a source sense terminal SST1, and a mirror clamp gate terminal MGT1, a mirror clamp source terminal MST1 disposed at a second side adjacent to the first side; output terminals O (D4) and O (S1) disposed at a third side opposite to the first side; and a gate terminal GT4, a source sense terminal SST4, and a mirror clamp gate terminal MGT4, a mirror clamp source terminal MST4 disposed at a fourth side opposite to the second side.

Moreover, the power transistors Q1, Q4 are disposed face up on drain patterns D1 and D4 disposed on the ceramics substrate 8, and the active mirror clamp transistors QM1, QM4 are respectively disposed face up on mirror clamp drain patterns MDP1, MDP4 disposed on the ceramics substrate 8.

In this context, the gate terminal GT1 and the source sense terminal SST1 are respectively connected to a gate signal wiring pattern GL1 (MDP1) and a source signal wiring pattern SSP1 of the power transistor Q1 (MSP1), and the gate terminal GT4 and the source sense terminal SST4 are respectively connected to a gate signal wiring pattern GL4 (MDP4) and a source signal wiring pattern SSP4 in the power transistor Q4 (MSP4).

As shown in FIG. 6, from the power transistors Q1, Q4, source wires SW1, SW4 are respectively connected toward the drain pattern D4 (S1) and the source pattern S4 disposed on the ceramics substrate 8, gate wires GW1, GW4 are respectively connected toward the gate signal wiring patterns GL1, GL4, and source sense wires SSW1, SSW4 are respectively connected toward the source signal wiring patterns SSP1, SSP4.

Similarly, as shown in FIG. 6, from the active mirror clamp transistors QM1, QM4, mirror clamp source wires MSW1, MSW4 are respectively connected toward the mirror clamp source patterns MSP1, MSP4 disposed on the ceramics substrate 8, and mirror clamp gate wires MGW1, MGW4 are respectively connected toward the gate signal wiring patterns MGP1, MGP4.

Moreover, the source signal wiring patterns SSP1, SSP4 is respectively connected to the mirror clamp source patterns MSP1, MSP4 through negative bias applying capacitors CG1, CG4.

Moreover, the gate terminals GT1, GT4 for external extraction are respectively, connected to the gate signal wiring patterns GL1, GL4 by soldering or the like, the source sense terminals SST1 and SST4 for external extraction are respectively connected to the source signal wiring patterns SSP1, SSP4 by soldering or the like, and the mirror clamp source terminals MST1, MST4 for external extraction are respectively connected to the mirror clamp source patterns MSP1, MSP4 by soldering or the like.

Moreover, the mirror clamp gate terminals MGT1, MGT4 are respectively connected to the gate signal wiring patterns MGP1, MGP4 through the mirror clamp gate resistors MR1, MR4.

Moreover, resistors DR1 and DR4 for electric discharge are respectively connected between the gate signal wiring patterns GL1, GL4 and the source signal wiring patterns SSP1, SSP4.

The reason for respectively disposing the capacitors CG1, CG4 between the mirror clamp sources MS1, MS4 and the source senses SS1, SS4 of the active mirror clamp transistors QM1, QM4 is as follows. In order to suppress erroneous turning-on of the power transistors Q1, Q4, a negative voltage may be applied between the gate and the source when the power transistors Q1, Q4 are turned OFF. Using an external power supply, the negative voltage is applied between the mirror clamp sources MS1, MS4 of the active mirror clamp transistors QM1, QM4 and the source senses SS1, SS4 of the power transistors Q1, Q4, as shown in the circuit diagram showing in FIG. 24.

If the negative bias applying capacitors CG1, CG4 are not built near the power transistors Q1, Q4, the signal path between the gate and the source of the power transistors Q1, Q4 becomes extremely long, and the effect of the built-in active mirror clamp transistor is lost. The negative bias applying capacitors CG1, CG4 are built in, and the wiring signal patterns capable of voltage application from the external power supply are connected to both ends thereof, and thereby the aimed characteristics can be realized.

As shown in FIGS. 6 and 7, the power module 2 according to the second embodiment includes at least: mirror clamp source patterns MSP1, MSP4 respectively connected to mirror clamp sources MS1, MS4 of active mirror clamp transistors QM1, QM4; negative bias applying capacitors CG1, CG4 respectively disposed between source signal wiring patterns SSP1, SSP4 and the mirror clamp source patterns MSP1, MSP4; gate signal wiring patterns GL1, GL4 respectively connected to gates G1, G4 of power transistors Q1, Q4; first signal terminals GT1, GT4 respectively connected to the gate signal wiring patterns GL1, GL4; second signal terminals SST1, SST4 respectively connected to the source signal wiring patterns SSP1, SSP4; third signal terminals MGT1, MGT4 respectively connected to gate signal wiring patterns MGP1, MGP4; and fourth signal terminals MST1, MST4 respectively connected to the mirror clamp source patterns MSP1, MSP4. In this context, one ends of the connected conductors MSW1, MSW4 are respectively connected to the source signal wiring patterns SSP1, SSP4 through the negative bias applying capacitors CG1, CG4. In this context, lengths of the connected conductors MSW1, MSW4 are respectively equal to or less than lengths of the connected conductors MGW1, MGW4. Other configurations are the same as those of the first embodiment.

In the power module according to the second embodiment, in order to suppress the malfunction at the time of switching of the target power transistor, the active mirror clamp transistor is built in the power module, and the active mirror clamp transistor is disposed to form the signal patterns so that the lengths of connected conductors MSW1, MSW4 of the active mirror clamp transistors are respectively equal to or less than the lengths of the conductors MGW1, MGW4.

The active mirror clamp transistor is built in the power module and is disposed in the appropriate position, and thereby the gate inductance of the power transistor can be reduced and the malfunction can be suppressed without increasing the power module size and without increasing the inductance of the power circuit.

In the power module 2 according to the second embodiment, when the power transistor is turned OFF, it is possible to apply the negative voltage between the gate and the source through the negative bias applying capacitors CG1, CG4, and thereby the malfunction of the power transistor can be suppressed. In order to reduce the gate inductance also including the negative-bias applied path, the negative bias applying capacitors CG1, CG4 are respectively inserted between the source senses SS1, SS4 of the power transistors Q1, Q4, and the mirror clamp sources MS1, MS4 of the active mirror clamp transistors QM1, QM4, and the negative voltage is applied to both ends of the negative bias applying capacitors CG1, CG4. The signal terminals are realized by using at least four of the gate terminals GT1, GT4 and the source sense terminals SST1, SST4 of the power transistors Q1, Q4 and the mirror clamp gate terminals MGT1, MGT4 and the mirror clamp source terminals MST1, MST4.

The active mirror clamp transistors QM1, QM4 are used in order to shorten the short circuit path between the gate and the source of the power transistors Q1, Q4, and thereby reduce the gate inductance. When the active mirror clamp transistors are build in the power module, the short circuit path is further shorter as compared with the case of being installed outside the power module, and therefore the suppression effect of the malfunction becomes higher.

Although the example of using the bonding wires for the connected conductors MSW1, MSW4 and the connected conductors MGW1, MGW4 is shown in the example shown in FIG. 6, leadframes may be used therefor instead of the bonding wires.

[Third Embodiment]

Figure 8:
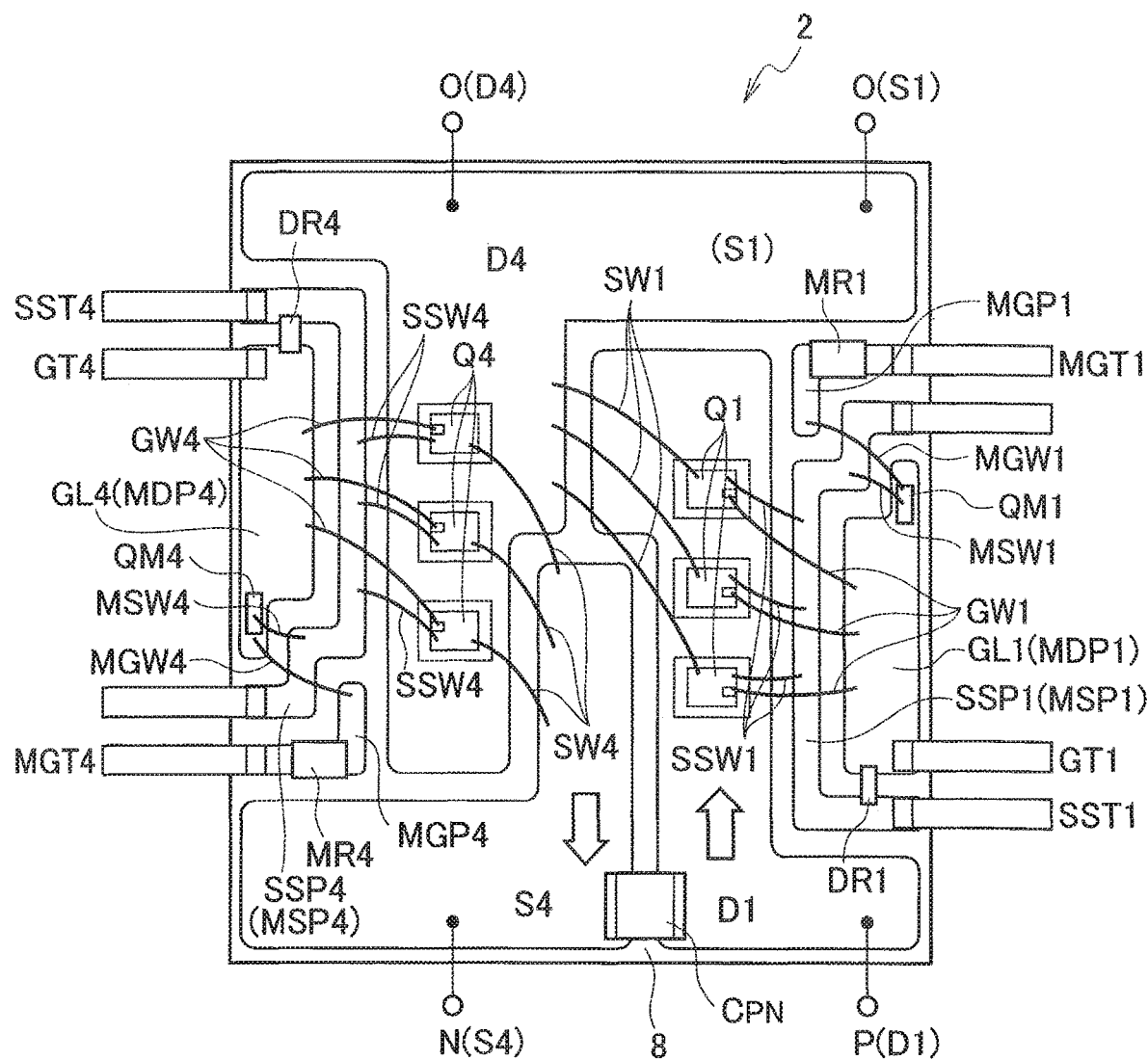
FIG. 8 is a schematic planar pattern configuration diagram showing a power module according to a third embodiment.
Figure 9:
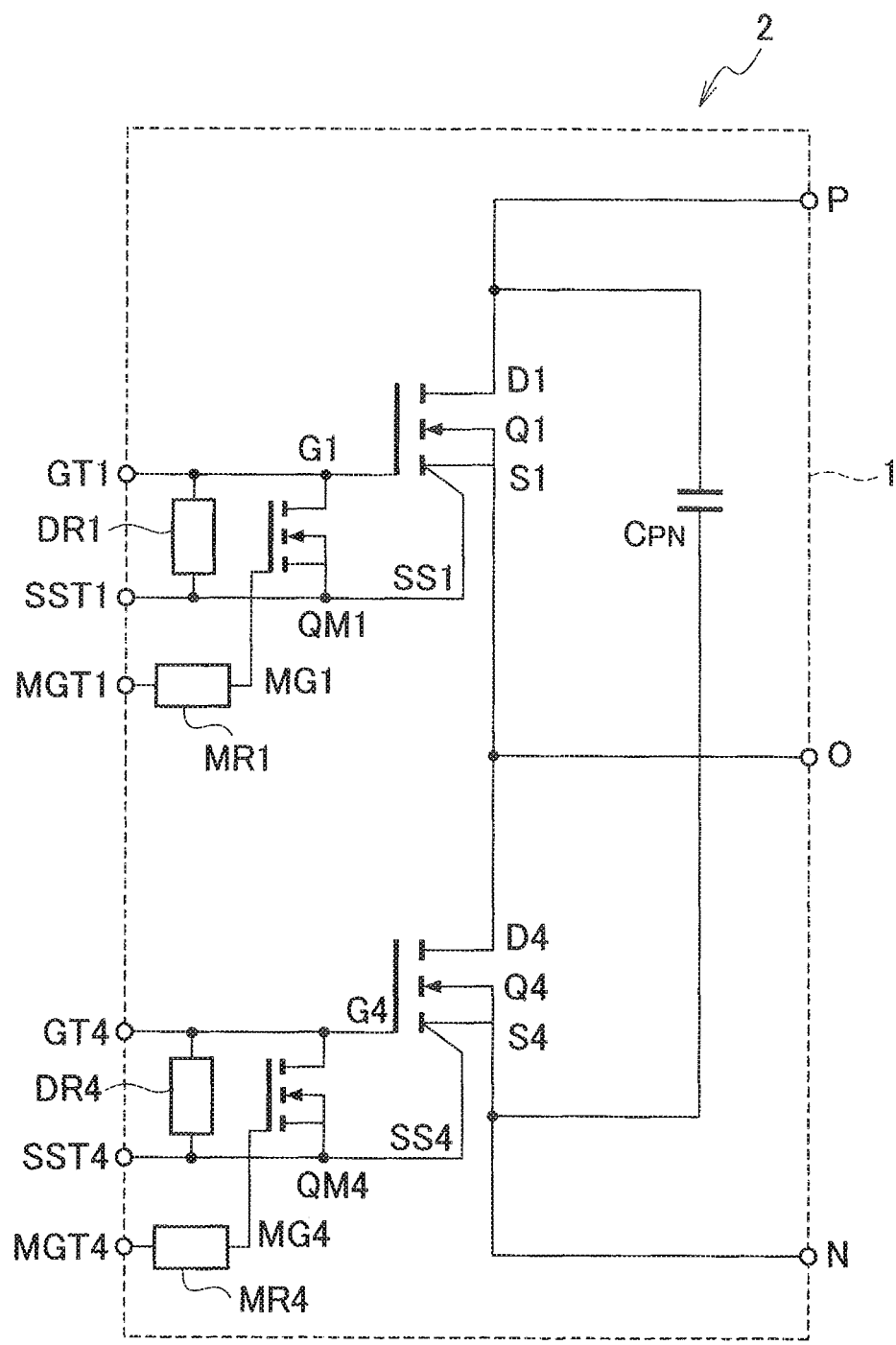
FIG. 9 is a circuit configuration diagram showing the power module according to the third embodiment.

FIG. 8 shows a schematic planar pattern configuration of the power module 2 according to the third embodiment, and FIG. 9 shows a circuit configuration thereof. In this context, the circuit configuration surrounded with the dashed line in FIG. 9 shows a power circuit 1 of the power module 2 according to the third embodiment.

As shown in FIG. 8, the power module 2 according to the second embodiment includes a DC link capacitor $C_{PN}$ electrically connected between the positive-side power terminal P and the negative-side power terminal N. As the DC link capacitor $C_{PN}$, the ceramic capacitor or the like can be applied.

As shown in FIGS. 8 and 9, the power module 2 according to the third embodiment includes: a positive-side power terminal P and a negative-side power terminal N; a drain pattern D1 connected to the positive-side power terminal P; a source pattern S4 connected to the negative-side power terminal N; and a DC link capacitor $C_{PN}$ disposed between the drain pattern D1 and the source pattern S4. In FIG. 8, the arrows (⇒) schematically express directions of a principal current which conducts the drain pattern D1 connected to the positive-side power terminal P and the source pattern S4 connected to the negative-side power terminal N.

In the power module 2 according to the third embodiment, the parasitic inductance of the short-circuit current path is reduced and thereby a drain surge voltage can be suppressed. Other configurations are the same as those of the first embodiment.

Also in the power module according to the third embodiment, in order to suppress the malfunction at the time of switching of the target power transistor, the active mirror clamp transistor is built in the power module, and the active mirror clamp transistor is disposed to form the signal patterns so that the lengths of connected conductors MSW1, MSW4 of the active mirror clamp transistors are respectively equal to or less than the lengths of the conductors MGW1, MGW4.

The active mirror clamp transistor is built in the power module and is disposed in the appropriate position, and thereby the gate inductance of the power transistor can be reduced and the malfunction can be suppressed without increasing the power module size and without increasing the inductance of the power circuit.

Although the example of using the bonding wires for the connected conductors MSW1, MSW4 and the connected conductors MGW1, MGW4 is shown in the example shown in FIG. 8, leadframes may be used therefor instead of the bonding wires.

[Fourth Embodiment]

Figure 10:
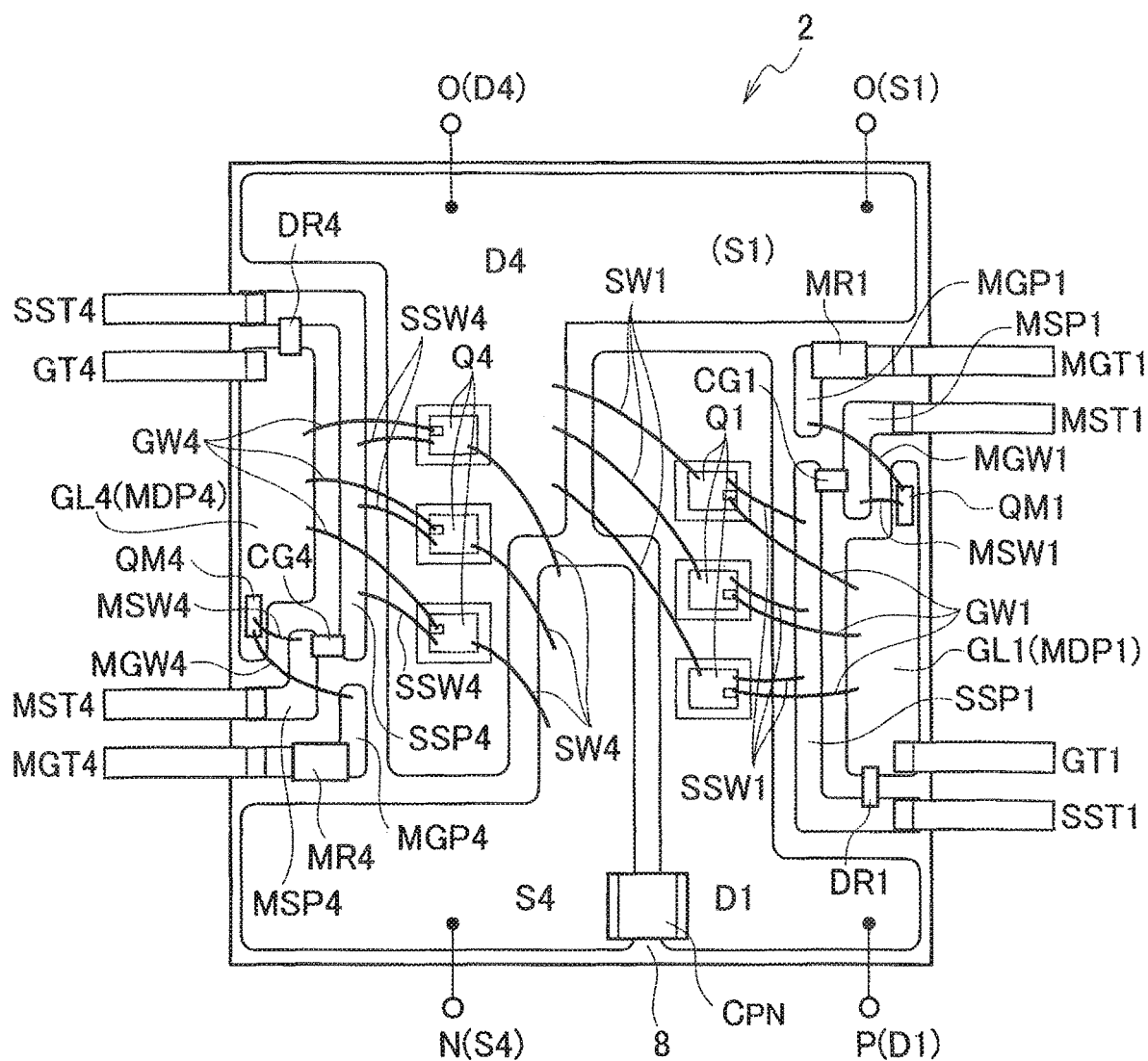
FIG. 10 is a schematic planar pattern configuration diagram showing a power module according to a fourth embodiment.
Figure 11:
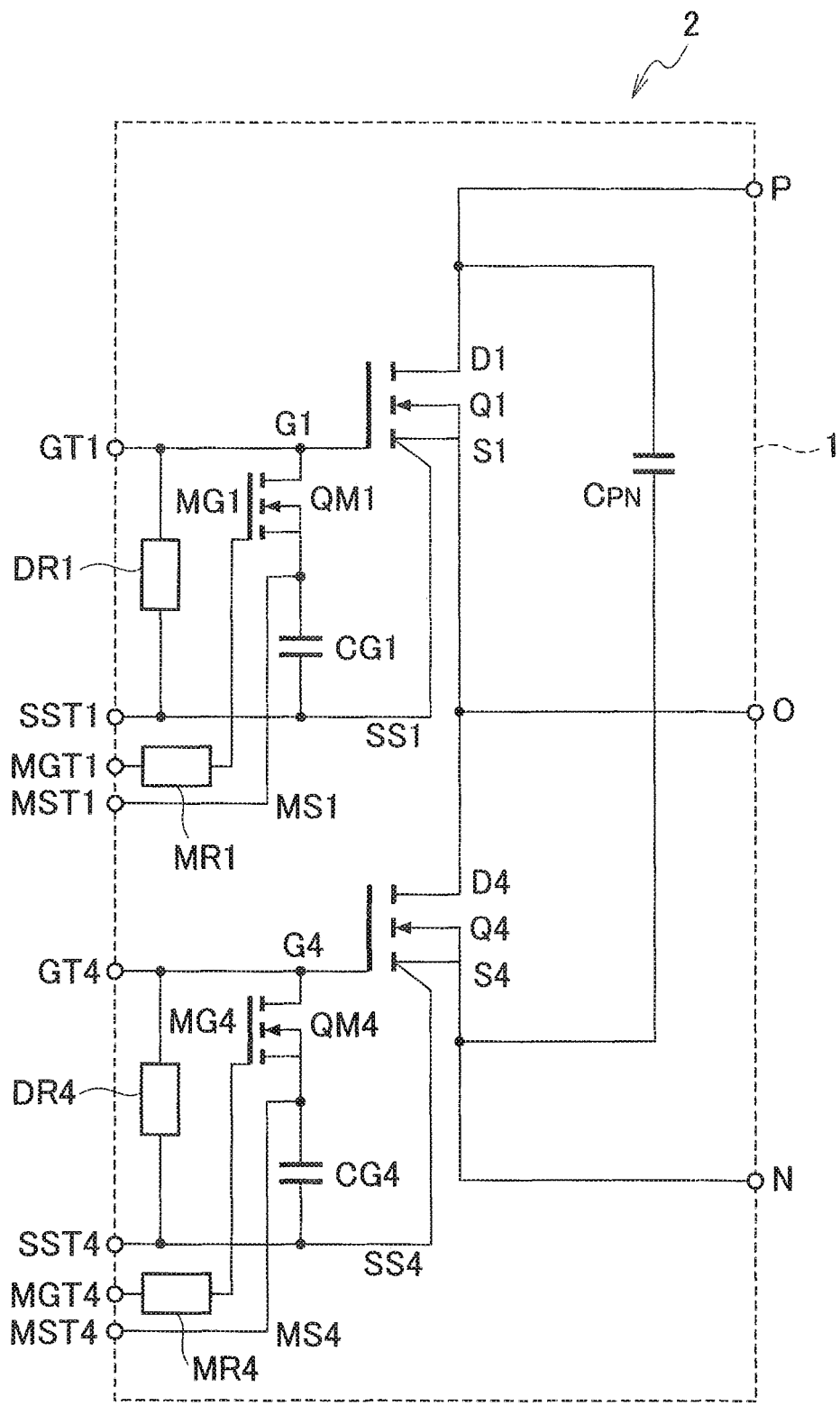
FIG. 11 is a circuit configuration diagram showing the power module according to the fourth embodiment.
Figure 12:
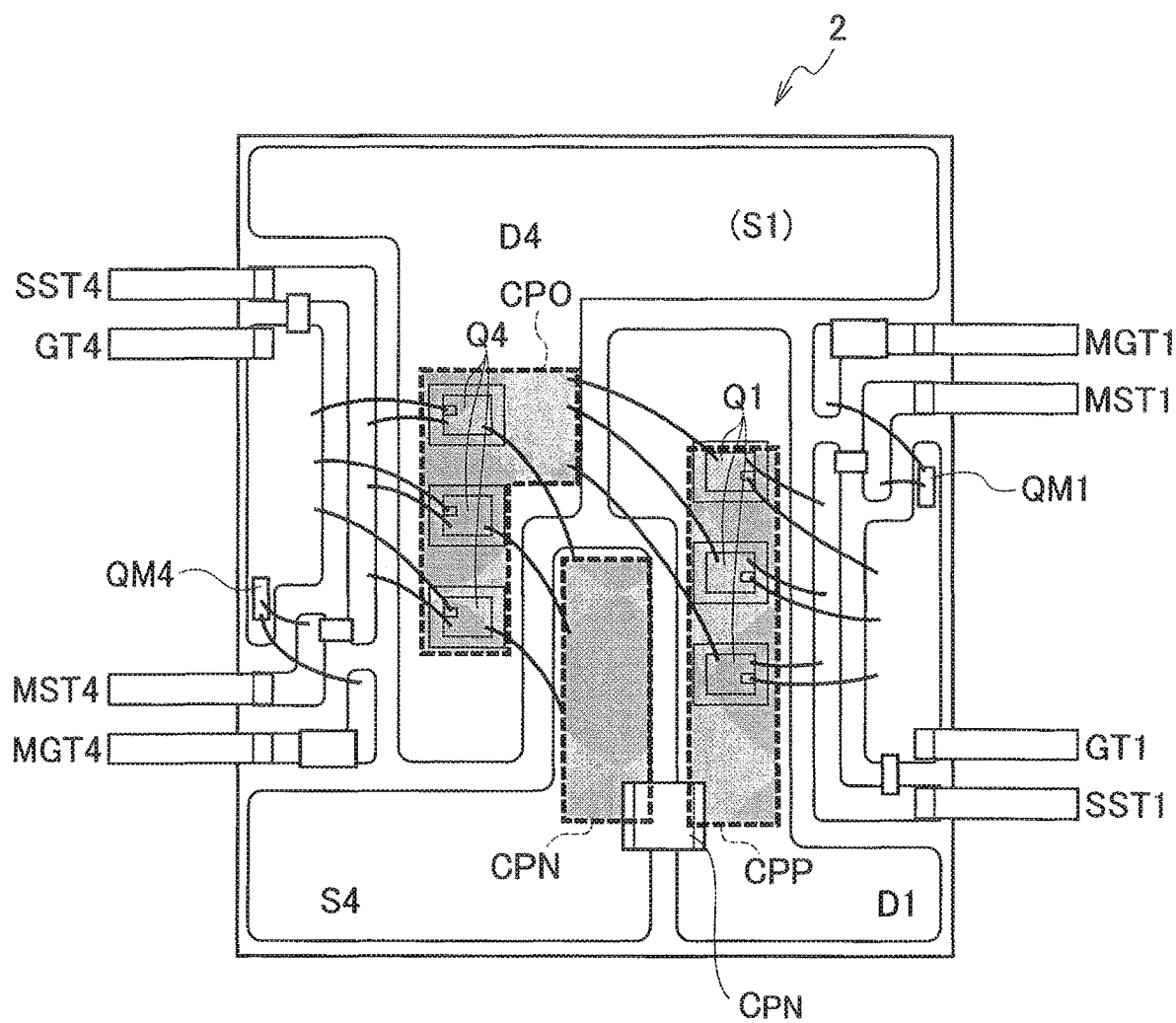
FIG. 12 is an operation explanatory diagram of the power module according to the fourth embodiment.

FIG. 10 shows a schematic planar pattern configuration of the power module 2 according to the fourth embodiment, and FIG. 11 shows a circuit configuration thereof. Moreover, FIG. 12 shows an operation explanation of the power module 2 according to the fourth embodiment. In this context, the circuit configuration surrounded with the dashed line in FIG. 11 shows a power circuit 1 of the power module 2 according to the fourth embodiment.

As shown in FIG. 10, the power module 2 according to the fourth embodiment includes a DC link capacitor $C_{PN}$ electrically connected between the positive-side power terminal P and the negative-side power terminal N. As the DC link capacitor $C_{PN}$, the ceramic capacitor or the like can be applied.

As shown in FIGS. 10 and 11, the power module 2 according to the fourth embodiment includes: a positive-side power terminal P and a negative-side power terminal N; a drain pattern D1 connected to the positive-side power terminal P; a source pattern S4 connected to the negative-side power terminal N; and a DC link capacitor $C_{PN}$ disposed between the drain pattern D1 and the source pattern S4.

In FIG. 12, on the drain patterns D1 and D4 and the source pattern S4, regions where the electric current of the power circuit concentrates can be schematically expressed by a P-side current concentration region CPP, an O-side current concentration region CPO, and an N-side current concentration region $C_{PN}$. Since the P-side current concentration region CPP is a shortest path for connecting between the drain of the power transistor Q1 and one end of the DC link capacitor, the principal current easily concentrates. Since the O-side current concentration region CPO is a shortest path for connecting between the source of the power transistor Q1 and the drain of the power transistor Q4, the principal current easily concentrates. Since the N-side current concentration region $C_{PN}$ is a shortest path for connecting between the source of the power transistor Q4 and one end of the DC link capacitor, the principal current easily concentrates.

In the power module 2 according to the fourth embodiment, by disposing DC link capacitor $C_{PN}$ near the P-side current concentration region CPP and the N-side current concentration region $C_{PN}$, the parasitic inductance of the short-circuit current path can be reduced, and thereby the drain surge voltage can be suppressed. Other configurations are the same as those of the second embodiment.

Also in the power module according to the fourth embodiment, in order to suppress the malfunction at the time of switching of the target power transistor, the active mirror clamp transistor is built in the power module, and the active mirror clamp transistor is disposed to form the signal patterns so that the lengths of connected conductors MSW1, MSW4 of the active mirror clamp transistors are respectively equal to or less than the lengths of the conductors MGW1, MGW4.

The active mirror clamp transistor is built in the power module and is disposed in the appropriate position, and thereby the gate inductance of the power transistor can be reduced and the malfunction can be suppressed without increasing the power module size and without increasing the inductance of the power circuit.

Moreover, in the power module 2 according to the fourth embodiment, when the power transistor is turned OFF, it is possible to apply the negative voltage between the gate and the source through the negative bias applying capacitors CG1, CG4, and thereby the malfunction of the power transistor can be suppressed. In order to reduce the gate inductance also including the negative-bias applied path, the negative bias applying capacitors CG1, CG4 are respectively inserted between the source senses SS1, SS4 of the power transistors Q1, Q4, and the mirror clamp sources MS1, MS4 of the active mirror clamp transistors QM1, QM4, and the negative voltage is applied to both ends of the negative bias applying capacitors CG1, CG4. The signal terminals are realized by using at least four of the gate terminals GT1, GT4 and the source sense terminals SST1, SST4 of the power transistors Q1, Q4 and the mirror clamp gate terminals MGT1, MGT4 and the mirror clamp source terminals MST1, MST4.

The active mirror clamp transistors QM1, QM4 are used in order to shorten the sate short circuit path of the power transistors Q1, Q4, and thereby reduce the gate inductance. When the active mirror clamp transistors QM1, QM4 are build in the power module, the short circuit path is further shorter as compared with the case of being installed outside the power module, and therefore the suppression effect of the malfunction becomes higher.

Although the example of using the bonding wires for the connected conductors MSW1, MSW4 and the connected conductors MGW1, MGW4 is shown in the example shown in FIG. 10, leadframes may be used therefor instead of the bonding wires.

[Fifth Embodiment]

Figure 13:
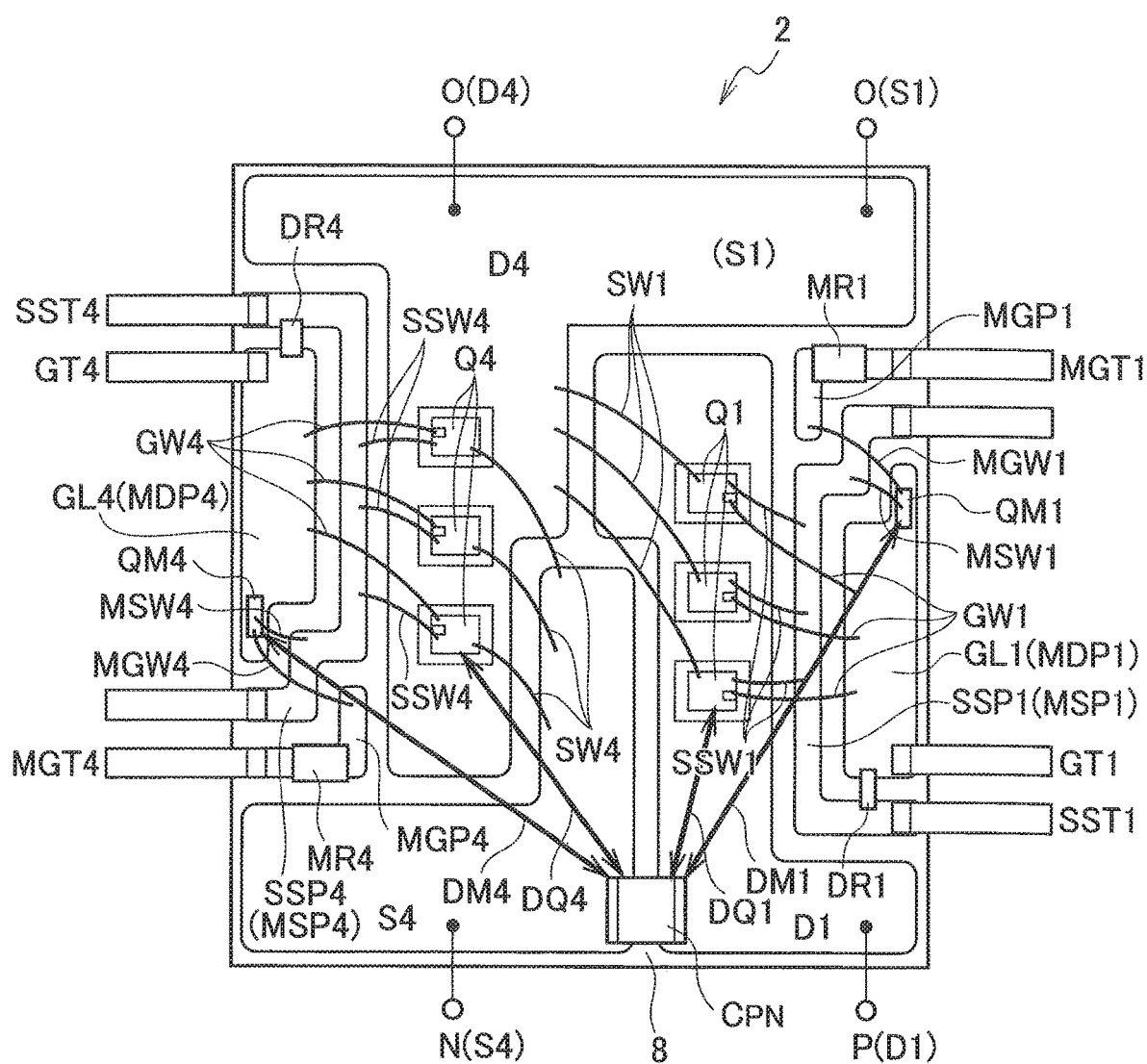
FIG. 13 is a schematic planar pattern configuration diagram showing a power module according to a fifth embodiment.
Figure 14:
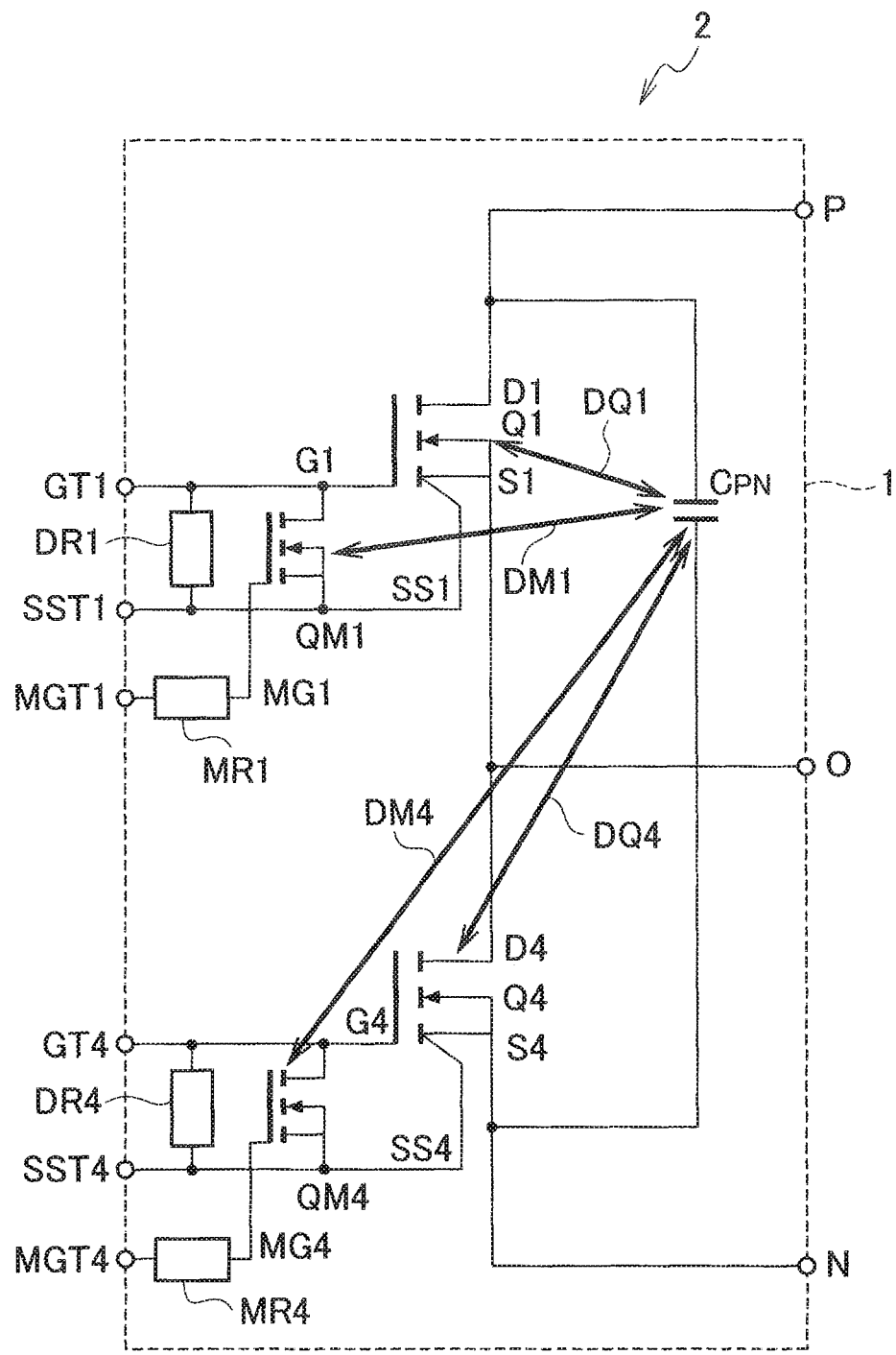
FIG. 14 is a disposition explanatory diagram on a circuit configuration of the power module according to the fifth embodiment.

FIG. 13 shows a schematic planar pattern configuration of the power module 2 according to the fifth embodiment, and FIG. 14 shows a disposition explanation on a circuit configuration thereof.

As shown in FIG. 13, the power module 2 according to the fifth embodiment includes a DC link capacitor $C_{PN}$ electrically connected between the positive-side power terminal P and the negative-side power terminal N. As the DC link capacitor $C_{PN}$, the ceramic capacitor or the like can be applied.

As shown in FIGS. 13 and 14, the power module 2 according to the fifth embodiment includes: a positive-side power terminal P and a negative-side power terminal N; a drain pattern D1 connected to the positive-side power terminal P; a source pattern S4 connected to the negative-side power terminal N; and a DC link capacitor $C_{PN}$ disposed between the drain pattern D1 and the source pattern S4, wherein it is disposed so that distances DQ1, DQ4 from a connection unit of the DC capacitor $C_{PN}$ to the first transistors Q1, Q4 are respectively shorter than distances DM1, DM4 from the connection unit of the DC link capacitor $C_{PN}$ to the second transistors QM1, QM4.

In the power module 2 according to the fifth embodiment, the parasitic inductance of the short-circuit current path is reduced and thereby a drain surge voltage can be suppressed. Other configurations are the same as those of the third embodiment.

When the DC clamp capacitor $C_{PN}$ is connected between the positive-side electrode terminal P and the negative-side electrode terminal N, it is disposed so that the distances from the connecting terminal of the DC clamp capacitor $C_{PN}$ to the mirror clamps QM1, QM4 are respectively longer than the distances from the connecting terminal of the DC clamp capacitor $C_{PN}$ to the power circuit transistor Q1, Q4, and thereby an increase in the inductance of the power circuit can be suppressed.

The reason why the increase in the inductance of the power circuit can be suppressed is as follows. The DC clamp capacitor $C_{PN}$ is disposed in order to suppress the voltage surge between drain and source of the power transistors Q1, Q4 of the power circuit. It is possible to further reduce the parasitic inductance of the power path by being built in the power module 2 rather than being disposed on the outside of the power module 2.

One concern about the active mirror clamp transistors QM1, QM4 built-in the power module 2 is that the installing space of the DC clamp capacitor $C_{PN}$ restricts a conductor width of the power circuit. In particular, if the conductor width of the path into which a large current flows becomes narrow, the inductance of the power circuit is increased and thereby causing an increase in the surge voltage.

Current concentration regions CPP, CPO, $C_{PN}$ where the electric current of the power circuit concentrates, on the conduction patterns are expressed as shown in FIG. 12. If the DC clamp capacitor $C_{PN}$ is connected, the electric current of the power circuit is concentrated on the shortest path of the conductor connecting between connecting ends of the DC clamp capacitor $C_{PN}$. If the active mirror clamps QM1, QM4 are disposed outside the path, even if the conductor width of the path becomes narrow, the current distribution can hardly change and thereby suppressing an increase in the inductance. Therefore, there is provided a limitation that the distances DQ1, DQ4 to the power transistors Q1, Q4 are shorter than the distances DM1, DM4 from the connection unit of the DC clamp capacitor $C_{PN}$ to the active mirror clamp transistors QM1, QM4.

Also in the power module according to the fifth embodiment, in order to suppress the malfunction at the time of switching of the target power transistor, the active mirror clamp transistor is built in the power module, and the active mirror clamp transistor is disposed to form the signal patterns so that the lengths of connected conductors MSW1, MSW4 of the active mirror clamp transistors are respectively equal to or less than the lengths of the conductors MGW1, MGW4.

The active mirror clamp transistor is built in the power module and is disposed in the appropriate position, and thereby the gate inductance of the power transistor can be reduced and the malfunction can be suppressed without increasing the power module size and without increasing the inductance of the power circuit.

Although the example of using the bonding wires for the connected conductors MSW1, MSW4 and the connected conductors MGW1, MGW4 is shown in the example shown in FIG. 13, leadframes may be used therefor instead of the bonding wires.

[Sixth Embodiment]

Figure 15:
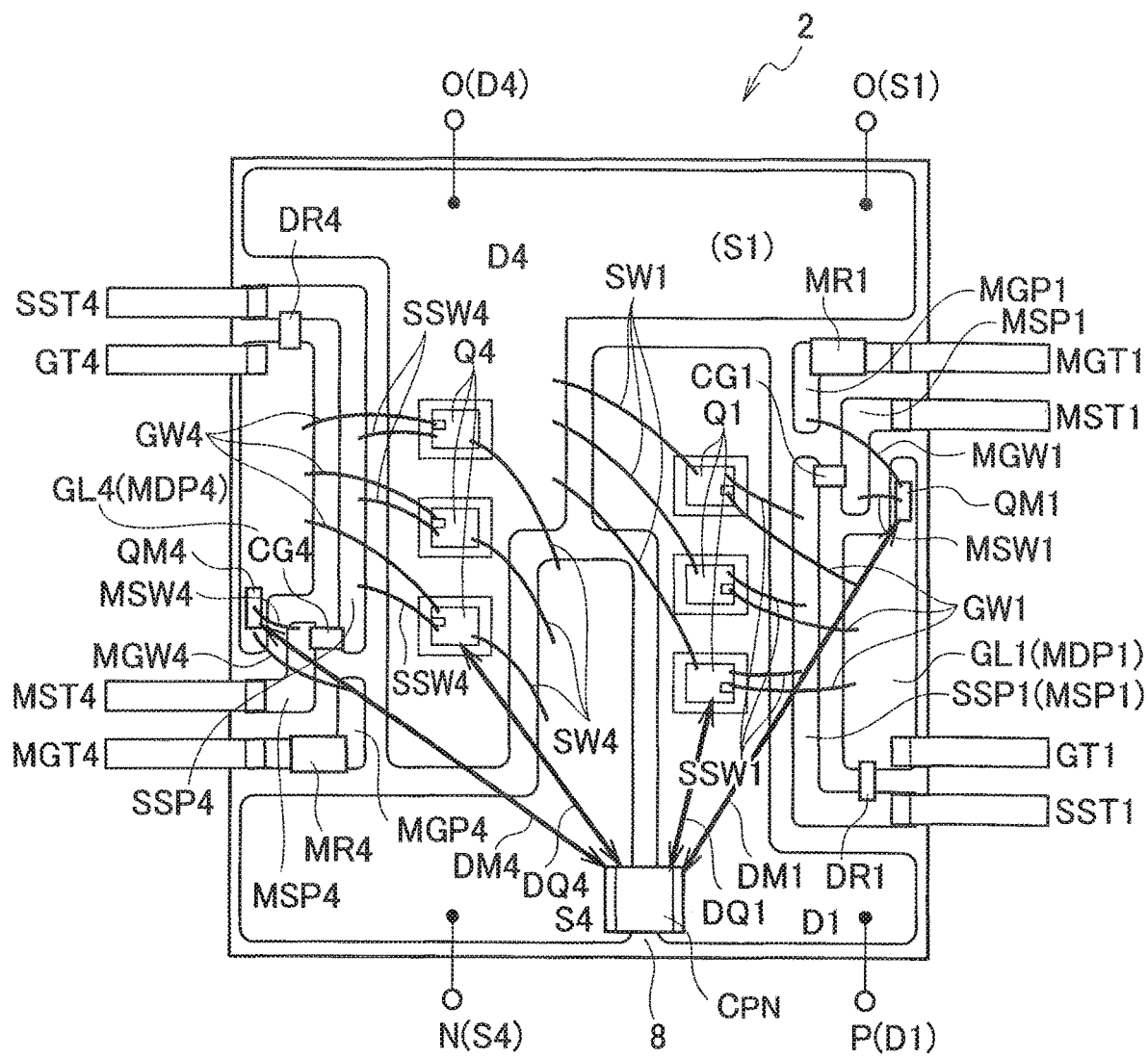
FIG. 15 is a schematic planar pattern configuration diagram showing a power module according to a sixth embodiment.
Figure 16:
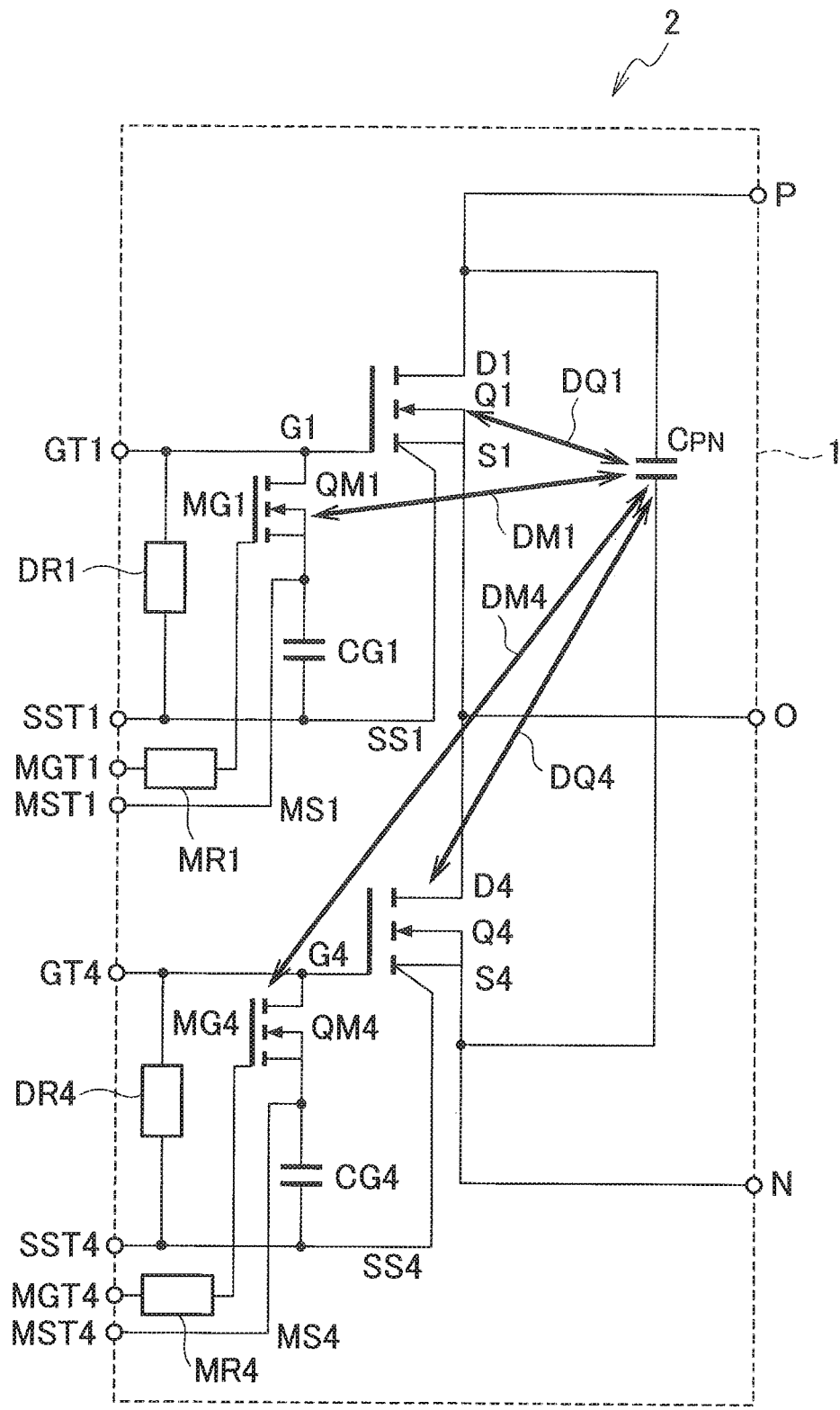
FIG. 16 is a disposition explanatory diagram on a circuit configuration of the power module according to the sixth embodiment.

FIG. 15 shows a schematic planar pattern configuration of the power module 2 according to the sixth embodiment, and FIG. 16 shows a disposition explanation on a circuit configuration thereof.

As shown in FIG. 15, the power module 2 according to the sixth embodiment includes a DC link capacitor $C_{PN}$ electrically connected between the positive-side power terminal P and the negative-side power terminal N. As the DC link capacitor $C_{PN}$, the ceramic capacitor or the like can be applied.

As shown in FIGS. 15 and 16, the power module 2 according to the sixth embodiment includes: a positive-side power terminal P and a negative-side power terminal N; a drain pattern D1 connected to the positive-side power terminal P; a source pattern S4 connected to the negative-side power terminal N; and a DC link capacitor $C_{PN}$ disposed between the drain pattern D1 and the source pattern S4, wherein it is disposed so that distances DQ1, DQ4 from a connection unit of the DC capacitor $C_{PN}$ to the first transistors Q1, Q4 are respectively shorter than distances DM1, DM4 from the connection unit of the DC link capacitor $C_{PN}$ to the second transistors QM1, QM4.

In the power module 2 according to the sixth embodiment, When the DC clamp capacitor $C_{PN}$ is connected between the positive-side electrode terminal P and the negative-side electrode terminal N, it is disposed so that the distances from the connecting terminal of the DC clamp capacitor $C_{PN}$ to the mirror clamps QM1, QM4 are respectively longer than the distances from the connecting terminal of the DC clamp capacitor $C_{PN}$ to the power circuit transistor Q1, Q4, and thereby an increase in the inductance of the power circuit can be suppressed.

In the power module 2 according to the sixth embodiment, the parasitic inductance of the short-circuit current path is suppressed and thereby a drain surge voltage can be reduced.

Furthermore, in the power module 2 according to the sixth embodiment, as shown in FIGS. 15 and 16, each terminal electrode is disposed so that source sense terminals SST1, SST4 are respectively adjacent to the gate terminals GT1, GT4 and the mirror clamp gate terminals MGT1, MGT4 are respectively adjacent to the mirror clamp source terminals MST1, MST4. Each terminal electrode is disposed so that source sense terminals SST1, SST4 are respectively adjacent to the gate terminals GT1, GT4 and the mirror clamp gate terminals MGT1, MGT4 are respectively adjacent to the mirror clamp source terminals MST1, MST4; and thereby the parasitic inductance of both terminals can be reduced, the gate inductance of the power transistors Q1, Q4 can also reduced. There is no particular limitation on the disposition order of the signal terminals.

Each terminal electrode is disposed so that source sense terminals SST1, SST4 are respectively adjacent to the gate terminals GT1, GT4 and the mirror clamp gate terminals MGT1, MGT4 are respectively adjacent to the mirror clamp source terminals MST1, MST4; and thereby the inductance during the electric current passing through these terminals can further be reduced. If the active mirror clamp transistor is built-in, such an inductance does not affect the malfunction of the power transistor, but is one of the factors for determining the switching speed at turn-on.

Since the mirror clamp gate terminals MGT1, MGT4 are respectively adjacent to the mirror clamp source terminals MST1, MST4, the parasitic inductance of both terminals can be reduced as mentioned above, consequently, the gate surge voltage of the active mirror clamp transistor can be suppressed.

The reason why the parasitic inductance of both terminals is reduced by disposing the source sense terminals SST1, SST4 respectively adjacent to the gate terminals GT1, GT4 is that the area of a loop formed by the electric current passes along both terminals is smaller when being disposed to be adjacent to each other rather than when being disposed apart from each other. Other configurations are the same as those of the fourth embodiment.

Also in the power module according to the sixth embodiment, in order to suppress the malfunction at the time of switching of the target power transistor, the active mirror clamp transistor is built in the power module, and the active mirror clamp transistor is disposed to form the signal patterns so that the lengths of connected conductors MSW1, MSW4 of the active mirror clamp transistor QM are respectively equal to or less than the lengths of the conductors MGW1, MGW4.

The active mirror clamp transistor is built in the power module and is disposed in the appropriate position, and thereby the gate inductance of the power transistor can be reduced and the malfunction can be suppressed without increasing the power module size and without increasing the inductance of the power circuit.

Although the example of using the bonding wires for the connected conductors MSW1, MSW4 and the connected conductors MGW1, MGW4 is shown in the example shown in FIG. 15, leadframes may be used therefor instead of the bonding wires.

[Seventh Embodiment]

Figure 17:
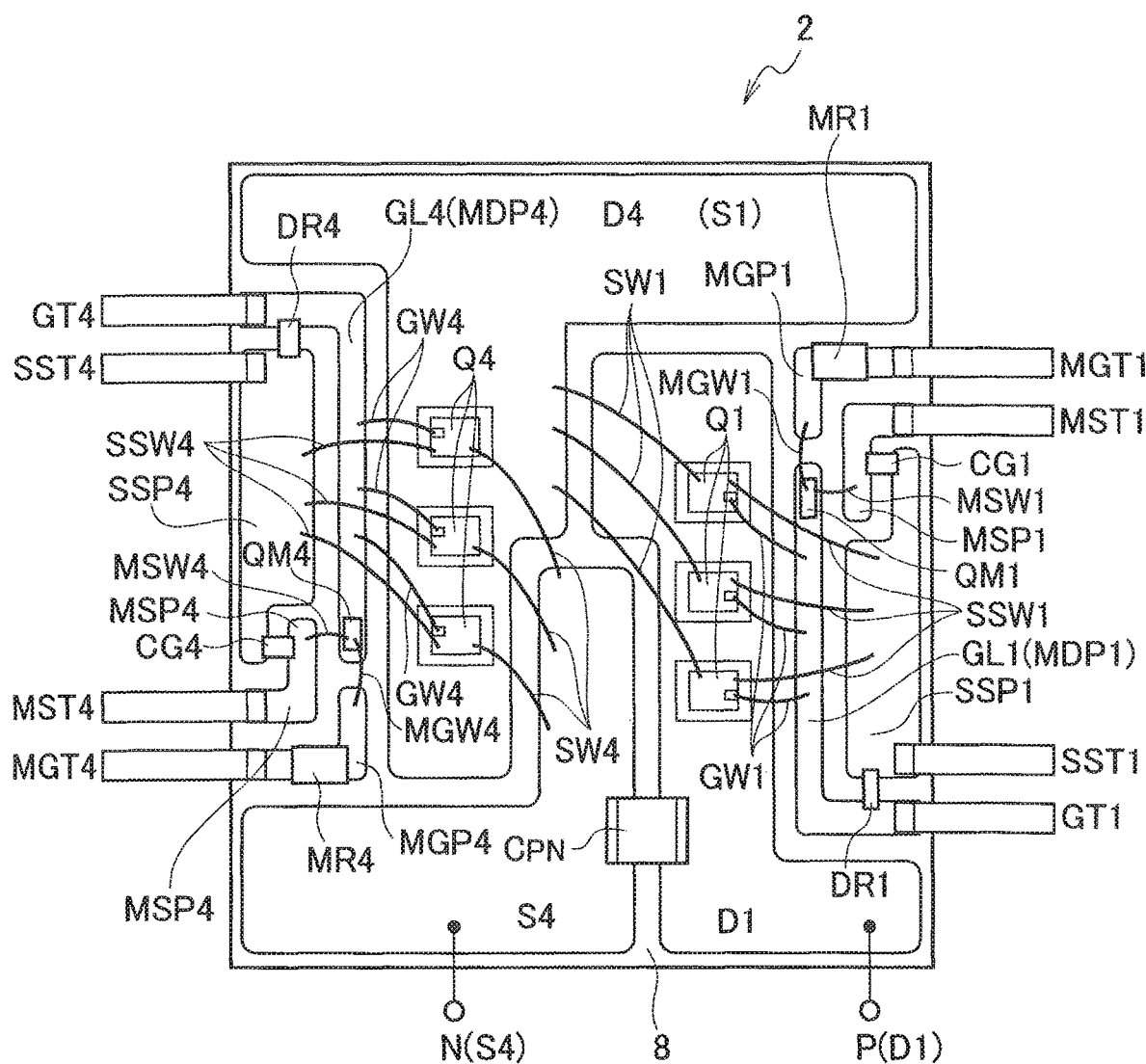
FIG. 17 is a schematic planar pattern configuration diagram showing a power module according to a seventh embodiment.

FIG. 17 shows a schematic planar pattern configuration of a power module 2 according to the seventh embodiment. A circuit configuration of the power module corresponding to FIG. 17 is similarly shown as FIG. 9. In the power module 2 according to the seventh embodiment, an example of expressing a module layout example in the various order of terminal disposition, and an example in which the disposition of signal terminals is GT1-SST1, MST1-MGT1, GT4-SST4, MST4-MGT4, for example, is shown. There is no particular limitation on the disposition order of the signal terminals.

Figure 26C:
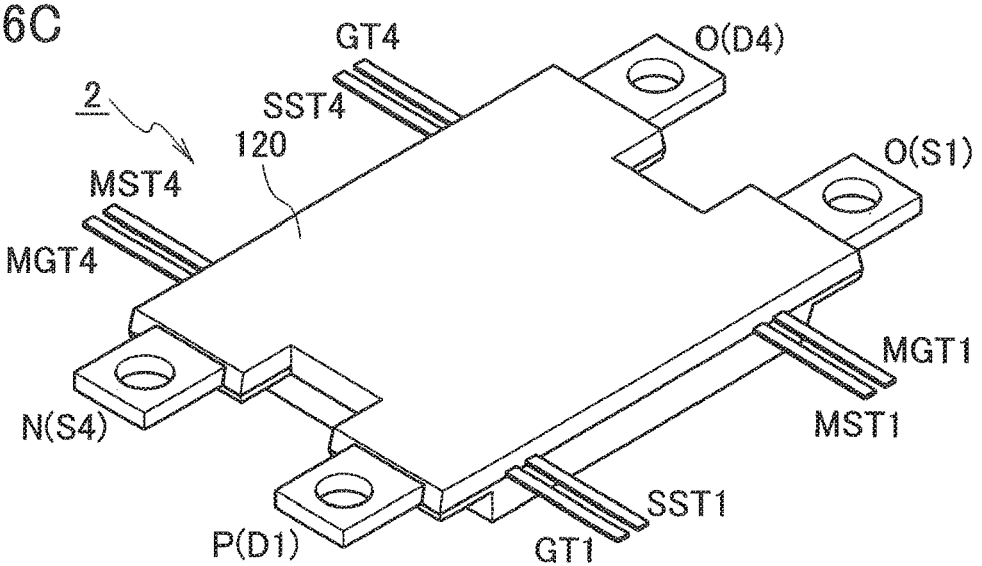
FIG. 26C is a schematic bird's-eye view configuration diagram after forming the resin layer on the power module according to the seventh embodiment.

FIG. 17 shows a schematic planar pattern configuration before forming a resin layer 120 in a module with the built-in half-bridge, as the power module 2 according to the seventh embodiment, and FIG. 26C shows a schematic bird's-eye view configuration after forming the resin layer 120.

The power module 2 according to the seventh embodiment includes a configuration of a module with the built-in half-bridge, and two sets of power transistors Q1, Q4 (e.g., SiC MOSFETs) are built in one module. FIG. 17 shows an example in which 3 chips of the power transistors Q1, Q4 are respectively disposed in parallel to one another.

As shown in FIGS. 17 and 26C, the power module 2 according to the seventh embodiment includes: a positive-side power terminal P and a negative-side power terminal N disposed at a first side of the ceramic substrate 8; a gate terminal GT1, a source sense terminal SST1 and a mirror clamp source terminal MST1, mirror clamp gate terminal MGT1 disposed at a second side which is adjacent to the first side; output terminals O (D4) and O (S1) disposed at a third side opposite to the first side; and a gate terminal GT4, a source sense terminal SST4 and a mirror clamp source terminal MST4, a mirror clamp gate terminal MGT4 disposed at a fourth side opposite to the second side.

Moreover, the power transistors Q1, Q4 are respectively disposed face up on drain patterns D1 and D4 disposed on the ceramics substrate 8, and the mirror clamp transistors QM1, QM4 are respectively disposed face up on the mirror clamp drain patterns MDP1, MDP4 disposed on the ceramics substrate 8.

In this context, the gate terminal GT1 and the source sense terminal SST1 are respectively connected to a gate signal wiring pattern GL1 (MDP1) and a source signal wiring pattern SSP1 of the power transistor Q1 (MSP1), and the gate terminal GT4 and the source sense terminal SST4 are respectively connected to a gate signal wiring pattern GL4 (MDP4) and a source signal wiring pattern SSP4 in the power transistor Q4 (MSP4).

As shown in FIG. 17, from the power transistors Q1, Q4, source wires SW1, SW4 are respectively connected toward the drain pattern D4 (S1) and the source pattern S4 disposed on the ceramics substrate 8, gate wires GW1, GW4 are respectively connected toward the gate signal wiring patterns GL1, GL4, and source sense wires SSW1, SSW4 are respectively connected toward the source signal wiring patterns SSP1, SSP4.

Similarly, as shown in FIG. 17, from the mirror clamp transistors QM1, QM4, the mirror clamp source wires MSW1, MSW4 are respectively connected toward the mirror clamp source patterns MSP1, MSP4, and the mirror clamp gate wires MGW1, MGW4 are respectively connected toward the mirror clamp gate signal wiring patterns MGP1, MGP4.

Moreover, the source signal wiring patterns SSP1, SSP4 is respectively connected to the mirror clamp source patterns MSP1, MSP4 through negative bias applying capacitors CG1, CG4.

Moreover, the gate terminals GT1, GT4 for external extraction are respectively connected to the gate signal wiring patterns GL1, GL4 by soldering or the like, the source sense terminals SST1 and SST4 for external extraction are respectively connected to the source sense signal wiring patterns SSP1, SSP4 by soldering or the like, and the mirror clamp source terminals MST1, MST4 for external extraction are respectively connected to the mirror clamp source patterns MSP1, MSP4 by soldering or the like.

Moreover, the mirror clamp gate terminals MGT1, MGT4 are respectively connected to the mirror clamp gate signal wiring patterns MGP1, MGP4 through the mirror clamp gate resistors MR1, MR4.

Moreover, resistors DR1 and DR4 for electric discharge are respectively connected between the gate signal wiring patterns GL1, GL4 and the source signal wiring patterns SSP1, SSP4.

As shown in FIG. 17, the power module 2 according to the seventh embodiment includes: a positive-side power terminal P and a negative-side power terminal N; a drain pattern D1 connected to the positive-side power terminal P; a source pattern S4 connected to the negative-side power terminal N; and a DC link capacitor $C_{PN}$ disposed between the drain pattern D1 and the source pattern S4. As the DC link capacitor $C_{PN}$, the ceramic capacitor or the like can be applied.

As shown in FIG. 17, the power module 2 according to the seventh embodiment includes at least: mirror clamp source patterns MSP1, MSP4 respectively connected to mirror clamp sources MS1, MS4 of active mirror clamp transistors QM1, QM4; negative bias applying capacitors CG1, CG4 respectively disposed between source signal wiring patterns SSP1, SSP4 and the mirror clamp source patterns MSP1, MSP4; gate signal wiring patterns GL1, GL4 respectively connected to gates G1, G4 of power transistors Q1, Q4; gate terminals GT1, GT4 respectively connected to the gate signal wiring patterns GL1, GL4; source sense terminals SST1, SST4 respectively connected to the source signal wiring patterns SSP1, SSP4; mirror clamp gate terminals MGT1, MGT4 respectively connected to mirror clamp gate signal wiring patterns MGP1, MGP4; and mirror clamp source terminals MST1, MST4 respectively connected to the source signal wiring patterns MSP1, MSP4. In this context, one ends of the connected conductors MSW1, MSW4 are respectively connected to the source signal wiring patterns SSP1, SSP4 through the negative bias applying capacitors CG1, CG4. In this context, lengths of the connected conductors MSW1, MSW4 are respectively equal to or less than lengths of the connected conductors MGW1, MGW4. Other configurations are the same as those of the fourth embodiment shown in FIG. 10.

In the power module according to the seventh embodiment, in order to suppress the malfunction at the time of switching of the target power transistor, the active mirror clamp transistor is built in the power module, and the active mirror clamp transistor is disposed to form the signal patterns so that the lengths of connected conductors MSW1, MSW4 of the active mirror clamp transistors are respectively equal to or less than the lengths of the conductors MGW1, MGW4.

The active mirror clamp transistor is built in the power module and is disposed in the appropriate position, and thereby the gate inductance of the power transistor can be reduced and the malfunction can be suppressed without increasing the power module size and without increasing the inductance of the power circuit.

Although the example of using the bonding wires for the connected conductors MSW1, MSW4 and the connected conductors MGW1, MGW4 is shown in the example shown in FIG. 17, leadframes may be used therefor instead of the bonding wires.

[Eighth Embodiment]

Figure 18:
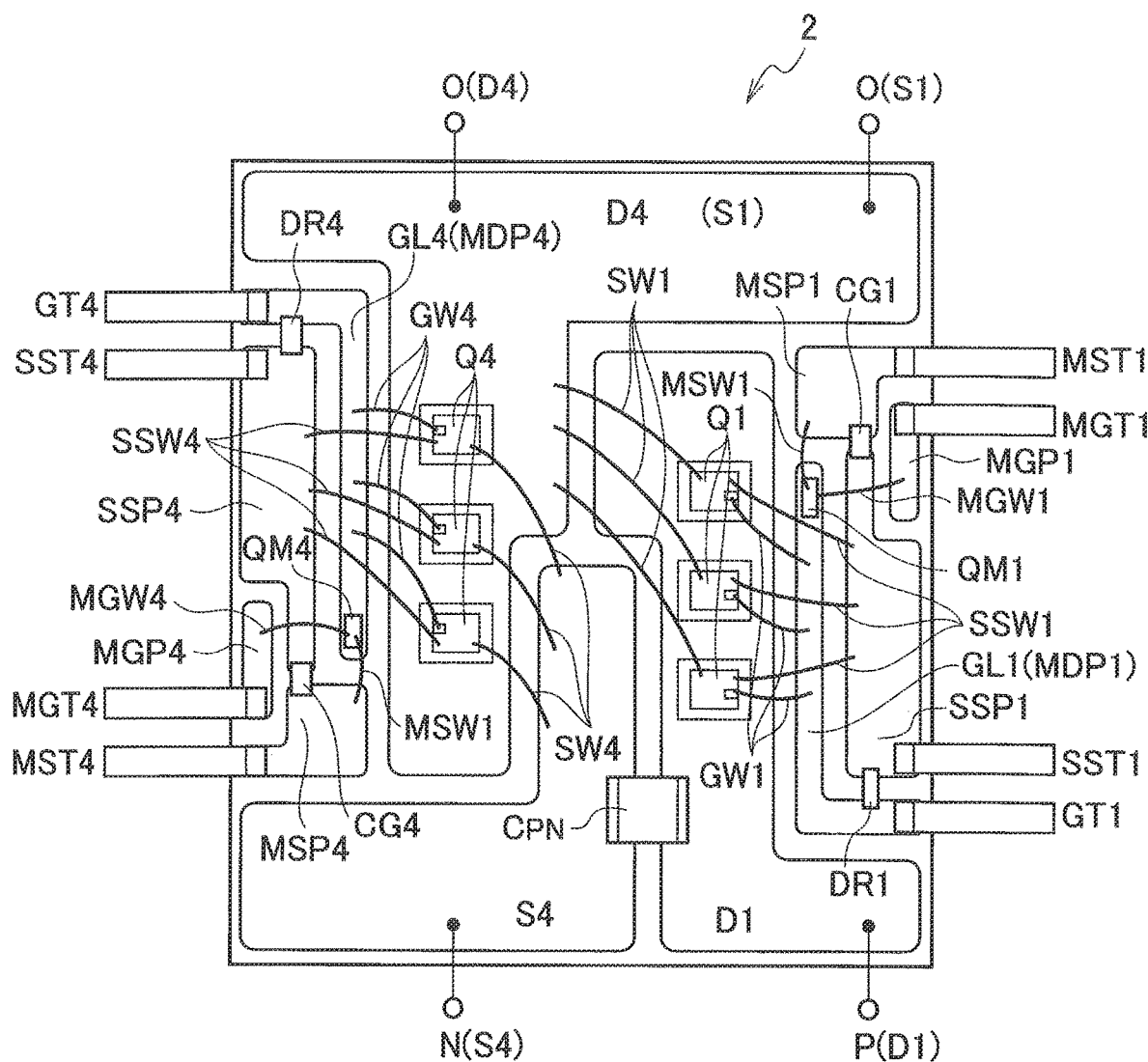
FIG. 18 is a schematic planar pattern configuration diagram showing a power module according to a eighth embodiment.

FIG. 18 shows a schematic planar pattern configuration of a power module 2 according to the eighth embodiment. In the power module 2 according to the eighth embodiment, an example of expressing a module layout example in the various order of terminal disposition, and an example in which the disposition of signal terminals is GT1-SST1, MGT1-MST1, GT4-SST4, MGT4-MST4, for example, is shown. There is no particular limitation on the disposition order of the signal terminals.

FIG. 18 shows a schematic planar pattern configuration before forming a resin layer 120 in a module with the built-in half-bridge, as the power module 2 according to the eighth embodiment, and the schematic bird's-eye view configuration after forming the resin layer 120 shown in FIG. 26C includes a configuration in which disposition of MST1-MGT1 and MST4-MGT4 instead of the disposition of MGT1-MST1 and MGT4-MST4.

The power module 2 according to the eighth embodiment includes: a positive-side power terminal P and a negative-side power terminal N disposed at a first side of the ceramic substrate 8; a gate terminal GT1, a source sense terminal SST1, and a mirror clamp gate terminal MGT1, a mirror clamp source terminal MST1 disposed at a second side adjacent to the first side; output terminals O (D4) and O (S1) disposed at a third side opposite to the first side; and a gate terminal GT4, a source sense terminal SST4, and a mirror clamp gate terminal MGT4, a mirror clamp source terminal MST4 disposed at a fourth side opposite to the second side.

Moreover, the power transistors Q1, Q4 are respectively disposed face up on drain patterns D1 and D4 disposed on the ceramics substrate 8, and the mirror clamp transistors QM1, QM4 are respectively disposed face up on the mirror clamp drain patterns MDP1, MDP4 disposed on the ceramics substrate 8.

Moreover, the power module 2 according to the eighth embodiment includes a DC link capacitor $C_{PN}$ disposed between the drain pattern D1 connected to the positive-side power terminal P and the source patterns S4 connected to the negative-side power terminal N, as shown in FIG. 18. As the DC link capacitor $C_{PN}$, the ceramic capacitor or the like can be applied.

As shown in FIG. 18, the gate terminal GT1 and the source sense terminal SST1 are respectively connected to a gate signal wiring pattern GL1 (MDP1) and a source signal wiring pattern SSP1 of the power transistor Q1 (MSP1), and the gate terminal GT4 and the source sense terminal SST4 are respectively connected to a gate signal wiring pattern GL4 (MDP4) and a source signal wiring pattern SSP4 in the power transistor Q4 (MSP4).

As shown in FIG. 18, from the power transistors Q1, Q4, source wires SW1, SW4 are respectively connected toward the drain pattern D4 (S1) and the source pattern S4, gate wires GW1, GW4 are respectively connected toward the gate signal wiring patterns GL1, GL4, and source sense wires SSW1, SSW4 are respectively connected toward the source signal wiring patterns SSP1, SSP4.

Similarly, as shown in FIG. 18, from the mirror clamp transistors QM1, QM4, the mirror clamp source wires MSW1, MSW4 are respectively connected toward the mirror clamp source patterns MSP1, MSP4, and the mirror clamp gate wires MGW1, MGW4 are respectively connected toward the mirror clamp gate signal wiring patterns MGP1, MGP4.

Moreover, the source signal wiring patterns SSP1, SSP4 is respectively connected to the mirror clamp source patterns MSP1, MSP4 through negative bias applying capacitors CG1, CG4.

Moreover, the gate terminals GT1, GT4 for external extraction are respectively connected to the gate signal wiring patterns GL1, GL4 by soldering or the like, and the source sense terminals SST1 and SST4 for external extraction are respectively connected to the source signal wiring patterns SSP1, SSP4 by soldering or the like, and the mirror clamp source terminals MST1, MST4 for external extraction are respectively connected to the mirror clamp source patterns MSP1, MSP4 by soldering or the like.

Moreover, resistors DR1 and DR4 for electric discharge are respectively connected between the gate signal wiring patterns GL1, GL4 and the source signal wiring patterns SSP1, SSP4.

In addition, mirror clamp resistors MR1, MR4 (not illustrated) may respectively be externally connected to the mirror clamp gate terminals MGT1, MGT4. Other configurations are the same as those of the seventh embodiment.

In the power module according to the eighth embodiment, in order to suppress the malfunction at the time of switching of the target power transistor, the active mirror clamp transistor is built in the power module, and the active mirror clamp transistor is disposed to form the signal patterns so that the lengths of connected conductors MSW1, MSW4 of the active mirror clamp transistors are respectively equal to or less than the lengths of the conductors MGW1, MGW4.

The active mirror clamp transistor is built in the power module and is disposed in the appropriate position, and thereby the gate inductance of the power transistor can be reduced and the malfunction can be suppressed without increasing the power module size and without increasing the inductance of the power circuit.

Although the example of using the bonding wires for the connected conductors MSW1, MSW4 and the connected conductors MGW1, MGW4 is shown in the example shown in FIG. 18, leadframes may be used therefor instead of the bonding wires.

(Gate Drive Circuit)

Figure 19:
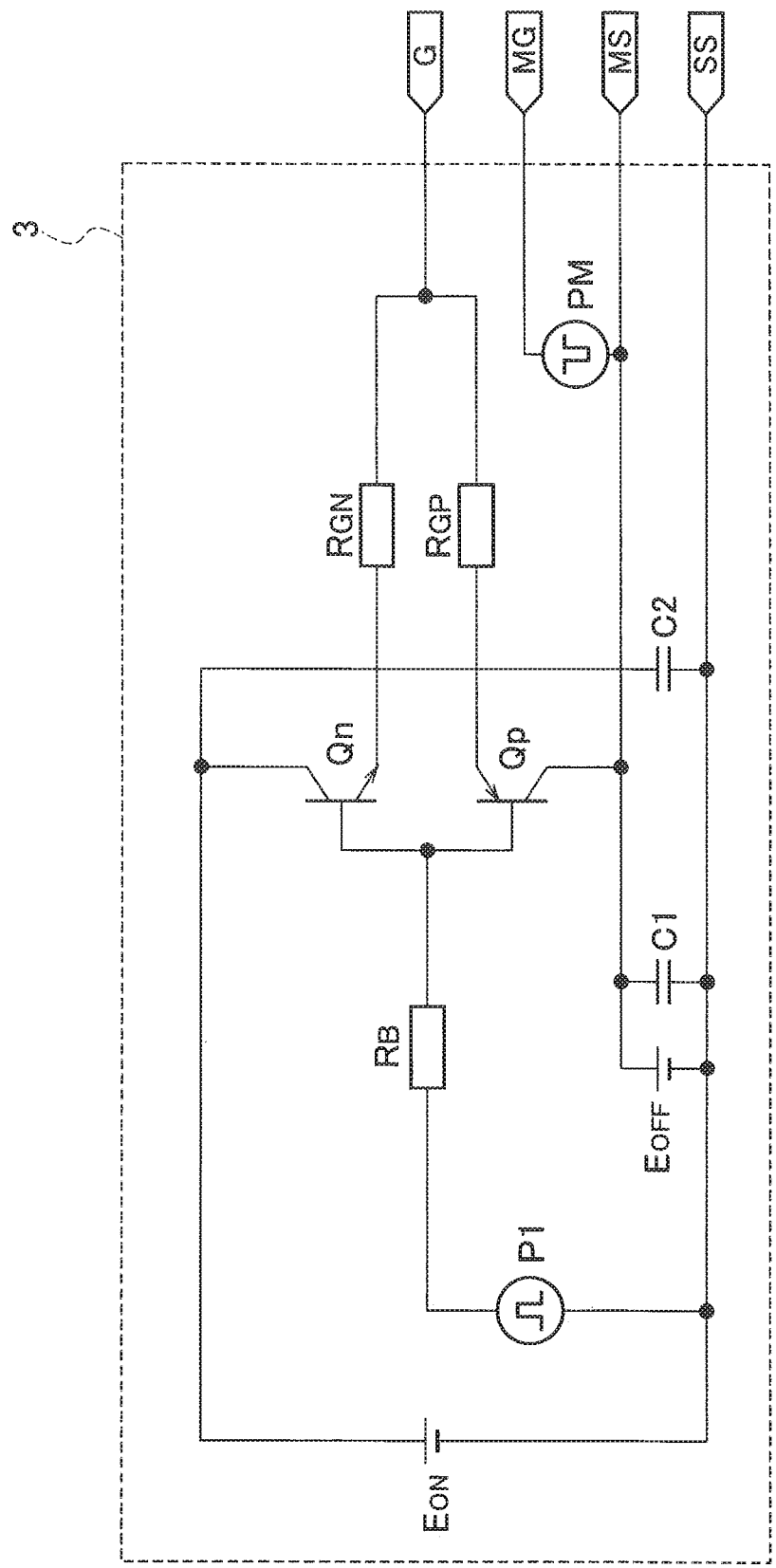
FIG. 19 shows a configuration example of a gate drive circuit applicable to the power module according to the embodiments.

FIG. 19 shows a configuration example of a gate drive circuit 3 applicable to the power module 2 according to the embodiments. As shown in FIG. 19, the gate drive circuit 3 uses a push pull circuit composed by including a pnp transistor $Q_p$/a npn transistor $Q_n$ in order to amplify the gate input signal. The gate drive circuit 3 includes a npn transistor $Q_n$ connected between a power supply $E_{ON}$ for generating turn-on voltage and a gate terminal G, and a pnp transistor $Q_p$ connected between the gate terminal G and a mirror clamp source terminal MS.

If a gate input signal pulse voltage P1 is applied to the npn transistor $Q_n$ and the pnp transistor $Q_p$ through a base resistance $R_B$, a positive pulse voltage is supplied to the gate terminal G through the npn transistor $Q_n$ and a gate resistance RGN from the power supply $E_{ON}$ for generating turn-on voltage, and the power transistor Q1 is driven to ON.

If the gate input signal pulse voltage P1 becomes 0, the pnp transistor $Q_p$ is turned ON, the negative pulse voltage is supplied to the gate terminal G through the pnp transistor $Q_p$ and the gate resistance $R_{GP}$ from a power supply $E_{OFF}$ for generating turning-off voltage, and the power transistor Q1 is driven to OFF. If a gate input signal pulse voltage PM for mirror clamp is applied between the mirror clamp gate MG and the mirror clamp source MS at the time when the voltage between the gate and the source of the power transistor Q1 becomes equal to or less than the predetermined value, the short circuit path inductance between the gate and the source at the time of the power transistor Q1 turning-off can be reduced.

In FIG. 19, reference sign C1 denotes a charging capacitor of the power supply $E_{OFF}$ for generating turning-off voltage, and reference sign C2 denotes a charging capacitor of the power supply $E_{ON}$ for generating turn-on voltage.

(Inductance of Power Circuit, and Gate Inductance of Power Transistor)

Figure 20A:
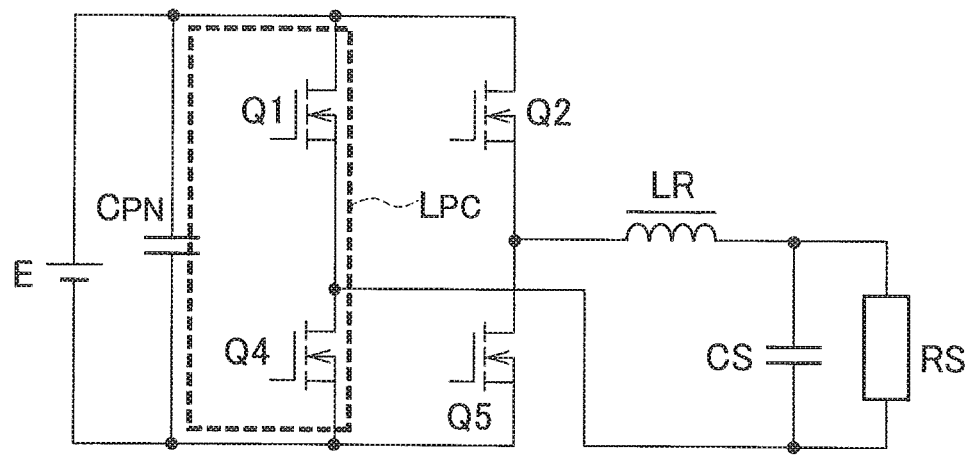
FIG. 20A is an explanatory diagram showing an inductance of a power circuit.

FIG. 20A shows an explanatory diagram of an inductance $L_{PC}$ of the power circuit, in the power module 2 according to the embodiments. FIG. 20A shows the example of the power circuit having a full bridge configuration. As shown in FIG. 20A, the inductance $L_{PC}$ of the power circuit expresses an inductance of a loop path composed by including: power transistors Q1, Q4 having the half bridge configuration connected between the voltages E; and a DC link capacitor $C_{PN}$ connected in parallel to the power transistors Q1, Q4. In FIG. 20A, reference sign LR denotes a smoothing reactor, reference sign CS denotes an output capacitor, and reference sign RS denotes a resistance load.

Figure 20B:
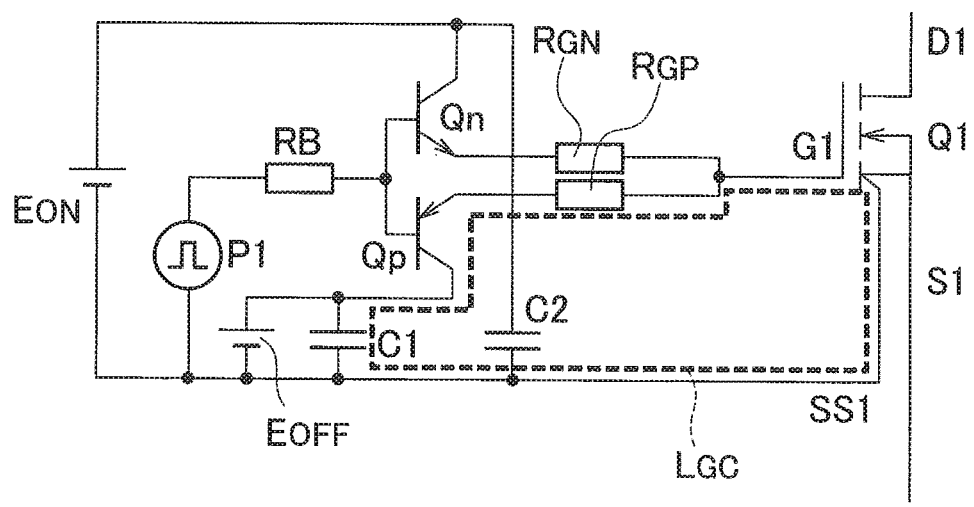
FIG. 20B is an explanatory diagram showing a gate inductance of a semiconductor element.

FIG. 20B shows an explanatory diagram of a gate inductance $L_{GC}$ of the power transistor Q1. As shown in FIG. 20B, the gate inductance $L_{GC}$ of the power transistor Q1 expresses an inductance of a loop path formed between the gate G1 and the source sense SS1 of the power transistor Q1. More specifically, the gate inductance $L_{GC}$ of the power transistor Q1 expresses the inductance of the loop path composed by including the gate G1, the gate resistance $R_{GP}$, transistor $Q_p$, the capacitor C1 of the power transistor Q1, and the source sense SS1 of the power transistor Q1, as shown in FIG. 20B.

In the power module 2 according to the embodiments, the inductance $L_{PC}$ of the power circuit and the gate inductance $L_{GC}$ of the semiconductor element respectively correspond to the inductances of the paths respectively shown in FIGS. 20A and 20B.

In the power module 2 according to the embodiments, the active mirror clamp transistor QM is built in the power module and is disposed in the appropriate position, and thereby the gate inductance $L_{GC}$ of the power transistor can be reduced and the malfunction can be suppressed without increasing the power module size and without increasing the inductance $L_{PC}$ of the power circuit.

(Prevention from Malfunction by Active Mirror Clamp)

Figure 21A:
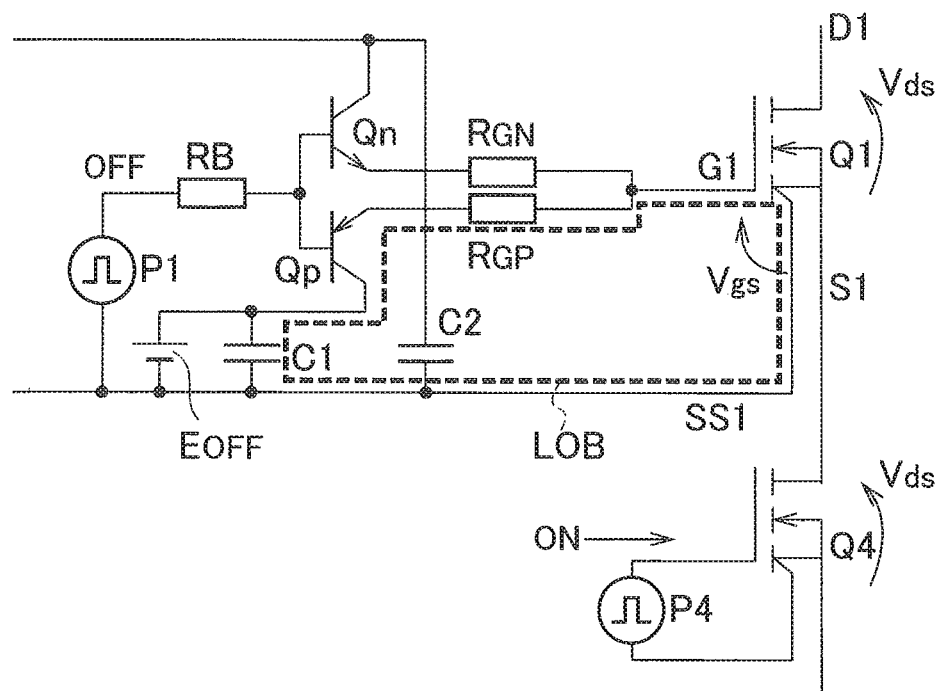
FIG. 21A is an explanatory diagram of a malfunction at the time of a MOS bridge operation.
Figure 21B:
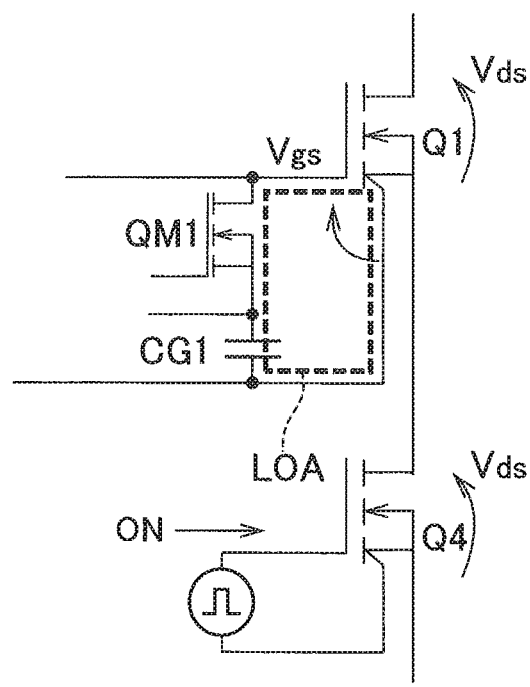
FIG. 21B is an explanatory diagram of prevention from the malfunction by an active mirror clamp in the power module according to the embodiments.

FIG. 21A shows an explanatory diagram of a malfunction at the time of a MOS bridge operation, and FIG. 21B shows an explanatory diagram of prevention from the malfunction by the active mirror clamp, in the power module according to the embodiments.

In the MOS bridge, if the power transistor Q4 is turned ON, the voltage $V_{ds}$ between the drain and the source of the power transistor Q4 is decreased, and the voltage $V_{ds}$ between the drain and the source of the power transistor Q1 is increased. On the other hand, since an impedance of a closed loop path LOB between the gate and the source of the transistor Q1 including the gate drive circuit is in a high impedance state, a value of the voltage $V_{gs}$ between the gate and the source of the power transistor Q1 is increased, and thereby a malfunction of the MOS bridge is caused due to erroneous turning-on of the power transistor Q1.

In the power module according to the embodiments, if the power transistor Q4 is turned ON, the voltage $V_{ds}$ between the drain and the source of the power transistor Q4 is decreased, and the voltage $V_{ds}$ between the drain and the source of the power transistor Q1 is increased. On the other hand, since the active mirror clamp QM1 is disposed so as to be adjacent between the gate and the source of the power transistor Q1, the impedance of the closed loop path LOA between the gate and the source of the power transistor Q1 including the gate drive circuit is in a low impedance state, and therefore the value of the voltage $V_{gs}$ between the gate and the source of the power transistor Q1 is not easily increased. Accordingly, an erroneous turning-on of the power transistor Q1 can be prevented, and thereby a malfunction of the MOS bridge can be prevented.

Figure 22:
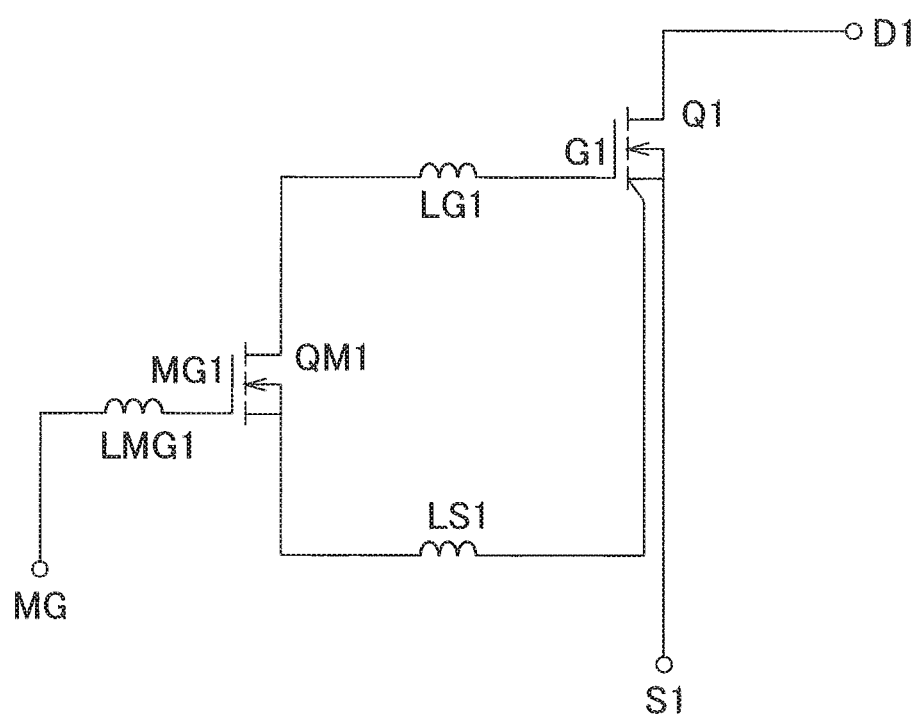
FIG. 22 is an explanatory diagram showing an inductance component in a circuit configuration of a power transistor (SiC MOSFET) and an active mirror clamp transistor, in the power module according to the embodiments.

FIG. 22 schematically shows an explanation an inductance component in the power transistor (SiC MOSFET) Q1 and the circuit configuration of active mirror clamp transistor QM1, in the power module 2 according to the embodiments. In the power module 2 according to the embodiments, the inductance component in the power transistor Q1 and the circuit configuration of the active mirror clamp transistor QM1 can express by a gate inductance LG1, a source inductance LS1, and a gate inductance LMG1 of the active mirror clamp QM1.

In the power module 2 according to the embodiments, the active mirror clamp transistor QM1 is built in the power module and is disposed so as to be near the power transistor Q1, and thereby the gate inductance LG1 and the source inductance LS1 can be reduced without increasing the inductance $L_{PC}$ of the power circuit. Moreover, the gate inductance LMG1 does not affect the inductance in the gate loop.

(Mirror Clamp Built-in Module and Gate Drive Circuit)

Figure 23:
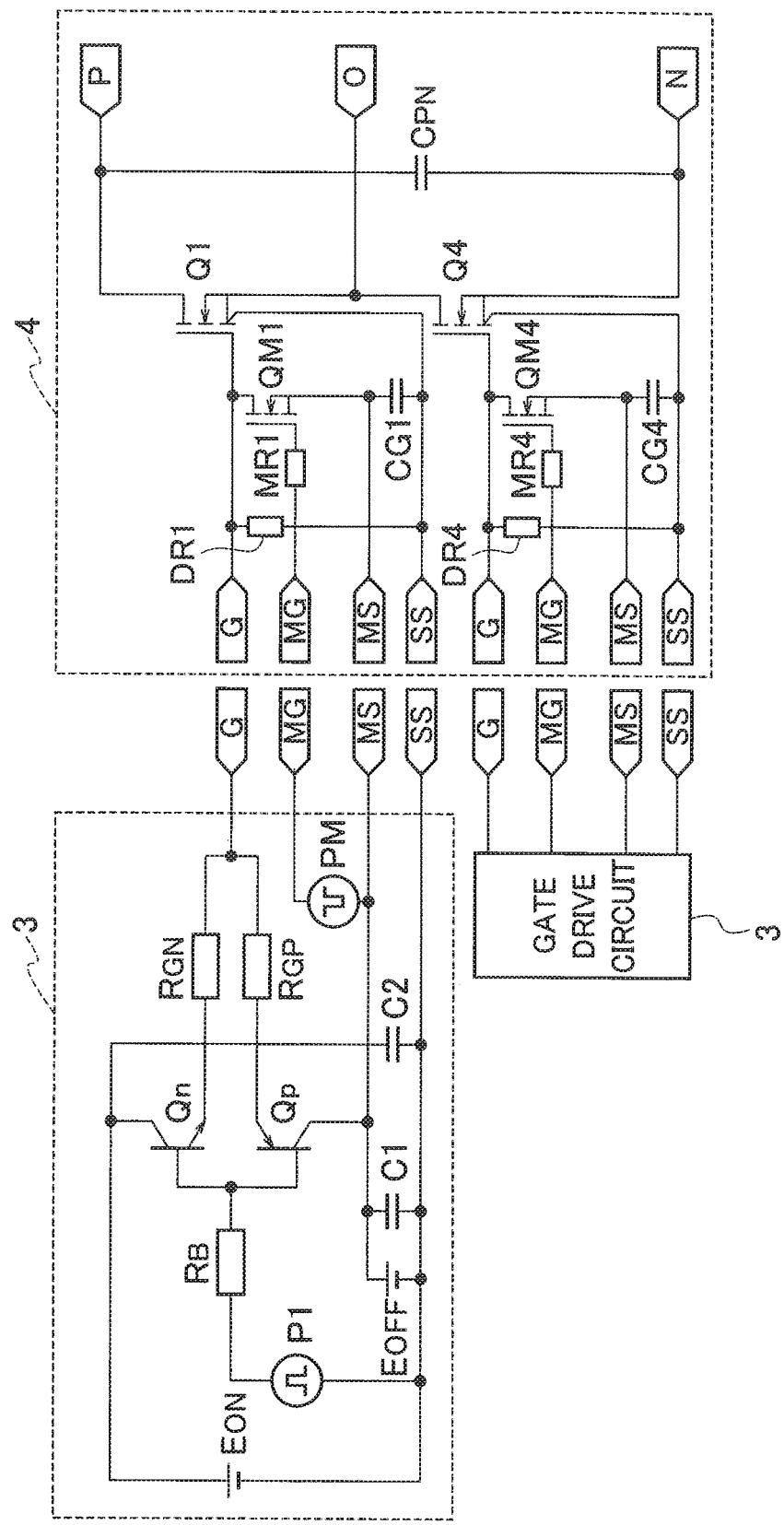
FIG. 23 is a circuit configuration diagram showing a mirror clamp built-in module and a gate drive circuit having a half bridge configuration, in the power module according to the embodiments.

FIG. 23 shows a circuit configuration of a mirror clamp built-in module 4 and a gate drive circuit 3 having a half bridge configuration, in the power module according to the embodiments.

As shown in FIG. 23, the mirror clamp built-in module 4 of the half bridge configuration includes power transistors Q1, Q4, and active mirror clamp transistors QM1, QM4 respectively disposed between the gates and the sources of the power transistors Q1, Q4. Other circuit configurations shown therein are the same as those shown in FIG. 11. The gate drive circuit 3 for driving the power transistors Q1, Q4 includes the same circuit configuration, and includes a similar circuit configuration to FIG. 19.

(Signal Path when Negative Bias Applying Capacitor is Built in, and Signal Path when No Negative Bias Applying Capacitor is Built in)

Figure 24:
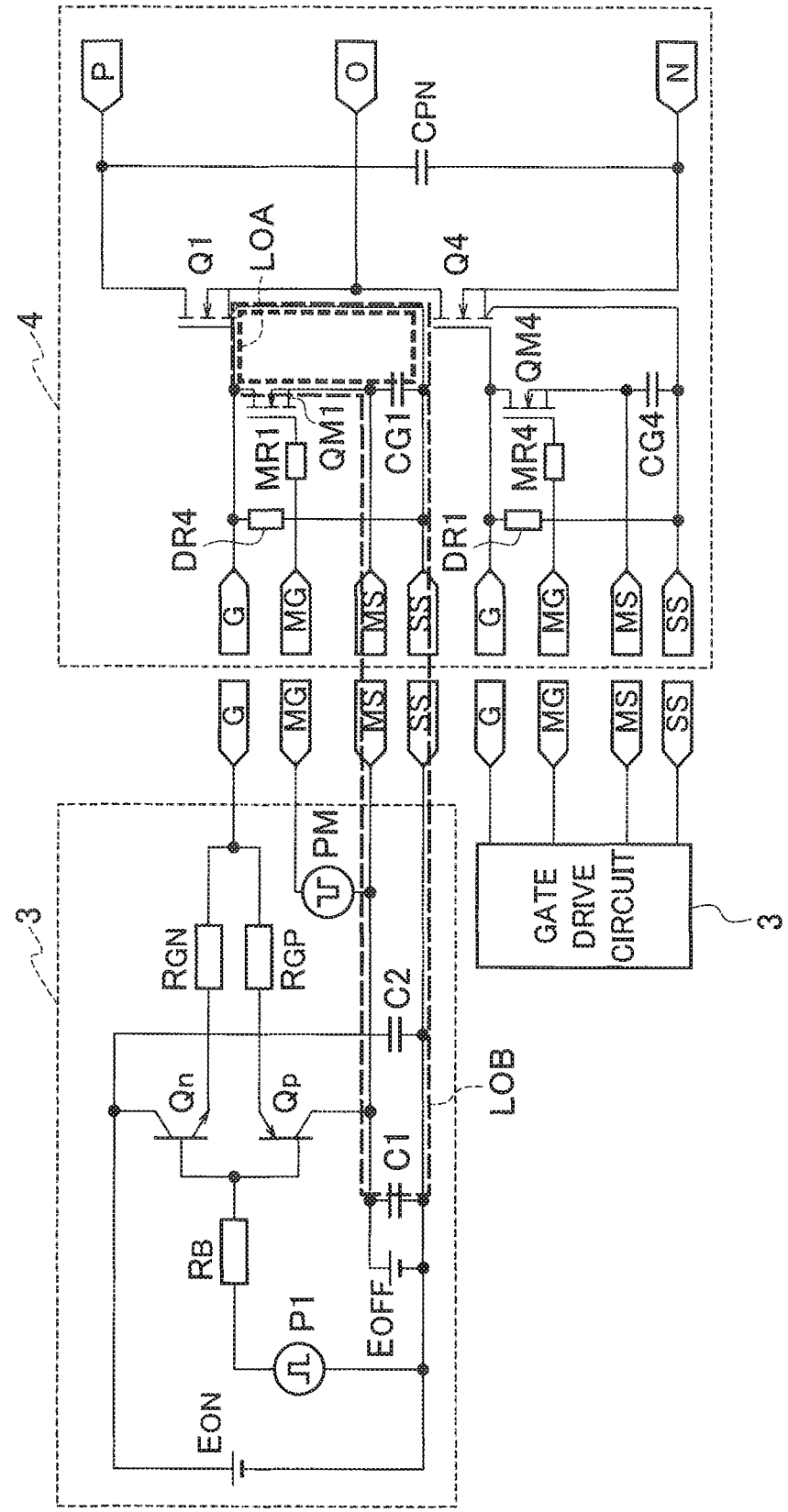
FIG. 24 is an explanatory diagram of signal paths when a negative bias applying capacitor is built in and when the capacitor is not built in, in FIG. 23 (LOA: the case where the negative bias applying capacitor is build in and LOB: the case where no negative bias applying capacitor is built in).

FIG. 24 shows an explanatory diagram of signal paths when a negative bias applying capacitor is built in and when the negative bias applying capacitor is not built in, in FIG. 23. In FIG. 24, reference sign LOA denotes a signal path when a negative bias applying capacitor is built in, and reference sign LOB denotes a signal path when no negative bias applying capacitor is built in.

The reason for respectively disposing the negative bias applying capacitors CG1, CG4 between the mirror clamp sources MS1, MS4 and the source senses SS1, SS4 of the active mirror clamp transistors QM1, QM4 is as follows. In order to suppress erroneous turning-on of the power transistors Q1, Q4, a negative bias may be applied between the gate and the source when the power transistors Q1, Q4 are turned OFF. Using an external power supply, the negative voltage is applied between the mirror clamp sources MS1, MS4 of the active mirror clamp transistors QM1, QM4 and the source senses SS1, SS4 of the power transistors Q1, Q4, as shown in FIG. 24.

If the negative bias applying capacitors CG1, CG4 is not built in near the power transistors Q1, Q4, the signal path between the gate and the source becomes extremely long as the signal path LOB, and the effect of built-in active mirror clamp is lost. The negative bias applying capacitors CG1, CG4 are built in, and the wiring signal patterns capable of voltage application from the external power supply are connected to both ends thereof, and thereby the signal path between the gate and the source can be extremely short as the signal path LOA, and the effect of the built-in active mirror clamp can be realized.

Figure 25:
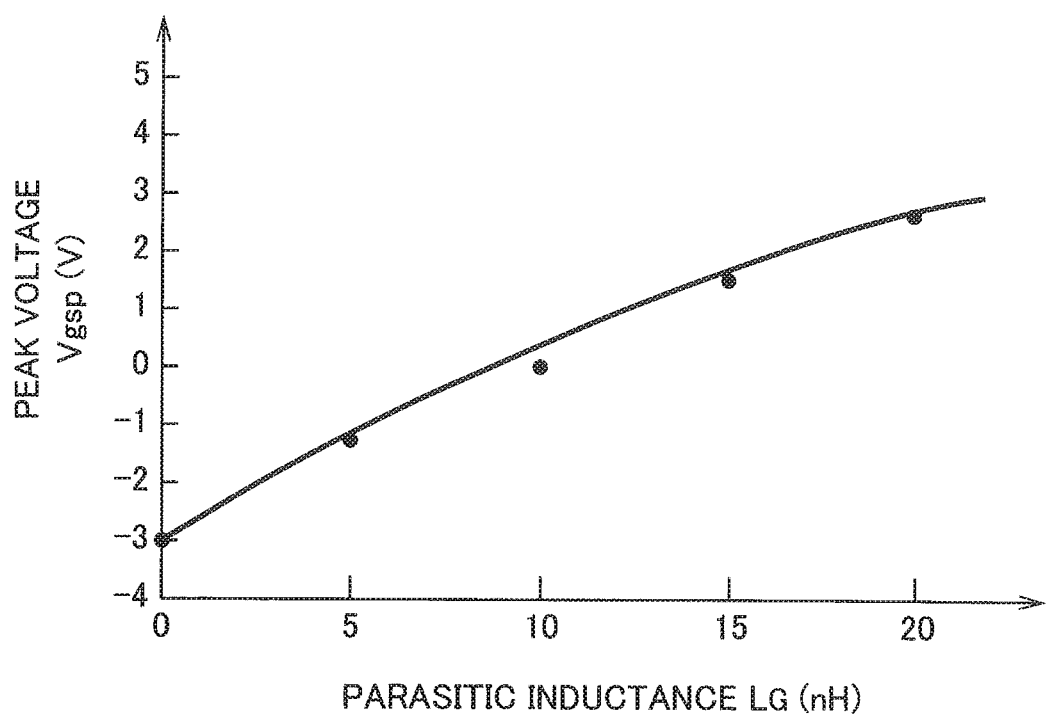
FIG. 25 shows a relationship between a peak voltage Vgsp (V) between gate and source and a parasitic inductance LG (nH) between gate and source, in a simulation result of a reduction effect of a parasitic inductance, in the power module according to the embodiments in which the negative bias applying capacitor is built.

FIG. 25 shows a relationship between a peak voltage Vgsp (V) between gate and source and a parasitic inductance LG (nH) between gate and source, in a simulation result of a reduction effect of a parasitic inductance, in the power module according to the embodiments in which the negative bias applying capacitors CG1, CG4 is built. As embodiments in which the negative bias applying capacitors CG1, CG4 are built in, the second, fourth, sixth, seventh and eighth embodiments are targeted.

FIG. 25 corresponds to a simulation result of the parasitic inductance LG dependency between the gate and the source of the peak voltage Vgsp(V) between the gate and the source.

In the simulation calculation of the parasitic inductance LG, the active mirror clamp transistors QM1, QM4 are assumed to be in the on state. In detail, although the parasitic inductance LG corresponds to a composite value between the inductance of the electrode pattern+bonding wire disposed on the ceramic substrate, it is assumed herein that the inductance component of the bonding wire is larger than the inductance component of the electrode pattern.

(Schematic Bird's-Eye View Configuration after Forming Resin Layer)

FIG. 26A shows a schematic bird's-eye view configuration after forming a resin layer on the power module according to the first embodiment, and FIG. 26B shows a schematic bird's-eye view configuration after forming a resin layer on the power module according to the second embodiment, and FIG. 26C shows a schematic bird's-eye view configuration after forming a resin layer on the power module according to the seventh embodiment. Each corresponds to an outer appearance configuration of a 2-in-1 module. Module layout examples in various orders of terminal disposition are possible, and there is no particular limitation on the disposition order of the signal terminals.

Moreover, transfermold resins, thermosetting resins, etc. applicable to the SiC based semiconductor device can be used as the resin layer 120. Moreover, silicone based resins, e.g. silicone gel, may partially be applied thereto, or case type power modules may be adopted to be applied to the whole thereof.

Although the 1-in-1 module (basic configuration) and the 2-in-1 modules (the first to eighth embodiment) have mainly be explained in the power module 2 according to the embodiments, it is not limited to this example. For example, it is applicable to 4-in-1 module, a 6-in-1 module, a 7-in-1 module in which a snubber capacitor etc. is provided in the 6-in-1 module, an 8-in-1 module, a 12-in-1 module, a 14-in-1 module, and the like.

(Concrete Example of Semiconductor Device)

As the power module according to the embodiments, FIG. 27A shows a schematic circuit representative of an SiC MOSFET of the 1-in-1 module 50, and FIG. 27B shows a schematic circuit representation of IGBT of the 1-in-1 module 50. A diode DI connected in reversely parallel to the MOSFET is shown in FIG. 27A. A main electrode of the MOSFET is expressed with a drain terminal DT and a source terminal ST. Similarly, a diode DI connected in reversely parallel to the IGBT is shown in FIG. 27B. A main electrode of the IGBT is expressed with a collector terminal CT and an emitter terminal ET.

Moreover, FIG. 28 shows a detailed circuit representative of the SiC MOSFET of the 1-in-1 module 50, as the power module according to the embodiments.

In the 1-in-1 module 50, one MOSFET is included in one module, for example. As an example, five chips (MOSFET× 5) can be mounted thereon, and a maximum of five pieces of the MOSFETs respectively can be connected to one another in parallel. Note that it is also possible to mount a part of five pieces of the chips for the diode DI thereon.

More particularly, as shown in FIG. 28, a sense MOSFET Qs is connected to the MOSFET Q in parallel. The sense MOSFET Qs is formed as a minuteness transistor in the same chip as the MOSFET Q. In FIG. 28, reference sign SS denotes a source sense terminal, reference sign CS denotes a current sense terminal, and reference sign G denotes a gate signal terminal. Also in the power module according to the embodiments, the sense MOSFET Qs may be formed as a minuteness transistor in the same chip, in the MOSFET Q.

(Circuit Configuration)

Figure 29A:
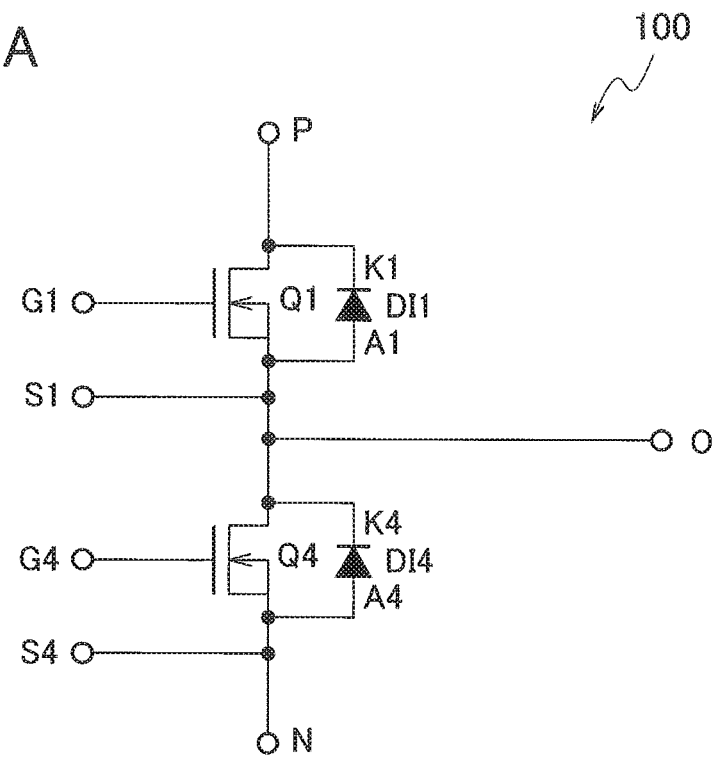
FIG. 29A is a schematic circuit representative diagram of an SiC MOSFET of a 2-in-1 module, which is the power module according to the embodiments.
Figure 29B:
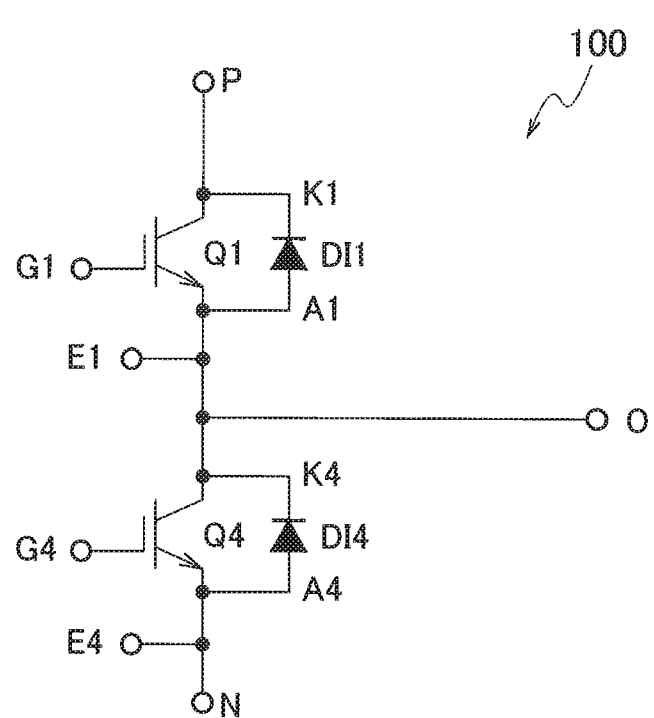
FIG. 29B is a schematic circuit representative diagram of an IGBT of a 2-in-1 module, which is the power module according to the embodiments.

As the power module according to the embodiments, FIG. 29A shows a schematic circuit representative of an SiC MOSFET of the 2-in-1 module 100, and FIG. 29B shows a schematic circuit representation of IGBT of the 2-in-1 module 100.

As the power module according to the embodiments, there will now be explained a 2-in-1 type module in which two semiconductor devices Q1 and Q4 sealed by one mold resin.

The 2-in-1 module 100 to which SiC MOSFETs are applied as the semiconductor devices Q1 and Q4 includes a half bridge configuration in which two power transistors Q1, Q4 (for example, SiC MOSFET) are built, as shown in FIG. 29A.

In this case, although the module can be considered as one large transistor, one chip or a plurality of chips may be contained therein. More specifically, although the modules include 1-in-1 module, 2-in-1 module, 4-in-1 module, 6-in-1 module, etc. For example, a module containing two pieces of transistors (chips) on one module is called the 2-in-1 module, a module containing two pieces of 2-in-1 modules on one module is called the 4-in-1 module, and a module containing three pieces of 2-in-1 modules on one module is called the 6-in-1 module.

As shown in FIG. 29A, the 2-in-1 module 100 includes two power transistors Q1, Q4, and diodes DI1 and DI4 connected in reversely parallel to the power transistors Q1, Q4, as one module. In FIG. 29A, reference numeral G1 denotes a lead terminal for gate signal of the MOSFET Q1, and reference numeral S1 denotes a lead terminal for source signal of the MOSFET Q1. Similarly, reference numeral G4 denotes a lead terminal for gate signal of the MOSFET Q4, and reference numeral S4 denotes a lead terminal for source signal of the MOSFET Q4. Reference numeral P denotes a positive side power terminal, reference numeral N denotes a negative side power terminal, and reference numeral O denotes an output terminal electrode.

Moreover, the 2-in-1 module 100 to which IGBTs are applied as the semiconductor devices Q1 and Q4 includes two IGBTs Q1 and Q4, and diodes DI1 and DI4 connected in reversely parallel to the IGBTs Q1 and Q4, as shown in FIG. 29B. In FIG. 29B, reference numeral G1 denotes a gate signal lead terminal of the IGBT Q1, and reference numeral μl denotes an emitter signal lead terminal of the IGBT Q1. Similarly, G4 denotes a gate signal lead terminal of the IGBT Q4, and E4 denotes an emitter signal lead terminal of the IGBT Q4.

The semiconductor devices Q2 and Q5 and semiconductor devices Q3 and Q6 applicable to the power module according to the embodiments can also be similarly realized.

(Device Structure)

Figure 30:
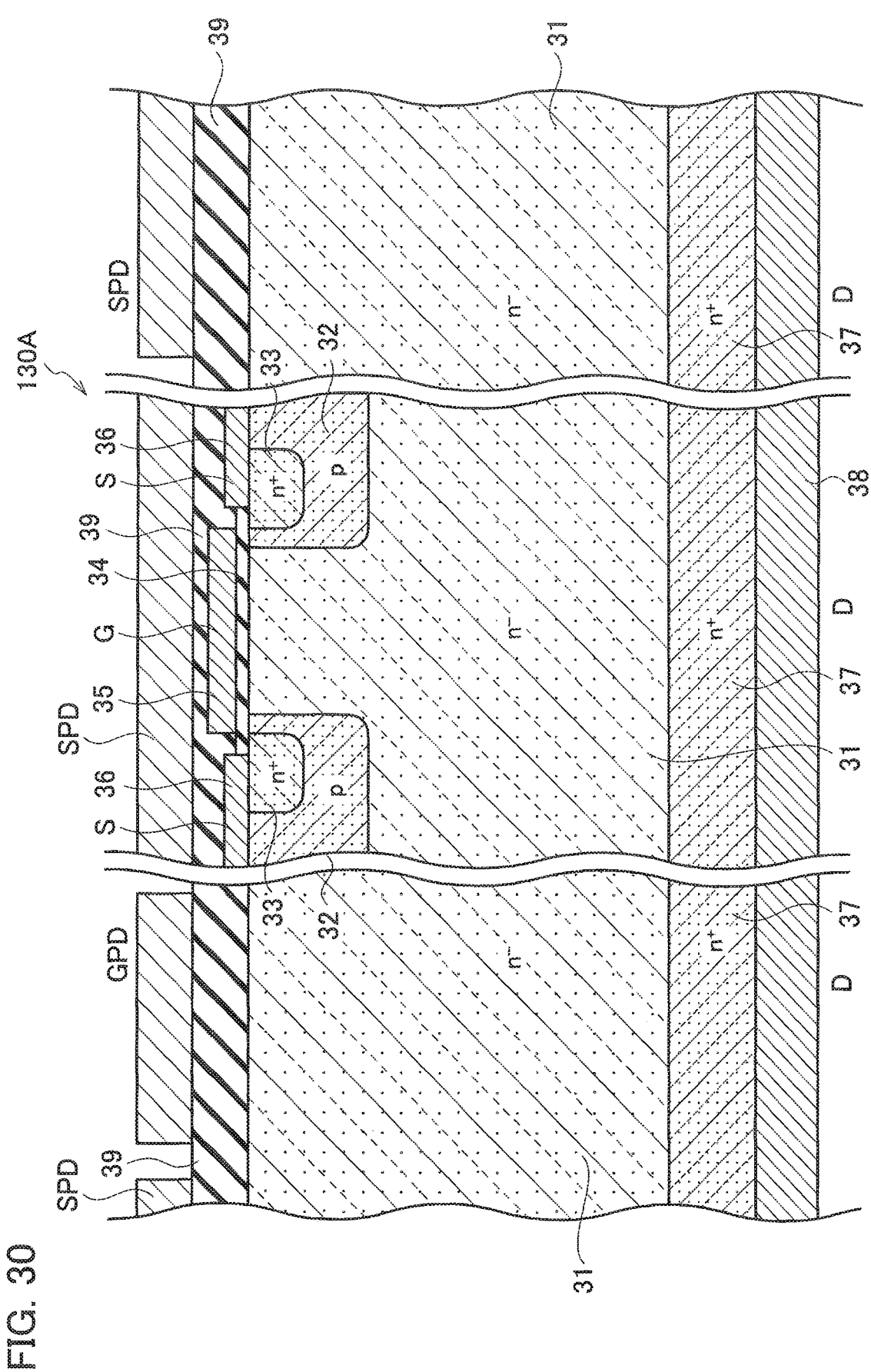
FIG. 30 is a schematic cross-sectional structure diagram showing an SiC MOSFET including a source pad electrode SPD and a gate pad electrode GPD, which is an example of the semiconductor device applicable to the power module according to the embodiments.

FIG. 30 shows a schematic cross-sectional structure of an SiC MOSFET 130A including a source pad electrode SPD and a gate pad electrode GPD, which is an example of the semiconductor devices Q1 and Q4 applicable to the power module according to the embodiments.

As shown in FIG. 30, the SiC MOSFET 130A includes: a semiconductor layer 31 composed by including an n⁻ type high resistivity layer; a p body region 32 formed on a front surface side of the semiconductor layer 31; a source region 33 formed on a front side surface of the p body region 32; a gate insulating film 34 disposed on a front side surface of the semiconductor layer 31 between the p body regions 32; a gate electrode 35 disposed on the gate insulating film 34; a source electrode 36 connected to the source region 33 and the p body region 32; an n⁺ drain region 37 disposed on a back side surface opposite to the surface of the semiconductor layer 31; and a drain electrode 38 connected to the n⁺ type drain area 37.

The gate pad electrode GPD is connected to the gate electrode 35 disposed on the gate insulating film 34, and the source pad electrode SPD is connected to the source electrode 36 connected to the source region 33 and the p body region 32. Moreover, as shown in FIG. 30, the gate pad electrode GPD and the source pad electrode SPD are disposed on an interlayer insulating film 39 for passivation which covers the surface of the SiC MOSFET 130A.

In addition, a microstructural transistor structure (not illustrated) may be formed in the semiconductor layer 31 below the gate pad electrode GPD and the source pad electrode SPD.

Furthermore, as shown in FIG. 30, the source pad electrode SPD may be disposed to be extended onto the interlayer insulating film 39 for passivation, also in the transistor structure of the center portion.

Although the SiC MOSFET 130A is composed by including a planar-gate-type n channel vertical SiC-MOSFET in FIG. 30, the SiC MOSFET 130A may be composed by including a trench-gate type n channel vertical SiC TMOSFET 130D, or the like, shown in FIG. 33 mentioned below.

Alternatively, a GaN-based FET etc. instead of the SiC MOSFET 130A can also be adopted to the semiconductor devices Q1 and Q4 which can be applied to the power module according to the embodiments.

The semiconductor devices Q2 and Q5 and semiconductor devices Q3 and Q6 applicable to the power module according to the embodiments can also be similarly realized.

Furthermore, a wide-bandgap type semiconductor of which the bandgap energy is from 1.1 eV to 8 eV, for example, can be used for the semiconductor devices Q1 to Q6 applicable to the PMs according to the eighth to fourteenth embodiments.

Figure 31:
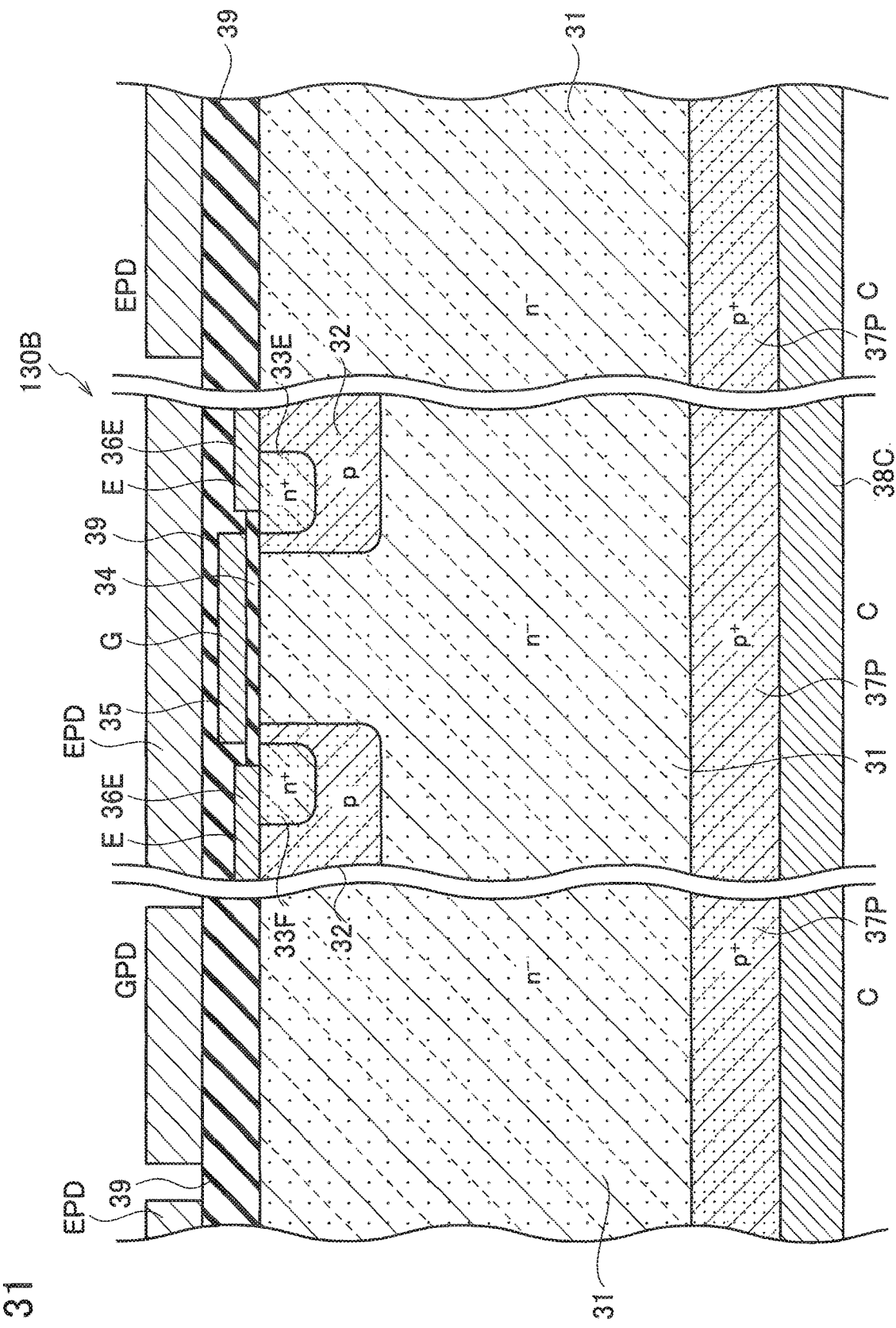
FIG. 31 is a schematic cross-sectional structure diagram of the IGBT including an emitter pad electrode EPD and a gate pad electrode GPD, which is an example of the semiconductor device applicable to the power module according to the embodiments.

Similarly, FIG. 31 shows a schematic cross-sectional structure of an IGBT 130B including an emitter pad electrode EPD and a gate pad electrode GPD, which is an example of the semiconductor devices Q1 and Q4 applicable to the power module according to the embodiments.

As shown in FIG. 31, the IGBT 130B includes: a semiconductor layer 31 composed by including an n⁻ type high resistivity layer; a p body region 32 formed on a front surface side of the semiconductor layer 31; an emitter region 33E formed on a front side surface of the p body region 32; a gate insulating film 34 disposed on a front side surface of the semiconductor layer 31 between the p body regions 32; a gate electrode 35 disposed on the gate insulating film 34; an emitter electrode 36E connected to the emitter region 33E and the p body region 32; a p⁺ collector region 37P disposed on a back side surface opposite to the surface of the semiconductor layer 31; and a collector electrode 38C connected to the p collector region 37P.

The gate pad electrode GPD is connected to the gate electrode 35 disposed on the gate insulating film 34, and the emitter pad electrode EPD is connected to the emitter electrode 36E connected to the emitter region 33E and the p body region 32. Moreover, as shown in FIG. 31, the gate pad electrode GPD and the emitter pad electrode EPD are disposed on an interlayer insulating film 39 for passivation which covers the surface of IGBT 130B.

In addition, a microstructural IGBT structure (not illustrated) may be formed in the semiconductor layer 31 below the gate pad electrode GPD and the emitter pad electrode EPD.

Furthermore, as shown in FIG. 31, the emitter pad electrode EPD may be disposed to be extended onto the interlayer insulating film 39 for passivation, also in the IGBT structure of the center portion.

In FIG. 31, although the IGBT 130B is composed by including a planar-gate-type n channel vertical IGBT, the IGBT 130B may be composed by including a trench-gate-type n channel vertical IGBT, etc.

The semiconductor devices Q2 and Q5 and semiconductor devices Q3 and Q6 applicable to the power module according to the embodiments can also be similarly realized.

GaN-based power devices, e.g. SiC-based power devices, e.g. SiC DIMOSFET or SiC TMOSFET, or a GaN-based high electron mobility transistor (HEMT), can be applied as the semiconductor devices Q1 to Q6. In some instances, power devices, e.g. Si based MOSFETs or SiC based IGBT, are also applicable thereto.

—SiC DIMOSFET—

Figure 32:
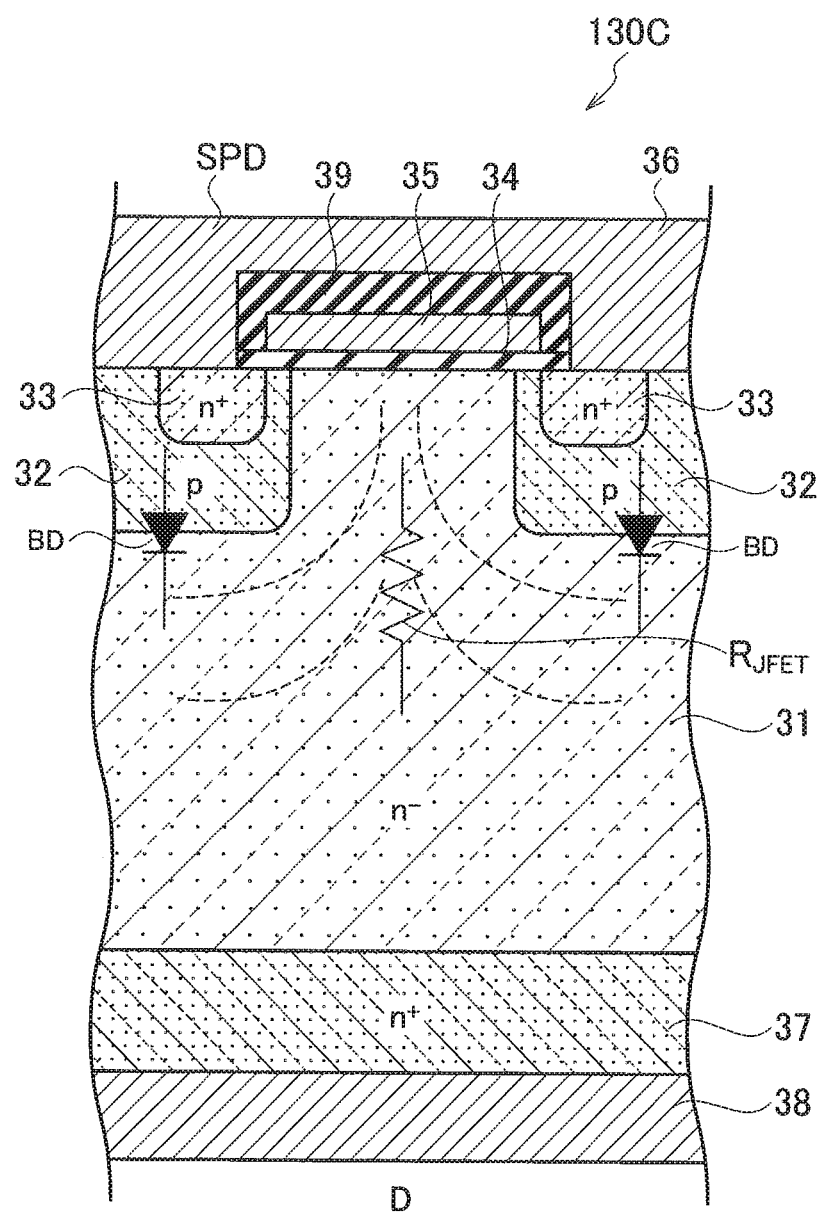
FIG. 32 is a schematic cross-sectional structure diagram of an SiC Double Implanted MOSFET (SiC DIMOSFET), which is an example of a semiconductor device which can be applied to the power module according to the embodiments.

FIG. 32 shows a schematic cross-sectional structure of an SiC DIMOSFET 130C, which is an example of a semiconductor device 110 which can be applied to the power module according to the embodiments.

As shown in FIG. 32, the SiC DIMOSFET 130C includes: a semiconductor layer 31 composed by including an n⁻ type high resistivity layer; a p body region 32 formed on a front surface side of the semiconductor layer 31; an n⁺ source region 33 formed on a front side surface of the p body region 32; a gate insulating film 34 disposed on a front side surface of the semiconductor layer 31 between the p body regions 32; a gate electrode 35 disposed on the gate insulating film 34; a source electrode 36 connected to the source region 33 and the p body region 32; an n⁺ drain region 37 disposed on a back side surface opposite to the surface of the semiconductor layer 31; and a drain electrode 38 connected to the n⁺ type drain area 37.

In the SiC DIMOSFET 130C shown in FIG. 32, the p body region 32 and the n⁺ source region 33 formed on the front side surface of the p body region 32 are formed with double ion implantation (DII), and the source pad electrode SPD is connected to the source region 33 and the source electrode 36 connected to the p body region 32.

Moreover, a gate pad electrode GPD (not illustrated) is connected to the gate electrode 35 disposed on the gate insulating film 34. Moreover, as shown in FIG. 32, the gate pad electrode GPD and the source pad electrode SPD are disposed on an interlayer insulating film 39 for passivation which covers the surface of the SiC DIMOSFET 130C.

As shown in FIG. 32, in the SiC DIMOSFET 130C, since a depletion layer as shown with the dashed lines is formed in the semiconductor layer 31 composed of a n⁻ type high resistivity layer inserted into the p body regions 32, channel resistance $R_{JFET}$ accompanying the junction type FET (JFET) effect is formed. Moreover, as shown in FIG. 32, body diodes BD are respectively formed between the p body regions 32 and the semiconductor layers 31.

—SiC TMOSFET—

Figure 33:
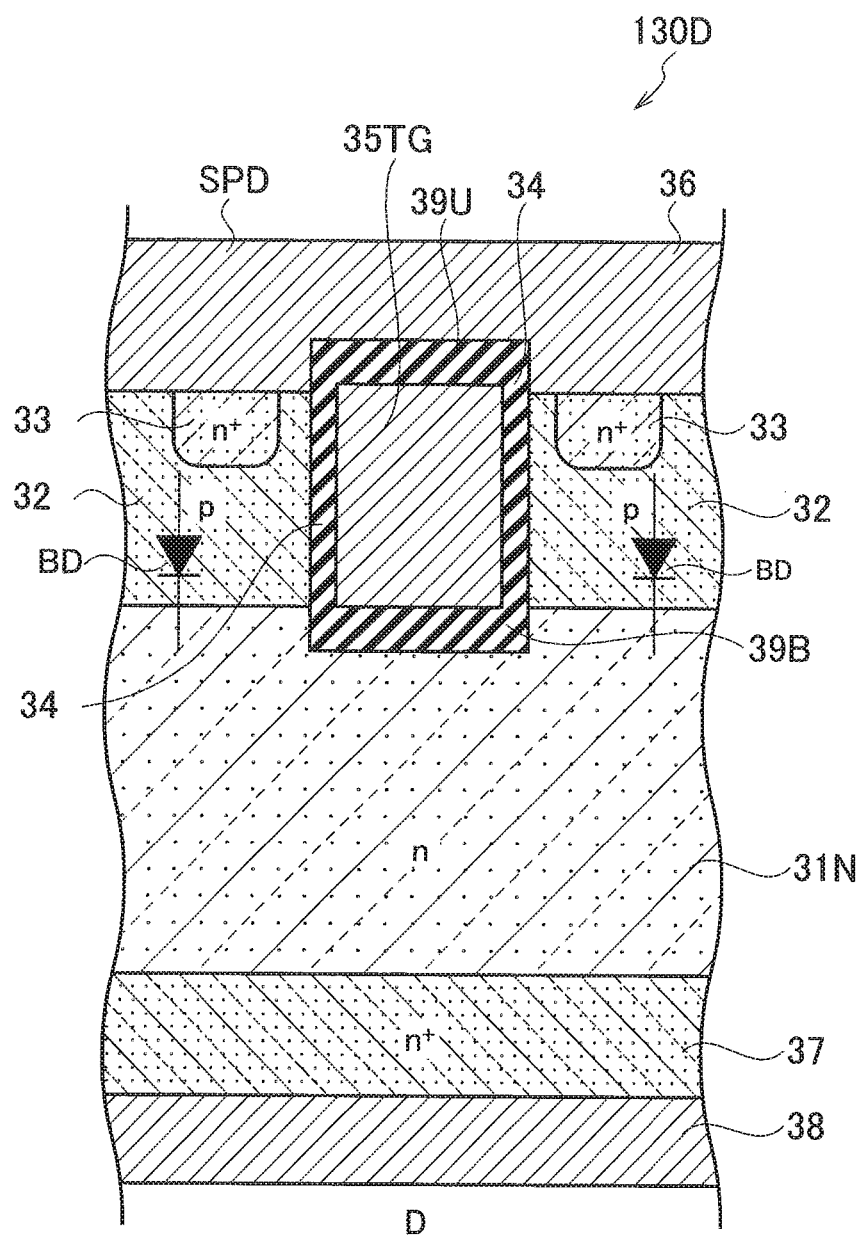
FIG. 33 is a schematic cross-sectional structure diagram of an SiC Trench MOSFET (SiC TMOSFET), which is an example of the semiconductor device applicable to the power module according to the embodiments.

FIG. 33 shows a schematic cross-sectional structure of an SiC TMOSFET 130D, which is an example of a semiconductor device which can be applied to the power module according to the embodiments.

As shown in FIG. 33, the SiC TMOSFET 130D includes: a semiconductor layer 31N composed by including an n layer; a p body region 32 formed on a front surface side of the semiconductor layer 31N; an n⁺ source region 33 formed on a front side surface of the p body region 32; a trench gate electrode 35TG passing through the p body region 32, the trench gate electrode 35TG formed in the trench formed up to the semiconductor layer 31N via the gate insulating film 34 and the interlayer insulating films 39U and 39B; a source electrode 36 connected to the source region 33 and the p body region 32; an n⁺ type drain region 37 disposed on a back side surface opposite to the surface of the semiconductor layer 31N; and a drain electrode 38 connected to the n⁺ type drain area 37.

In FIG. 33, in the SiC TMOSFET 130D, a trench gate electrode 35TG passing through the p body region 32 is formed in the trench formed up to the semiconductor layer 31N via the gate insulating film 34 and the interlayer insulating films 39U and 39B; and the source pad electrode SPD is connected to the source region 33 and the source electrode 36 connected to the p body region 32.

Moreover, a gate pad electrode GPD (not illustrated) is connected to the trench gate electrode 35TG disposed on the gate insulating film 34. Moreover, as shown in FIG. 33, the gate pad electrode GPD and the source pad electrode SPD are disposed on an interlayer insulating film 39U for passivation which covers the surface of the SiC TMOSFET 130D.

In the SiC TMOSFET 130D, channel resistance $R_{JFET}$ accompanying the JFET effect as the SiC DIMOSFET 130C is not formed. Moreover, body diodes BD are respectively formed between the p body regions 32 and the semiconductor layers 31N, in the same manner as FIG. 32.

(Example of Application)

Figure 34A:
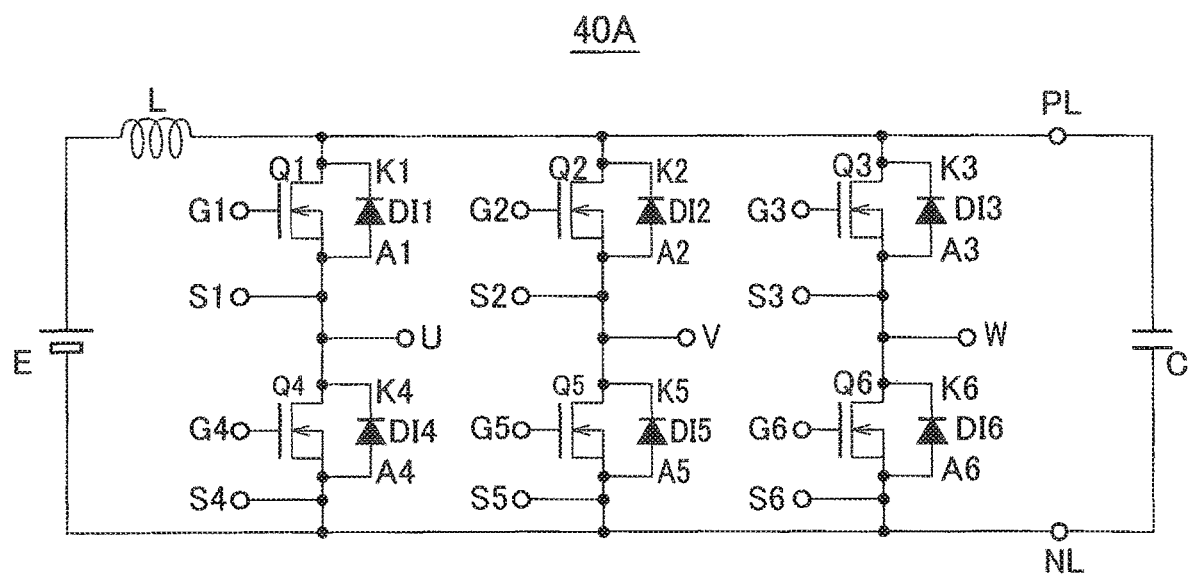
FIG. 34A shows an example of a circuit configuration in which the SiC MOSFET is applied as a semiconductor device, and a snubber capacitor is connected between a power terminal PL and an earth terminal (ground terminal) NL, in a circuit configuration of a three-phase alternating current (AC) inverter composed using the power module according to the embodiments.
Figure 34B:
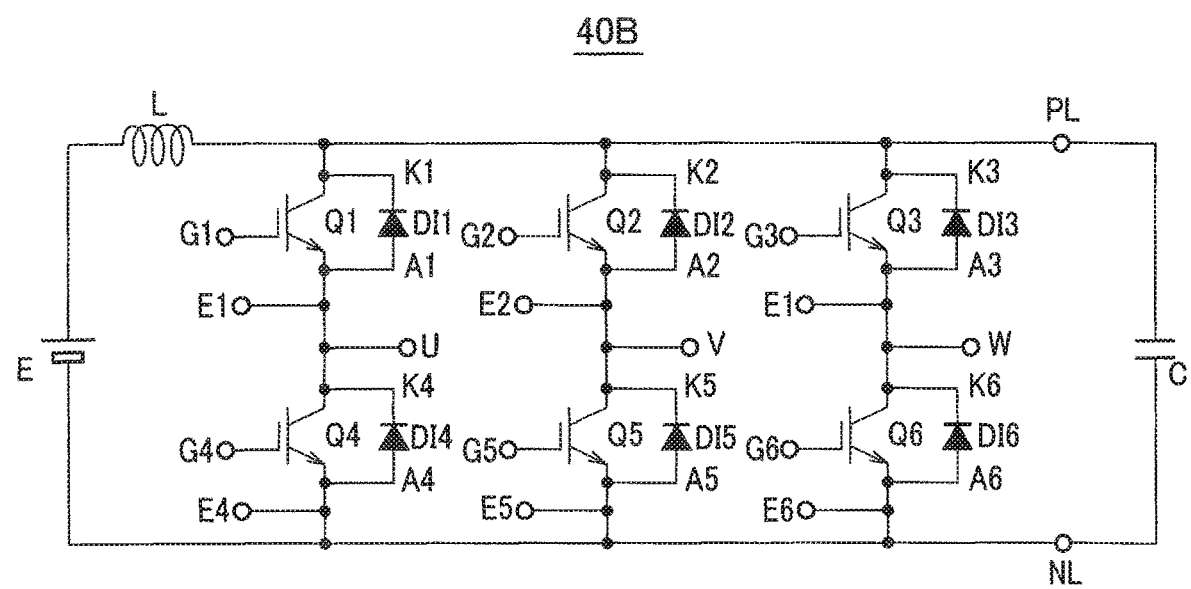
FIG. 34B shows an example of a circuit configuration in which the IGBT is applied as a semiconductor device, and the snubber capacitor is connected between the power terminal PL and the earth terminal (ground terminal) NL, in the circuit configuration of a three-phase AC inverter composed using the power module according to the embodiments.

FIG. 34A shows an example of a circuit configuration in which the SiC MOSFET is applied as a semiconductor device, and a snubber capacitor C is connected between the power terminal PL and the earth terminal (ground terminal) NL, in a circuit configuration of a three-phase AC inverter 40A composed using the power module according to the embodiments. Similarly, FIG. 34B shows a circuit configuration example of a three-phase AC inverter 40B composed by applying an IGBT as a semiconductor device and connecting a snubber capacitor C between the power terminal PL and the ground terminal NL.

When connecting the power module to the power source E to execute switching operations, large surge voltage Ldi/dt is produced by an inductance L included in a connection line due to a high switching speed of the SiC MOSFET and IGBT. For example, the surge voltage Ldi/dt is expressed as follows: di/dt=3×10⁹ (A/s), where a current change di=300 A, and a time variation accompanying switching dt=100 ns.

Although a value of the surge voltage Ldi/dt changes dependent on a value of the inductance L, the surge voltage Ldi/dt is superimposed on the power source E. Such a surge voltage Ldi/dt can be absorbed by the snubber capacitor C connected between the power terminal PL and the earth terminal (ground terminal) NL.

(Concrete Example)

Next, with reference to FIG. 35, there will now be explained a three-phase AC inverter 42A to which an SiC MOSFET is applied as a semiconductor device.

Figure 35:
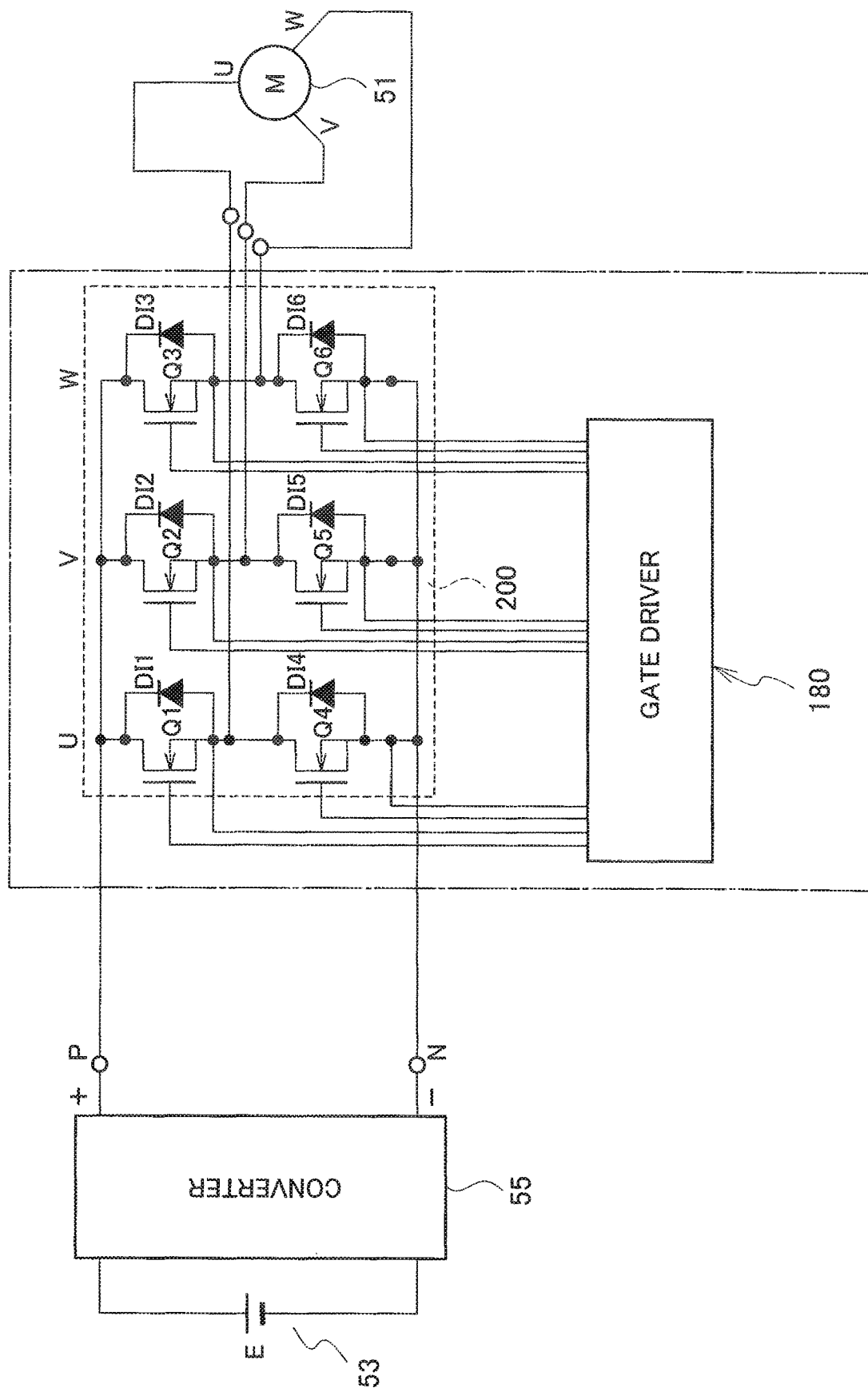
FIG. 35 shows an example of a circuit configuration in which the SiC MOSFET is applied as the semiconductor device, in a circuit configuration of a three-phase AC inverter composed using the power module according to the embodiments.

As shown in FIG. 35, the three-phase AC inverter 42A includes: a power module unit 200 connected to a gate driver (GD) 180; a three-phase AC motor unit 51; a power supply or storage battery (E) 53; and a converter 55. U-phase, V-phase, and W-phase inverters are respectively connected to the three-phase AC motor unit 51 so as to correspond to U phase, V phase, and W phase of the three-phase AC motor unit 51, in the power module unit 200.

In this case, the GD 180 is connected to SiC MOSFETs 01 and Q4, SiC MOSFETs Q2 and Q5, and SiC MOSFETs Q3 and Q6.

The power module unit 200 includes the SiC MOSFETs (Q1 and Q4), (Q2 and Q5), and (Q3 and Q6) having inverter configurations connected between a positive terminal (+) P and a negative terminal (−) N of the converter 55 to which the power supply or storage battery (E) 53 is connected.

Moreover, flywheel diodes DI1 to DI6 are respectively connected reversely in parallel between the source and the drain of the SiC MOSFETs Q1 to Q6.

Next, there will now be explained the three-phase AC inverter 42B composed using the power module according to the embodiment to which the IGBT is applied as the semiconductor device, with reference to FIG. 36.

Figure 36:
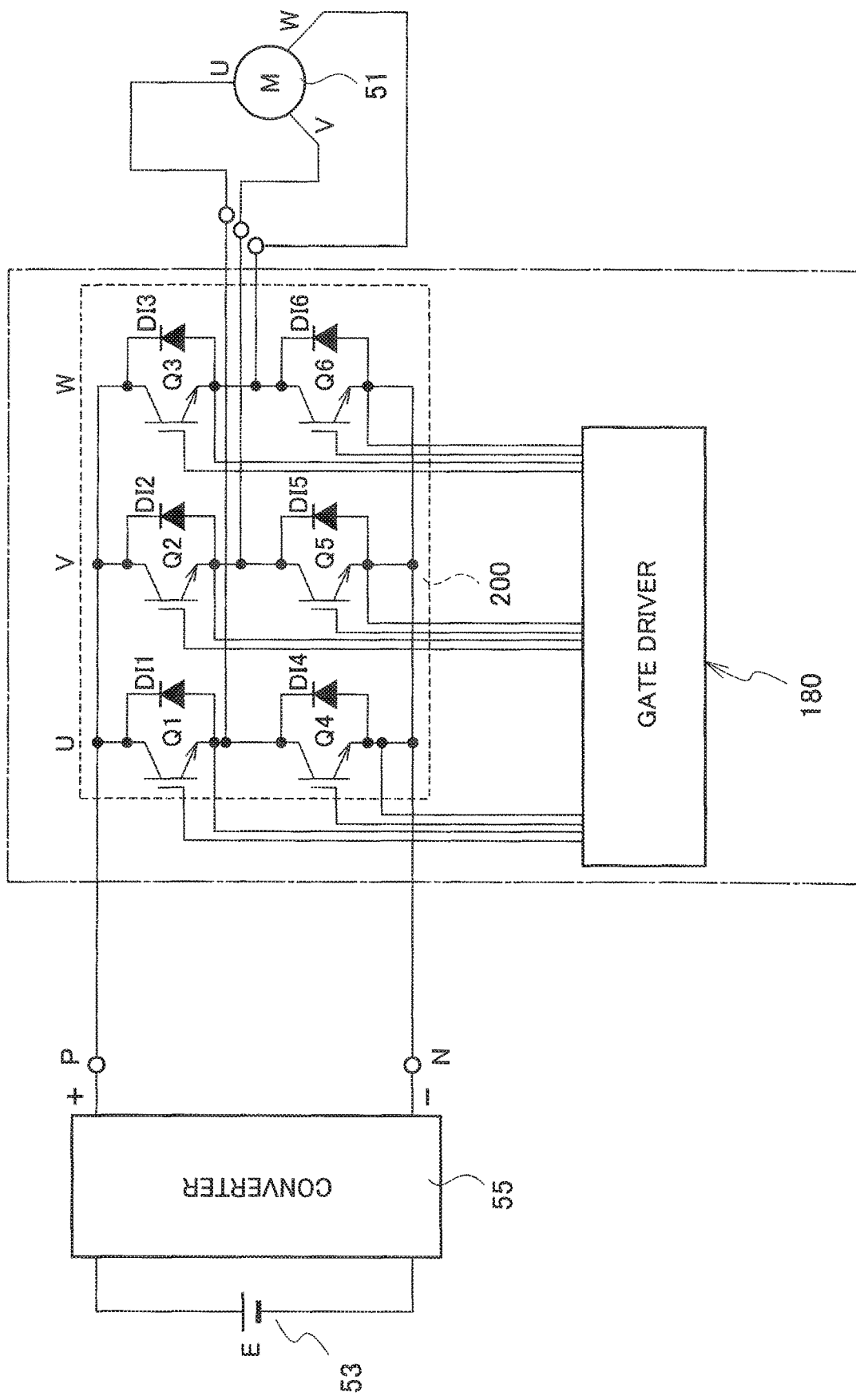
FIG. 36 shows an example of a circuit configuration in which the IGBT is applied as the semiconductor device, in a circuit configuration of a three-phase AC inverter composed using the power module according to the embodiments.

As shown in FIG. 36, the three-phase AC inverter 42B includes: a power module unit 200; a gate driver (GD) 180; a three-phase AC motor unit 51; a power supply or storage battery (E) 53; and a converter 55. U-phase, V-phase, and W-phase inverters are respectively connected to the three-phase AC motor unit 51 so as to correspond to U phase, V phase, and W phase of the three-phase AC motor unit 51, in the power module unit 200.

In this case, the GD 180 is connected to the IGBTs Q1, Q4, IGBTs Q2, Q5, and the IGBTs Q3, Q6.

The power module unit 200 includes the IGBTs (Q1 and Q4), (Q2 and Q5), and (Q3 and Q6) having inverter configurations connected between a positive terminal (+) P and a negative terminal (−) N of the converter 55 to which a storage battery (E) 53 is connected. Moreover, flywheel diodes DI1 to DI6 are respectively connected reversely in parallel between the emitter and the collector of the IGBTs Q1 to Q6.

[Other Embodiments]

As explained above, the first to eighth embodiments have been described, as a disclosure including associated description and drawings to be construed as illustrative, not restrictive. This disclosure makes clear a variety of alternative embodiments, working examples, and operational techniques for those skilled in the art. Moreover, the same effect can be obtained by taking same countermeasure also using a power module in which only patterns are prepared with metallic plates or metallic frames, without using the main substrate, and the disposition relationship holding and insulating holding between the patterns which are roles of the main substrate are realized with resin sealing, insulating sheets, etc.

Such being the case, the embodiments cover a variety of embodiments, whether described or not.

INDUSTRIAL APPLICABILITY

The power module according to the embodiments is available to whole of power devices, e.g. SiC power modules, intelligent power modules, and is applicable to in particular wide applicable fields, e.g., converters and inverters for HEV/EV, motors built-in wheel (PFC circuits and three phase inverter circuits for motor driving used for boosting from batteries), step-up (boost) converters used for power conditioners of solar battery systems, converters and inverters for industrial equipment, and the like.

What is claimed is:

1. A power module comprising:
    first transistors disposed on an insulating substrate, the first transistors forming at least one set of a half bridge having upper and lower arms, the first transistors respectively disposed at the upper and lower arms;
    second transistors disposed on the insulating substrate, the second transistors of which drains are respectively connected to gates sides of the first transistors and sources are respectively connected to sources sides of the first transistors;
    first source signal wiring patterns disposed on the insulating substrate, the first source signal wiring patterns respectively connected to the sources of the first transistors;
    first connected conductors for respectively connecting between the first source signal wiring patterns and the sources of the second transistors;
    second gate signal wiring patterns disposed on the insulating substrate, the second gate signal wiring patterns respectively connected to gates of the second transistors; and
    second connected conductor for respectively connecting between the second gate signal wiring patterns and the gates of the second transistors, wherein
    lengths of the first connected conductors are respectively equal to or less than lengths of the second connected conductors.

2. The power module according to claim 1, wherein the first connected conductor and the second connected conductor comprise a wire or a leadframe.

3. The power module according to claim 1, further comprising at least:
    second source signal wiring patterns disposed on the insulating substrate, the second source signal wiring patterns respectively connected to the sources of the second transistors;
    negative bias applying capacitors respectively disposed between the first source signal wiring patterns and the second source signal wiring patterns;
    first gate signal wiring patterns disposed on the insulating substrate, the first gate signal wiring patterns respectively connected to the gates of the first transistors;
    first signal terminals respectively connected to the first gate signal wiring patterns;
    second signal terminals respectively connected to the first source signal wiring patterns;
    third signal terminals respectively connected to the second gate signal wiring patterns; and
    fourth signal terminals respectively connected to the second source signal wiring patterns, wherein
    one ends of the first connected conductors are respectively connected to the first source signal wiring patterns through the capacitors.

4. The power module according to claim 3, further comprising: a positive-side power terminal and a negative-side power terminal; a first electrode pattern disposed on the insulating substrate, the first electrode pattern connected to the positive-side power terminal and connected to a drain of the first transistor; a second electrode pattern disposed on the insulating substrate, the second electrode pattern connected to the negative-side power terminal and connected to a source of a transistor connected in series to the first transistors; and a DC link capacitor disposed between the first electrode pattern and the second electrode pattern.

5. The power module according to claim 4, wherein direct distances from a connection unit of the DC link capacitor to the first transistors are respectively shorter than direct distances from the connection unit of the DC link capacitor to the second transistors.

6. The power module according to claim 3, wherein the first signal terminals are respectively adjacent to the second signal terminals, and the third signal terminals are respectively adjacent to the fourth signal terminals.

7. The power module according to claim 1, wherein the first transistors comprise any one of an SiC based MOSFET, a SiC based IGBT, a Si based MOSFET, a Si based IGBT, or a GaN based FET, or a plurality of the above-mentioned different devices.

8. The power module according to claim 1, wherein the first transistors and the second transistors respectively comprise configurations in a plurality of chips are connected in parallel to one another.

9. The power module according to claim 1, wherein the half bridge comprises
a plurality of switching circuits in which the first transistors are connected in series between a first power source and a second power source, and
a driver circuit configured to control an operation of each transistor in the switching circuit, wherein
the half bridge composes an inverter or converter in which a connecting point of the plurality of switching circuits is an output.

10. A power module comprising:
a first wiring pattern, a second wiring pattern, a third wiring pattern, and a fourth wiring pattern disposed on an insulating substrate;
a first transistor disposed on the first wiring pattern and configured to execute a switching operation;
a second transistor disposed on the third wiring pattern;
a first connected conductor for connecting between a first electrode of the first transistor and the second wiring pattern;
a second connected conductor for connecting between a first electrode of the second transistor and the second wiring pattern;
a third connection conductor for connecting between a second electrode of the second transistor and the fourth wiring pattern; and
a fourth connection conductor for connecting between a second electrode of the first transistor and the third wiring pattern, wherein
a length of the second connected conductor is equal to or less than a length of the third connected conductor.

11. The power module according to claim 10, wherein the first electrode comprises a source electrode or an emitter electrode, the second electrode comprises a gate electrode, and the third electrode comprises a drain electrode or a collector electrode.

* * * * *